United States Patent
Kaneko et al.

(10) Patent No.: US 12,529,969 B2
(45) Date of Patent: Jan. 20, 2026

(54) COLORING COMPOSITION, FILM, OPTICAL FILTER, SOLID-STATE IMAGING ELEMENT, IMAGE DISPLAY DEVICE, AND COMPOUND

(71) Applicant: FUJIFILM Corporation, Tokyo (JP)

(72) Inventors: Yushi Kaneko, Haibara-gun (JP); Takuya Tsuruta, Haibara-gun (JP); Yuichi Yasuhara, Haibara-gun (JP); Hirotaka Takishita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 462 days.

(21) Appl. No.: 18/069,364

(22) Filed: Dec. 21, 2022

(65) Prior Publication Data

US 2023/0126240 A1    Apr. 27, 2023

Related U.S. Application Data

(63) Continuation of application No. PCT/JP2021/018694, filed on May 18, 2021.

(30) Foreign Application Priority Data

Jul. 8, 2020  (JP) .................. 2020-117585

(51) Int. Cl.
| | | |
|---|---|---|
| G03F 7/00 | (2006.01) |
| C08K 5/56 | (2006.01) |
| C08L 33/10 | (2006.01) |
| C08L 67/02 | (2006.01) |
| G03F 7/004 | (2006.01) |
| H10F 39/15 | (2025.01) |
| H10F 39/18 | (2025.01) |

(52) U.S. Cl.
CPC ............ G03F 7/70958 (2013.01); C08K 5/56 (2013.01); C08L 33/10 (2013.01); C08L 67/025 (2013.01); G03F 7/0007 (2013.01); G03F 7/0048 (2013.01); *C08L 2203/20* (2013.01); *H10F 39/15* (2025.01); *H10F 39/18* (2025.01)

(58) Field of Classification Search
CPC ........ G03F 7/0007; G03F 7/038; G03F 7/039; G03F 7/033; C07F 1/08; C07F 3/06; G02B 1/04
See application file for complete search history.

(56) References Cited

U.S. PATENT DOCUMENTS

| | | |
|---|---|---|
| 2019/0369497 A1 | 12/2019 | Mori et al. |
| 2020/0301272 A1 | 9/2020 | Matsumura |
| 2021/0103215 A1 | 4/2021 | Mizuno et al. |

FOREIGN PATENT DOCUMENTS

| | | | |
|---|---|---|---|
| GB | 1602936 A | 11/1981 | |
| JP | 53-144930 A | 12/1978 | |
| JP | 63-202669 A | 8/1988 | |
| JP | 5-17766 A | 1/1993 | |
| JP | 2009-035671 A | 2/2009 | |
| JP | 2014041774 A | * 3/2014 | |
| JP | 2017-078105 A | 4/2017 | |
| KR | 20150113712 A | * 10/2015 | |
| KR | 20180058545 A | * 6/2018 | |
| TW | 201934671 A | 9/2019 | |
| TW | 202014473 A | 4/2020 | |
| WO | WO-2012133612 A1 | * 10/2012 | ........... C09B 41/006 |
| WO | 2018/155104 A1 | 8/2018 | |

OTHER PUBLICATIONS

Machine translation of JP 63-202669 (no date) (Year: 0000).*
Machine translation of JP 2020-055990 (no date) (Year: 0000).*
International Search Report dated Aug. 3, 2021 in Application No. PCT/JP2021/018694.
Written Opinion of the International Searching Authority dated Aug. 3, 2021 in Application No. PCT/JP2021/018694.
International Preliminary Report on Patentability dated Jan. 10, 2023 with a Translation of the Written Opinion of the International Searching Authority in Application No. PCT/JP2021/018694.
Communication dated Jun. 29, 2024 issued by the State Intellectual Property Office of the P.R.China in application No. 202180045956.1.
Communication issued Nov. 15, 2024 in Taiwanese Application No. 110118355.
Korean Office Action dated Mar. 7, 2024 in Application No. 10-2022-7045880.
Communication dated Jan. 23, 2024 issued by the Japanese Patent Office in application No. 2022-534927.
Chinese Office Action dated Sep. 20, 2023 in Application No. 202180045956.1.

* cited by examiner

*Primary Examiner* — Amanda C. Walke
(74) *Attorney, Agent, or Firm* — Sughrue Mion, PLLC

(57) ABSTRACT

A coloring composition includes at least one compound S selected from a compound S-1 represented by Formula (1) or a compound S-2 in which the compound S-1 is coordinated to a metal atom, a pigment, a resin P, and a solvent, in which the resin P includes at least one selected from a graft resin P-1 having a specific graft chain, a block copolymer P-2 including a specific structure, or a resin P-3 in which at least one terminal of a polymer chain including a specific structure is capped with an acid group.

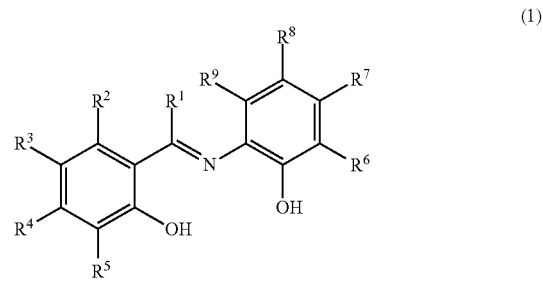

(1)

21 Claims, No Drawings

COLORING COMPOSITION, FILM, OPTICAL FILTER, SOLID-STATE IMAGING ELEMENT, IMAGE DISPLAY DEVICE, AND COMPOUND

CROSS-REFERENCE TO RELATED APPLICATIONS

This application is a Continuation of PCT International Application No. PCT/JP2021/018694 filed on May 18, 2021, which claims priority under 35 U.S.C § 119(a) to Japanese Patent Application No. 2020-117585 filed on Jul. 8, 2020. Each of the above application(s) is hereby expressly incorporated by reference, in its entirety, into the present application.

BACKGROUND OF THE INVENTION

1. Field of the Invention

The present invention relates to a coloring composition including a pigment. The present invention further relates to a film formed of the coloring composition, an optical filter, a solid-state imaging element, an image display device, and a compound.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element. The color filter normally includes pixels of three primary colors of red, green, and blue, and acts to separate transmitted light into the three primary colors.

Colored pixels of each color of the color filter are manufactured by using a coloring composition containing a colorant. JP2009-035671A discloses that a pixel of a color filter is formed using a coloring composition which contains a pigment including an azomethine metal complex-based pigment, a pigment derivative in which two sulfonic acid groups are introduced into an azomethine metal complex-based pigment, a resin, and a solvent.

SUMMARY OF THE INVENTION

In recent years, a pixel size of an optical filter used in the solid-state imaging element has been miniaturized. However, according to studies conducted by the present inventors, it has been found that, as the pixel size is miniaturized, the pixel is more susceptible to damage by a developer, thereby causing defects.

In addition, in a case where the present inventor has studied on the coloring composition disclosed in Examples of JP2009-035671A, it has been found that there is room for further improvement in developer resistance.

Therefore, an object of the present invention is to provide a coloring composition with which a pixel having excellent developer resistance is formed. Another object of the present invention is to provide a film formed of the coloring composition, an optical filter, a solid-state imaging element, an image display device, and a compound.

According to the studies conducted by the present inventors, it has been found that the above-described objects can be achieved by a coloring composition described below, thereby leading to the completion of the present invention. Therefore, the present invention provides the following.

<1> A coloring composition comprising:
at least one compound S selected from a compound S-1 represented by Formula (1) or a compound S-2 in which the compound S-1 is coordinated to a metal atom;
a pigment;
a resin P; and
a solvent,
in which the resin P includes at least one selected from the group consisting of a graft resin P-1 which has a graft chain including at least one structure selected from a polyester structure, a polyether structure, or a poly(meth)acrylic structure, a block copolymer P-2 including at least one structure selected from a polyester structure, a polyether structure, or a poly(meth)acrylic structure, and a resin P-3 in which at least one terminal of a polymer chain including at least one structure selected from a polyester structure, a polyether structure, or a poly(meth)acrylic structure is capped with an acid group,

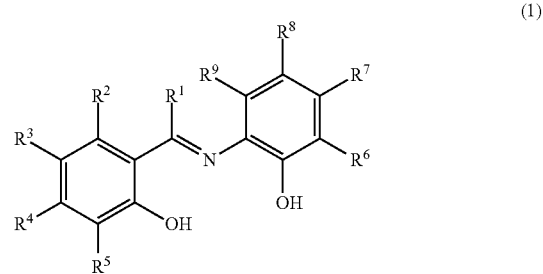

(1)

in Formula (1), $R^1$ represents a hydrogen atom, an alkyl group, or an aryl group, $R^2$ to $R^9$ each independently represent a hydrogen atom or a substituent, and two adjacent groups among $R^2$ to $R^9$ may be bonded to each other to form a ring, in which any one of $R^2$ to $R^9$ includes a group represented by Formula (R-1), $$-W^1-(X^1)_n \quad (\text{R-1})$$

in Formula (R-1), $W^1$ represents a single bond or an (n+1)-valent linking group, $X^1$ represents an acid group or a basic group, and n represents an integer of 1 to 5, in which in a case where $W^1$ is a single bond, n is 1.

<2> The coloring composition according to <1>,
in which the acid group represented by $X^1$ of Formula (R-1) is a carboxy group, a sulfo group, a phosphoric acid group, a group represented by $-SO_2NHSO_2Rf^1$, or a salt of these groups, in which $Rf^1$ represents a group including a fluorine atom, and
the basic group represented by $X^1$ of Formula (R-1) is an amino group or a salt of an ammonium group.

<3> The coloring composition according to <1> or <2>,
in which, in Formula (R-1), in a case where $X^1$ is a basic group, $W^1$ is an (n+1)-valent linking group.

<4> The coloring composition according to <1> or <2>,
in which, in Formula (R-1), in a case where $W^1$ is a single bond, $X^1$ is an acid group and n is 1.

<5> The coloring composition according to any one of <1> to <4>,
in which $R^3$, $R^7$, or $R^8$ of Formula (1) includes the group represented by Formula (R-1).

<6> The coloring composition according to any one of <1> to <5>,
  in which the compound S-2 is a compound represented by Formula (1a),

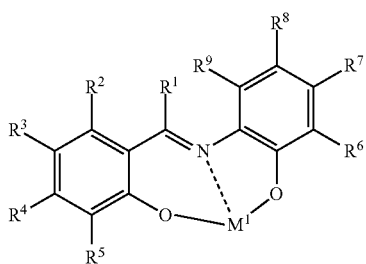

in Formula (1a), $R^1$ represents a hydrogen atom, an alkyl group, or an aryl group, $R^2$ to $R^9$ each independently represent a hydrogen atom or a substituent, two adjacent groups among $R^2$ to $R^9$ may be bonded to each other to form a ring, and $M^1$ represents a metal atom which may be coordinated with a ligand, in which any one of $R^2$ to $R^o$ includes the group represented by Formula (R-1).

<7> The coloring composition according to <6>,
  in which $M^1$ in Formula (1a) is a copper atom which may be coordinated with a ligand or a zinc atom which may be coordinated with a ligand.

<8> The coloring composition according to any one of <1> to <7>,
  in which the pigment includes at least one selected from a yellow pigment, a green pigment, or a red pigment.

<9> The coloring composition according to any one of <1> to <8>,
  in which the pigment includes a pigment having a metal atom.

<10> The coloring composition according to <9>,
  in which the pigment having a metal atom includes an azomethine metal complex.

<11> The coloring composition according to <10>,
  in which the azomethine metal complex includes at least one selected from an azomethine copper complex or an azomethine zinc complex.

<12> The coloring composition according to any one of <1> to <11>,
  in which the coloring composition includes the compound S in an amount of 1 to 30 parts by mass with respect to 100 parts by mass of the pigment.

<13> The coloring composition according to any one of <1> to <12>, further comprising:
  a polymerizable compound; and
  a photopolymerization initiator.

<14> The coloring composition according to any one of <1> to <13>,
  in which the coloring composition is used for a color filter or an infrared transmitting filter.

<15> The coloring composition according to any one of <1> to <14>,
  in which the coloring composition is used for a solid-state imaging element.

<16> A film obtained from the coloring composition according to any one of <1> to <15>.

<17> An optical filter comprising:
  the film according to <16>.

<18> A solid-state imaging element comprising:
  the film according to <16>.

<19> An image display device comprising:
  the film according to <16>.

<20> A compound represented by Formula (1-1), Formula (1a-1), Formula (11-1), or Formula (11a-1),

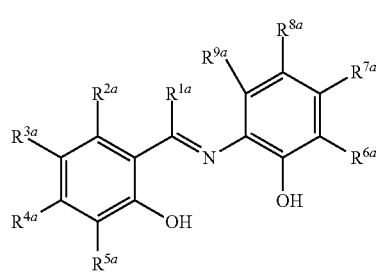

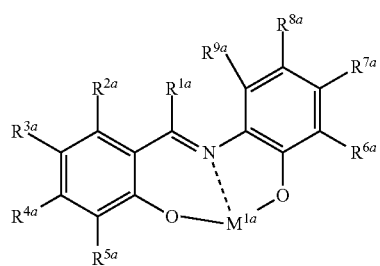

in Formula (1-1) and Formula (1a-1), $R^{1a}$ represents a hydrogen atom, an alkyl group, or an aryl group, $R^{2a}$ to $R^{9a}$ each independently represent a hydrogen atom, a salt of a carboxy group, a salt of a sulfo group, a salt of a phosphoric acid group, a group represented by $-SO_2NHSO_2Rf^1$, a salt of a group represented by $-SO^2NHSO_2Rf^1$, a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group, $Rf^1$ represents a group including a fluorine atom, and $M^{1a}$ represents a metal atom which may be coordinated with a ligand, in which any one of $R^{2a}$ to $R^{9a}$ is a salt of a sulfo group, a group represented by $-SO_2NHSO_2Rf^1$, or a salt of a group represented by $-SO_2NHSO_2Rf^1$,

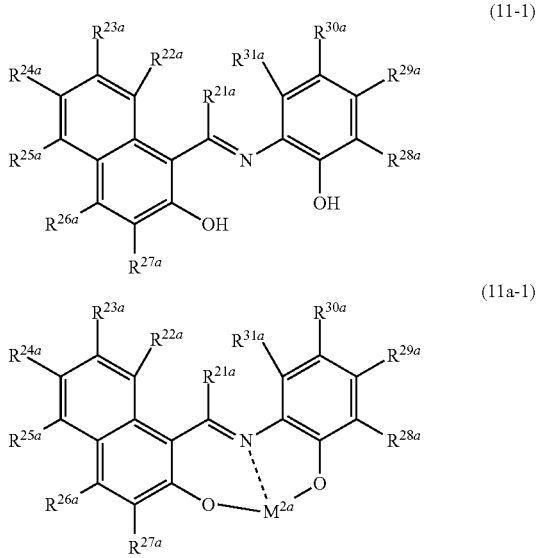

in Formula (11-1) and Formula (11a-1), $R^{21a}$ represents a hydrogen atom, an alkyl group, or an aryl group, $R^{22a}$ to $R^{31a}$ each independently represent a hydrogen atom, a salt of a carboxy group, a salt of a sulfo group, a salt of a phosphoric acid group, a group represented by —$SO_2NHSO_2Rf^1$, a salt of a group represented by —$SO_2NHSO_2Rf^1$, a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group, $Rf^1$ represents a group including a fluorine atom, and $M^{2a}$ represents a metal atom which may be coordinated with a ligand, in which any one of $R^{22a}$ to $R^{31a}$ is a salt of a sulfo group, a group represented by —$SO_2NHSO_2Rf^1$, or a salt of a group represented by —$SO_2NHSO_2Rf^1$.

According to the present invention, it is possible to provide a coloring composition with which a pixel having excellent developer resistance is formed, a film formed of the coloring composition, an optical filter, a solid-state imaging element, an image display device, and a compound.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV light), an X-ray, or an electron beam.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, in structural formulae, Me represents a methyl group, Et represents an ethyl group, Bu represents a butyl group, and Ph represents a phenyl group.

In the present specification, a weight-average molecular weight and a number-average molecular weight are values in terms of polystyrene through measurement by a gel permeation chromatography (GPC) method.

In the present specification, a total solid content denotes the total mass of all the components of the composition excluding a solvent.

In the present specification, a pigment means a compound which is hardly dissolved in a solvent.

In the present specification, the term "step" denotes not only an individual step but also a step which is not clearly distinguishable from another step as long as an effect expected from the step can be achieved.

In the present specification, symbols (for example, S and the like) added before or after the name are terms used to distinguish the constitutional components, and the type of the constitutional components, the number of constitutional components, and the superiority or inferiority of the constitutional components are not limited.

<Coloring Composition>

A coloring composition according to an embodiment of the present invention includes at least one compound S selected from a compound S-1 represented by Formula (1) or a compound S-2 in which the compound S-1 is coordinated to a metal atom, a pigment, a resin P, and a solvent, in which the resin P includes at least one selected from a graft resin P-1 which has a graft chain including at least one structure selected from a polyester structure, a polyether structure, or a poly(meth)acrylic structure, a block copolymer P-2 including at least one structure selected from a polyester structure, a polyether structure, or a poly(meth)acrylic structure, or a resin P-3 in which at least one terminal of a polymer chain including at least one structure selected from a polyester structure, a polyether structure, or a poly(meth)acrylic structure is capped with an acid group.

Hereinafter, the graft resin P-1, the block copolymer P-2, and the resin P-3 are collectively referred to as a specific resin.

With the coloring composition according to the embodiment of the present invention, it is possible to form a pixel having excellent developer resistance, in which occurrence of pixel chipping and the like due to the developer is suppressed. For example, in a case of forming a pixel by patterning by photolithography using the coloring composition, it is possible to suppress the occurrence of pixel chipping and the like due to a developer during development. In addition, in a case of producing an optical filter having pixels of a plurality of colors by sequentially forming the pixels of each color using coloring compositions of the plurality of colors, a pixel formed in the previous step is also exposed to a developer in a case of forming pixels of second and subsequent colors. However, since a pixel having excellent developer resistance can be formed by using the coloring composition according to the embodiment of the present invention, during the formation of pixels of the second and subsequent colors, it is possible to suppress damage caused by the developer to the pixel formed in the previous step, and to suppress the occurrence of chipping and the like.

With the coloring composition according to the embodiment of the present invention, even in a case where a fine line width pixel having a line width of 1.0 μm or less (preferably 0.9 μm or less) is formed, since the pixel having excellent developer resistance can be formed, it is effective in forming fine line width pixels having a line width of 1.0 μm or less (preferably 0.9 μm or less).

In addition, the coloring composition according to the embodiment of the present invention also has a wide exposure latitude. Therefore, in a case of forming a pattern by a photolithography method using the coloring composition according to the embodiment of the present invention, since an allowable range of an exposure amount is wide in a case of forming pixels with a desired line width, photolithography properties are excellent.

The detailed reason for obtaining such an effect is not sure, but is presumed as follows. The compound S-1 has an aromatic ring and an azomethine structure, and it is presumed that the compound S can form a strong intermolecular bond with the pigment. In addition, since one of $R^2$ to $R^9$ in Formula (1) representing the compound S-1 has a group represented by Formula (R-1), it is presumed that the compound S can form a strong intermolecular bond with the specific resin. As a result, it is presumed that a strong network of the pigment, the compound S, and the above-described specific resin is formed in a film. Therefore, it is presumed that a film which is less likely to be hydrolyzed by the developer can be obtained. In addition, since the specific resin has a specific structure, it is presumed that a dispersion state of the pigment in the film can be improved and a phase structure of the film can be homogeneous. Therefore, it is presumed that a permeation path of the developer in the film is homogeneous, and as a result, it is possible to suppress occurrence of defects and the like due to a local permeation of the developer into the film. For this reason, it is presumed that a pixel having excellent developer resistance can be formed by using the coloring composition according to the embodiment of the present invention.

In addition, it is presumed that the exposure latitude can be increased because the phase structure of the film can be homogeneous.

In particular, the compound S easily interacts with a pigment having a metal atom, and in a case where the pigment having a metal atom is used, a pixel having more excellent developer resistance can be formed. In particular, in a case where an azomethine metal complex or a phthalocyanine metal complex is used as the pigment, more excellent effects are exhibited.

The coloring composition according to the embodiment of the present invention is preferably used as a coloring composition for a color filter or an infrared transmitting filter. More specifically, the coloring composition according to the embodiment of the present invention can be preferably used as a coloring composition for forming a pixel of a color filter or a coloring composition for forming an infrared transmitting filter, and more preferably used as a coloring composition for forming a pixel of a color filter.

In addition, the coloring composition according to the embodiment of the present invention is preferably used for a solid-state imaging element. More specifically, the coloring composition according to the embodiment of the present invention is preferably used as a coloring composition for forming a pixel of a color filter or a coloring composition for forming an infrared transmitting filter, which is used for a solid-state imaging element.

In a case where a film having a thickness of 0.65 μm is formed of the coloring composition according to the embodiment of the present invention, a wavelength at which a light transmittance of the film is 50% preferably exists in a wavelength range of 470 to 520 nm, more preferably exists in a wavelength range of 475 to 520 nm, and still more preferably exists in a wavelength range of 480 to 520 nm. Among these, the wavelength at which the light transmittance is 50% preferably exists in each wavelength range of 470 to 520 nm and wavelength range of 575 to 625 nm. In this aspect, a wavelength on a short wavelength side, at which the light transmittance is 50%, preferably exists in a wavelength range of 475 to 520 nm, and more preferably exists in a wavelength range of 480 to 520 nm. In addition, a wavelength on a long wavelength side, at which the light transmittance is 50%, preferably exists in a wavelength range of 580 to 620 nm, and more preferably exists in a wavelength range of 585 to 615 nm. A coloring composition with which a film having such spectral characteristics can be formed is preferably used as a coloring composition for forming a green pixel of a color filter.

Hereinafter, the respective components used in the coloring composition according to the embodiment of the present invention will be described.

<<Pigment>>

The coloring composition according to the embodiment of the present invention includes a pigment. An average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the coloring composition is good. In the present invention, the primary particle diameter of the pigment can be determined from an image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present invention is an arithmetic average of the primary particle diameters with respect to 400 primary particles of the pigment. In addition, the primary particle of the pigment refers to a particle which is independent without aggregation.

Examples of the pigment include a chromatic pigment and a black pigment, and a chromatic pigment is preferable. In addition, the pigment may be an inorganic pigment or an organic pigment, but from the viewpoint of many color variations, ease of dispersion, safety, and the like, an organic pigment is preferable.

From the reason that it is possible to form a pixel having more excellent developer resistance, the pigment is preferably a pigment having a metal atom, more preferably an organic pigment having a metal atom, still more preferably an azomethine metal complex, an azo metal complex, or a phthalocyanine metal complex, even more preferably an azomethine metal complex or a phthalocyanine metal complex, and particularly preferably an azomethine metal complex.

The azomethine metal complex is preferably a yellow pigment. In addition, the azomethine metal complex preferably includes at least one selected from an azomethine copper complex or an azomethine zinc complex, and more preferably includes an azomethine copper complex. In addition, a dinuclear complex may be used as the azomethine metal complex.

The azomethine metal complex may be used singly or in a combination of two or more kinds thereof. In addition, in a case where two or more kinds of the azomethine metal complexes are used in combination, the two or more kinds of the azomethine metal complexes may form a mixed crystal (solid solution).

Examples of the azomethine copper complex include C. I. Pigment Yellow 117 and 129. C. I. Pigment Yellow 117 is a compound represented by Formula (ACu-2), and C. I. Pigment Yellow 129 is a compound represented by Formula (ACu-1). In the following structural formulae, a nitrogen atom is coordinated to a copper (Cu) atom, but the nitrogen atom may not be coordinated to the copper atom. In addition, a dinuclear complex may be used as the azomethine copper complex. Examples of the dinuclear complex of the azomethine copper complex include a complex having a structure in which a square shape is formed of Cu—O and Cu—O.

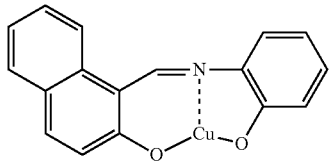

(ACu-1)

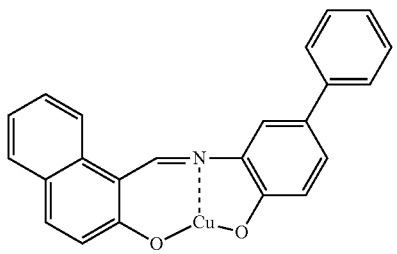

(ACu-2)

Examples of the azomethine zinc complex include a compound represented by Formula (AZN-1) and a compound represented by Formula (AZn-2). In the following structural formulae, a nitrogen atom is coordinated to a zinc (Zn) atom, but the nitrogen atom may not be coordinated to the zinc atom.

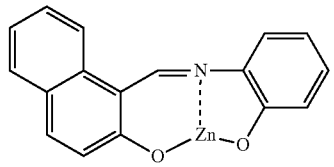

(AZn-1)

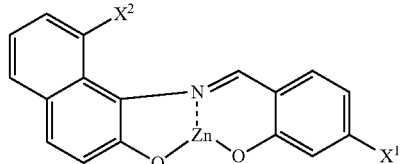

(AZn-2)

In Formula (AZn-2), $X^1$ and $X^2$ each independently represent a hydrogen atom, a halogen atom, or an alkoxy group.

Examples of the halogen atom represented by $X^1$ and $X^2$ include a fluorine atom, a chlorine atom, a bromine atom, and an iodine atom, and a chlorine atom or a bromine atom is preferable, and a chlorine atom is more preferable.

Examples of the alkoxy group represented by $X^1$ and $X^2$ include a methoxy group, an ethoxy group, a propyloxy group, an i-propyloxy group, a butyloxy group, an i-butyloxy group, an s-butyloxy group, a t-butyloxy group, a pentyloxy group, a 1-methylbutyloxy group, a 2-methylbutyloxy group, a 3-methylbutyloxy group, a 1,1-dimethylpropyloxy group, a 1,2-dimethylpropyloxy group, a 2,2-dimethylpropyloxy group, a 1-ethylpropyloxy group, a hexyloxy group, a 1-methylpentyloxy group, a 2-methylpentyloxy group, a 3-methylpentyloxy group, a 4-methylpentyloxy group, a 1,1-dimethylbutyloxy group, a 1,2-dimethylbutyloxy group, a 1,3-dimethylbutyloxy group, a 2,2-dimethylbutyloxy group, a 2,3-dimethylbutyloxy group, a 3,3-dimethylbutyloxy group, a 1-ethylbutyloxy group, a 2-ethylbutyloxy group, a 1,1,2-trimethylpropyloxy group, a 1,2,2-trimethylpropyloxy group, a 1-ethyl-1-methylpropyloxy group, and a 1-ethyl-2-methylpropyloxy group. Among these, an alkoxy group having 1 to 8 carbon atoms is a suitable example.

Specific examples of the compound represented by Formula (AZn-2) include compounds having the following structures. In the following structural formulae, a nitrogen atom is coordinated to a zinc (Zn) atom, but the nitrogen atom may not be coordinated to the zinc atom.

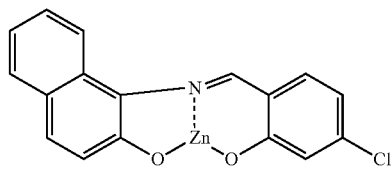

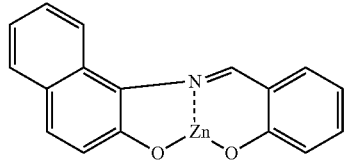

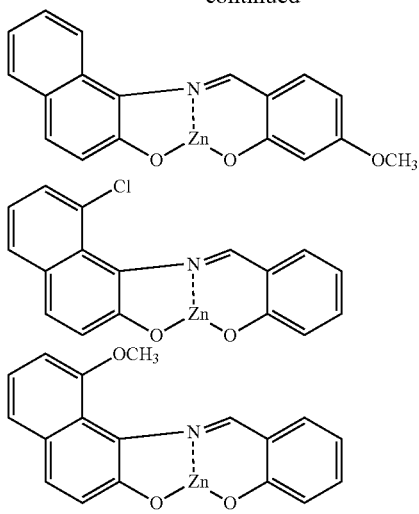

Examples of the azo metal complex include C. I. Pigment Yellow 150.

In addition, as the azo metal complex, an azobarbiturate nickel complex having the following structure can also be used.

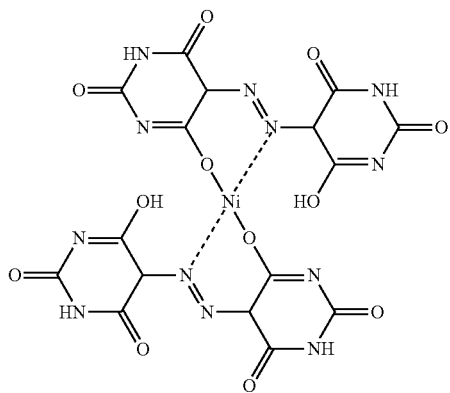

In addition, as the azo metal complex, an azo metal complex Az which includes at least one kind of an anion selected from an azo compound represented by Formula (Az1) or an azo compound having a tautomeric structure of the azo compound represented by Formula (Az1), two or more kinds of metal ions, and a melamine compound can be used.

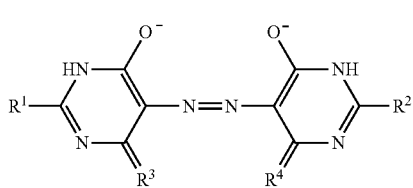

(Az1)

In the formula, $R^1$ and $R^2$ each independently represent —OH or —$NR^5R^6$, $R^3$ and $R^4$ each independently represent =O or =$NR^7$, and $R^5$ to $R^7$ each independently represent a hydrogen atom or an alkyl group. The alkyl group represented by $R^5$ to $R^7$ preferably has 1 to 10 carbon atoms, more preferably has 1 to 6 carbon atoms, and still more preferably has 1 to 4 carbon atoms. The alkyl group may be linear, branched, or cyclic, and is preferably linear or branched and more preferably linear. The alkyl group may have a substituent. The substituent is preferably a halogen atom, a hydroxy group, an alkoxy group, a cyano group, or an amino group.

In Formula (Az1), it is preferable that $R^1$ and $R^2$ are —OH. In addition, it is preferable that $R^3$ and $R^4$ are =O.

It is preferable that the azo metal complex Az is a pigment including the at least one kind of an anion selected from an azo compound represented by Formula (Az1) or an azo compound having a tautomeric structure of the azo compound represented by Formula (Az1), metal ions including at least $Zn^{2+}$ and $Cu^{2+}$, and a melamine compound. The details of the azo metal complex can be found in paragraph Nos. 0011 to 0062 and 0137 to 0276 of JP2017-171912A, paragraph Nos. 0010 to 0062 and 0138 to 0295 of JP2017-171913A, paragraph Nos. 0011 to 0062 and 0139 to 0190 of JP2017-171914A, and paragraph Nos. 0010 to 0065 and 0142 to 0222 of JP2017-171915A, the contents of which are incorporated herein by reference.

Examples of the phthalocyanine metal complex include a phthalocyanine metal complex (metal phthalocyanine pigment) having, as a central metal, copper, zinc, aluminum, iron, cobalt, vanadium, titanium, or magnesium. Specific examples of the phthalocyanine metal complex include green pigments such as Color Index (C. I.) Pigment Green 7, 36, 58, 59, 62, and 63, and blue pigments such as C. I. Pigment Blue 15, 15:1, 15:2, 15:3, 15:4, and 15:6.

Hereinafter, the chromatic pigment and the black pigment will be described in more detail.

(Chromatic Pigment)

Examples of the chromatic pigment include a pigment having a maximal absorption wavelength in a wavelength range of 400 to 700 nm. Examples thereof include a yellow pigment, an orange pigment, a red pigment, a green pigment, a violet pigment, and a blue pigment. The pigment used in the coloring composition according to the embodiment of the present invention preferably includes at least one selected from a yellow pigment, a green pigment, or a red pigment, and more preferably includes a yellow pigment.

Examples of the yellow pigment include an azomethine compound, an azo compound, an isoindoline compound, a pteridine compound, and a quinophthalone compound, and an azomethine compound or an azo compound is preferable, an azomethine metal complex or an azo metal complex is more preferable. From the reason that it is possible to form a pixel having more excellent developer resistance, an azomethine metal complex is preferable. Examples of the azomethine metal complex and the azo metal complex include those described above.

Specific examples of the yellow pigment other than the azomethine metal complex and the azo metal complex include C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 118, 119, 120, 123, 125, 126, 127, 128, 137, 138, 139, 147, 148, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232 (methine-based), 233 (quinoline-based), 234 (aminoketone-based), 235 (aminoketone-based), and 236 (aminoketone-based).

In addition, as the yellow pigment, quinophthalone compounds described in paragraph Nos. 0011 to 0034 of JP2013-054339A, quinophthalone compounds described in paragraph Nos. 0013 to 0058 of JP2014-026228A, isoindoline compounds described JP2018-062644A, quinophthalone compounds described in JP2018-203798A, quinophthalone compounds described in JP2018-062578A, quinophthalone compounds described in JP6432076B, quinophthalone compounds described in JP2018-155881A, quinophthalone compounds described in JP2018-111757A, quinophthalone compounds described in JP2018-040835A, quinophthalone compounds described in JP2017-197640A, quinophthalone compounds described in JP2016-145282A, quinophthalone compounds described in JP2014-085565A, quinophthalone compounds described in JP2014-021139A, quinophthalone compounds described in JP2013-209614A, quinophthalone compounds described in JP2013-209435A, quinophthalone compounds described in JP2013-181015A, quinophthalone compounds described in JP2013-061622A, quinophthalone compounds described in JP2013-032486A, quinophthalone compounds described in JP2012-226110A, quinophthalone compounds described in JP2008-074987A, quinophthalone compounds described in JP2008-081565A, quinophthalone compounds described in JP2008-074986A, quinophthalone compounds described in JP2008-074985A, quinophthalone compounds described in JP2008-050420A, quinophthalone compounds described in JP2008-031281A, quinophthalone compounds described in JP1973-032765B (JP-S48-032765B), quinophthalone compounds described in JP2019-008014A, quinophthalone compounds described in JP6607427B, and the like can also be used. In addition, from the viewpoint of improving a color value, a multimerized compound of these compounds is also preferably used.

As the yellow pigment, C. I. Pigment Yellow 117, 129, 138, 139, 150, or 185 is preferable, C. I. Pigment Yellow 117 or 129 is more preferable, and C. I. Pigment Yellow 129 is still more preferable.

Examples of the red pigment include a diketopyrrolopyrrole compound, an anthraquinone compound, an azo compound, a naphthol compound, an azomethine compound, a xanthene compound, a quinacridone compound, a perylene compound, and a thioindigo compound, and from the reason that it is possible to form a pixel having more excellent developer resistance, a diketopyrrolopyrrole compound or a quinacridone compound is preferable, and a diketopyrrolopyrrole compound is more preferable.

Specific examples of the red pigment include C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, 279, 291, 294, 295, 296, and 297. In addition, as the red pigment, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/102399A, diketopyrrolopyrrole compounds described in WO2012/117965A, naphtholazo compounds described in JP2012-229344, red pigments described in JP6516119B, red pigments described in JP6525101B, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used.

As the red pigment, C. I. Pigment Red 122, 177, 254, 255, 264, 269, or 272 is preferable, and C. I. Pigment Red 254, 255, 264, or 272 is more preferable.

Examples of the green pigment include a phthalocyanine compound and a squarylium compound, and from the reason that it is possible to form a pixel having more excellent developer resistance, a phthalocyanine compound is preferable, and a phthalocyanine metal complex is more preferable.

Specific examples of the green pigment include C. I. Pigment Green 7, 10, 36, 37, 58, 59, 62, 63, 64, 65, and 66. In addition, as the green pigment, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used. Specific examples thereof include the compounds described in WO2015/118720A.

In addition, as the green pigment, compounds described in CN2010-6909027A, phthalocyanine compounds described in WO2012/102395A, which have phosphoric acid ester as a ligand, phthalocyanine compounds described in JP2019-008014A, phthalocyanine compounds described in JP2018-180023A, compounds described in JP2019-038958A, squarylium compounds described in paragraph Nos. 0141 to 0151 of WO2019/167589A, and the like can be used. As the green pigment, C. I. Pigment Green 7, 36, 58, 59, 62, or 63 is preferable.

Examples of the orange pigment include C. I. Pigment Orange 2, 5, 13, 16, 17:1, 31, 34, 36, 38, 43, 46, 48, 49, 51, 52, 55, 59, 60, 61, 62, 64, 71, and 73.

Examples of the violet pigment include C. I. Pigment Violet 1, 19, 23, 27, 32, 37, 42, 60, and 61.

Specific examples of the blue pigment include C. I. Pigment Blue 1, 2, 15, 15:1, 15:2, 15:3, 15:4, 15:6, 16, 22, 29, 60, 64, 66, 79, 80, 87, and 88.

Regarding diffraction angles preferably possessed by various pigments, descriptions of JP6561862B, JP6413872B, JP6281345B, and JP2020-026503A can be referred to, the contents of which are incorporated herein by reference.

The coloring composition may include two or more kinds of chromatic pigments. For example, a coloring composition including a yellow pigment and a green pigment can be preferably used as a coloring composition for forming a green pixel of a color filter. In this case, the yellow pigment preferably includes the azomethine metal complex. In addition, the green pigment preferably includes the phthalocyanine metal complex.

In addition, a coloring composition including a yellow pigment and a red pigment can be preferably used as a coloring composition for forming a red pixel of a color filter. In this case, the yellow pigment preferably includes the azomethine metal complex. In addition, the red pigment preferably includes the diketopyrrolopyrrole compound.

In addition, the coloring composition may include two or more kinds of chromatic pigments, and black may be formed by the combination of two or more kinds of chromatic pigments. Such a coloring composition is preferably used as a coloring composition for forming an infrared transmitting filter. In a case where the combination of two or more kinds of chromatic pigments forms black, examples of the combination of the chromatic pigments include the following.

(A1) aspect in which a red pigment, a blue pigment, and a yellow pigment are contained.
(A2) aspect in which a red pigment, a blue pigment, a yellow pigment, and a violet pigment are contained.
(A3) aspect in which a red pigment, a blue pigment, a yellow pigment, a violet pigment, and a green pigment are contained.
(A4) aspect in which a red pigment, a blue pigment, a yellow pigment, and a green pigment are contained.
(A5) aspect in which a yellow pigment and a violet pigment are contained.

(Black Pigment)

The black pigment is not particularly limited, and a known black pigment can be used. Examples thereof include inorganic pigments such as carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. It is preferable that the titanium black has a small primary particle diameter of the individual particles and has a small average primary particle diameter. Specifically, an average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the contents of which are incorporated herein by reference. Examples of a commercially available product of the titanium black include Titanium black 10S, 12S, 13R, 13M, 13M-C, 13R—N, 13M-T (trade name; manufactured by Mitsubishi Materials Corporation) and Tilack D (trade name; manufactured by Akokasei Co., Ltd.).

A content of the pigment in the total solid content of the coloring composition is preferably 20% by mass or more, more preferably 30% by mass or more, still more preferably 40% by mass or more, particularly preferably more than 50% by mass, and most preferably 55% by mass or more. The upper limit is preferably 80% by mass or less, more preferably 75% by mass or less, and still more preferably 70% by mass or less.

A content of the pigment having a metal atom in the pigments included in the coloring composition is preferably 15% by mass or more, more preferably 15.5% by mass or more, and still more preferably 16% by mass or more. The upper limit may be 100% by mass, 95% by mass or less, or 90% by mass or less.

A content of the azomethine metal complex in the pigments included in the coloring composition is preferably 15% by mass or more, more preferably 15.5% by mass or more, and still more preferably 16% by mass or more. The upper limit may be 100% by mass, 95% by mass or less, or 90% by mass or less.

A content of the yellow pigment in the pigments included in the coloring composition is preferably 30% by mass or more, more preferably 33% by mass or more, and still more preferably 35% by mass or more. The upper limit may be 100% by mass, 95% by mass or less, or 90% by mass or less.

In a case where the coloring composition according to the embodiment of the present invention is used as a coloring composition for forming a yellow pixel of a color filter, the content of the yellow pigment in the pigments is preferably 90% by mass or more, more preferably 95% by mass or more, and still more preferably 99% by mass or more.

In a case where the coloring composition according to the embodiment of the present invention is used as a coloring composition for forming a green pixel of a color filter, it is preferable to use a pigment including the yellow pigment and the green pigment. In addition, a mass ratio of the yellow pigment and the green pigment is preferably yellow pigment:green pigment=30:70 to 70:30, more preferably 30:70 to 60:40, and still more preferably 30:70 to 50:50. In addition, the content of the azomethine metal complex is preferably 3 parts by mass or more, more preferably 5 parts by mass or more, and still more preferably 10 parts by mass or more with respect to 100 parts by mass of the green pigment.

In a case where the coloring composition according to the embodiment of the present invention is used as a coloring composition for forming a red pixel of a color filter, it is preferable to use a pigment including the yellow pigment and the red pigment. In addition, a mass ratio of the yellow pigment and the red pigment is preferably yellow pigment:red pigment=30:70 to 70:30, more preferably 30:70 to 60:40, and still more preferably 30:70 to 50:50. In addition, the content of the azomethine metal complex is preferably 3 parts by mass or more, more preferably 5 parts by mass or more, and still more preferably 10 parts by mass or more with respect to 100 parts by mass of the red pigment.

«Dye»

The coloring composition according to the embodiment of the present invention can contain a dye. As the dye, a known dye can be used without any particular limitation. Examples of the dye include a chromatic dye and a black dye. Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. Examples of the black dye include a bisbenzofuranone compound, an azomethine compound, a perylene compound, and an azo compound.

A content of the dye is preferably 100 parts by mass or less, more preferably 50 parts by mass or less, still more preferably 30 parts by mass or less, and particularly preferably 10 parts by mass or less with respect to 100 parts by mass of the pigment.

In addition, it is also possible that the coloring composition according to the embodiment of the present invention does not substantially contain the dye. The case where the coloring composition according to the embodiment of the present invention does not substantially include the dye means that the content of the dye in the total solid content of the coloring composition according to the embodiment of the present invention is preferably 0.1% by mass or less, more preferably 0.05% by mass or less, and particularly preferably 0% by mass.

<<Compound S>>

The coloring composition according to the embodiment of the present invention includes at least one compound S selected from a compound S-1 represented by Formula (1) or a compound S-2 in which the compound S-1 is coordinated to a metal atom.

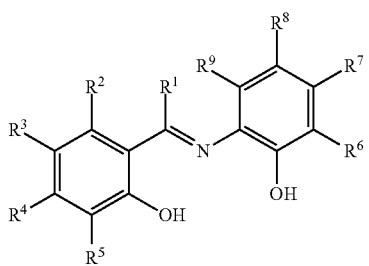

(1)

In Formula (1), $R^1$ represents a hydrogen atom, an alkyl group, or an aryl group, $R^2$ to $R^9$ each independently represent a hydrogen atom or a substituent, and two adjacent groups among $R^2$ to $R^9$ may be bonded to each other to form a ring, in which any one of $R^2$ to $R^9$ includes a group represented by Formula (R-1);

(R-1)

in Formula (R-1), $W^1$ represents a single bond or an (n+1)-valent linking group, $X^1$ represents an acid group or a basic group, and n represents an integer of 1 to 5, in which in a case where $W^1$ is a single bond, n is 1.

The alkyl group represented by $R^1$ of Formula (1) preferably has 1 to 30 carbon atoms, more preferably has 1 to 15 carbon atoms, and still more preferably has 1 to 8 carbon atoms. The alkyl group may be linear, branched, or cyclic, and is preferably linear or branched and more preferably linear. The alkyl group may have a substituent. Examples of the substituent include a substituent T described later.

The aryl group represented by $R^1$ of Formula (1) preferably has 6 to 30 carbon atoms, more preferably has 6 to 20 carbon atoms, and still more preferably has 6 to 12 carbon atoms. The aryl group may have a substituent. Examples of the substituent include a substituent T described later.

$R^1$ of Formula (1) is preferably a hydrogen atom or an alkyl group and more preferably a hydrogen atom.

$R^2$ to $R^9$ each independently represent a hydrogen atom or a substituent. Examples of the substituent include the substituent T described later and a group represented by Formula (R-1). As the substituent other than the group represented by Formula (R-1), a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group is preferable; a halogen atom, an alkyl group, an aryl group, a heteroaryl group, a cyano group, a hydroxy group, a nitro group, an alkoxy group, an aryloxy group, an acyl group, an aryloxycarbonyl group, an alkoxycarbonyl group, or a carbamoyl group is more preferable; a halogen atom, an aryl group, a cyano group, a hydroxy group, a nitro group, an alkoxy group, an aryloxy group, or an acyl group is still more preferable; and a halogen atom, an aryl group, a cyano group, or a nitro group is particularly preferable.

In Formula (1), it is preferable that $R^3$, $R^7$, or $R^8$ includes the group represented by Formula (R-1), it is more preferable that $R^7$ or $R^8$ includes the group represented by Formula (R-1), and it is still more preferable that $R^7$ or $R^8$ is the group represented by Formula (R-1). In addition, it is preferable that $R^8$ is the group represented by Formula (R-1) and $R^6$, $R^7$, and $R^9$ are each a hydrogen atom, or $R^7$ is the group represented by Formula (R-1) and $R^6$, $R^8$, and $R^9$ are each a hydrogen atom.

Two adjacent groups among $R^2$ to $R^9$ may be bonded to each other to form a ring. The ring to be formed is preferably an aromatic ring. In a case where the ring is formed, it is preferable that $R^2$ and $R^3$ are bonded to each other to form an aromatic ring (preferably, a benzene ring).

Next, the group represented by Formula (R-1) will be described. In the group represented by Formula (R-1), $W^1$ represents a single bond or an (n+1)-valent linking group.

Examples of the (n+1)-valent linking group represented by $W^1$ include an aliphatic hydrocarbon group, an aromatic hydrocarbon group, a heterocyclic group, —O—, —S—, —CO—, —COO—, —OCO—, —SO$_2$—, —NR$^W$—, —NR$^W$CO—, —CONR$^W$—, —NR$^W$SO$_2$—, —SO$_2$NR$^W$—, and a group consisting of a combination thereof, in which $R^W$ represents a hydrogen atom, an alkyl group, or an aryl group.

The number of carbon atoms in the aliphatic hydrocarbon group is preferably 1 to 20, more preferably 2 to 20, still more preferably 2 to 10, and particularly preferably 2 to 5. The aliphatic hydrocarbon group may be linear, branched, or cyclic. In addition, the cyclic aliphatic hydrocarbon group may be a single ring or a polycyclic ring. The number of carbon atoms in the aromatic hydrocarbon group is preferably 6 to 18, more preferably 6 to 14, and still more preferably 6 to 10. The aromatic hydrocarbon group is preferably a single ring or a fused ring having 2 to 4 fused numbers. The aromatic hydrocarbon group is preferably a benzene ring group. The heterocyclic group is preferably a monocyclic ring or a fused ring having 2 to 4 fused rings. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and more preferably 3 to 12. The heterocyclic group is preferably a triazine ring group. The aliphatic hydrocarbon group, the aromatic hydrocarbon group, and the heterocyclic group may have a substituent. Examples of the substituent include groups in the description of the substituent T described later. In addition, the alkyl group represented by $R^W$ preferably has 1 to 20 carbon atoms, more preferably has 1 to 15 carbon atoms, and still more preferably has 1 to 8 carbon atoms. The alkyl group may be linear, branched, or cyclic, and is preferably linear or branched and more preferably linear. The alkyl group represented by $R^W$ may further have a substituent. Examples of the substituent include the substituent T described later. The aryl group represented by $R^W$ preferably has 6 to 30 carbon atoms, more preferably has 6 to 20 carbon atoms, and still more preferably has 6 to 12 carbon atoms. The aryl group represented by $R^W$ may further have a substituent.

Examples of the substituent include the substituent T described later.

In the group represented by Formula (R-1), $X^1$ represents an acid group or a basic group, and an acid group is preferable. In addition, it is preferable that, in a case where $X^1$ of Formula (R-1) is a basic group, $W^1$ is an (n+1)-valent linking group.

Examples of the acid group represented by $X^1$ include a carboxy group, a sulfo group, a phosphoric acid group, a group represented by $-SO_2NHSO_2Rf^1$, or a salt of these groups. $Rf^1$ in the group represented by $-SO_2NHSO_2Rf^1$ represents a group including a fluorine atom. Examples of the group including a fluorine atom, represented by $Rf^1$, include a fluorine atom, an alkyl group including a fluorine atom, and an aryl group including a fluorine atom, and an alkyl group including a fluorine atom is preferable. The alkyl group including a fluorine atom preferably has 1 to 10 carbon atoms, more preferably has 1 to 5 carbon atoms, and still more preferably has 1 to 3 carbon atoms. The aryl group including a fluorine atom preferably has 6 to 20 carbon atoms, more preferably has 6 to 12 carbon atoms, and still more preferably has 6 carbon atoms.

Examples of an atom or atomic group constituting the salts include alkali metal ions ($Li^+$, $Na^+$, $K^+$, and the like), alkaline earth metal ions ($Ca^{2+}$, $Mg^{2+}$, and the like), and an ammonium ion, and an ammonium ion including a nitrogen-containing hetero ring is preferable and a pyridinium ion is more preferable.

The acid group represented by $X^1$ is preferably a sulfo group, a phosphoric acid group, a group represented by $-SO_2NHSO_2Rf^1$, or a salt of these groups; more preferably a sulfo group, a group represented by $-SO_2NHSO_2Rf^1$, or a salt of these groups; and still more preferably a salt of a sulfo group, a group represented by $-SO_2NHSO_2Rf^1$, or a salt of a group represented $-SO_2NHSO_2Rf^1$.

Examples of the basic group represented by $X^1$ include an amino group, a salt of an ammonium group, and a phthalimidomethyl group, and an amino group or a salt of an ammonium group is preferable, and an amino group is more preferable. Examples of an atom or atomic group constituting the salt in the salt of an ammonium group include a hydroxide ion, a halogen ion, a carboxylate ion, a sulfonate ion, and a phenoxide ion.

Examples of the amino group include a group represented by $-NRx^1Rx^2$ and a cyclic amino group.

In the group represented by $-NRx^1Rx^2$, $Rx^1$ and $Rx^2$ each independently represent a hydrogen atom, an alkyl group, or an aryl group, and an alkyl group is preferable. The alkyl group preferably has 1 to 10 carbon atoms, more preferably has 1 to 5 carbon atoms, and still more preferably 1 to 3 carbon atoms. The alkyl group may be linear, branched, or cyclic, and is preferably linear or branched and more preferably linear. The alkyl group may have a substituent. Examples of the substituent include a substituent T described later. The number of carbon atoms in the aryl group is preferably 6 to 30, more preferably 6 to 20, and still more preferably 6 to 12. The aryl group may have a substituent. Examples of the substituent include a substituent T described later.

Examples of the cyclic amino group include a pyrrolidine group, a piperidine group, a piperazine group, and a morpholine group. These groups may further have a substituent. Examples of the substituent include a substituent T described later. Specific examples of the substituent include an alkyl group and an aryl group.

In the group represented by Formula (R-1), n is preferably 1 to 3, more preferably 1 or 2, and still more preferably 1.

Examples of a preferred aspect of the group represented by Formula (R-1) include an aspect in which $W^1$ is a single bond, $X^1$ is an acid group, and n is 1. In addition, examples of another preferred aspect of the group represented by Formula (R-1) include an aspect of a group represented by Formula (R-11).

$$-W^{11}-W^{12}-(W^{13}-X^1)_n \qquad (R\text{-}11)$$

$W^{11}$ of Formula (R-11) represents a single bond, $-O-$, $-S-$, $-CO-$, $-COO-$, $-OCO-$, $-OCO_2-$, $-NR^W-$, $-SO_2-$, $-NR^WCO-$, $-CONR^W-$, $-NR^WCO_2-$, $-OCONR^W-$, $-NR^WSO_2-$, or $-SO_2NR^W-$, in which $R^W$ represents a hydrogen atom, an alkyl group, or an aryl group. The alkyl group represented by $R^W$ preferably has 1 to 20 carbon atoms, more preferably has 1 to 15 carbon atoms, and still more preferably has 1 to 8 carbon atoms. The alkyl group may be linear, branched, or cyclic, and is preferably linear or branched and more preferably linear. The alkyl group represented by $R^W$ may further have a substituent. Examples of the substituent include the substituent T described later. The aryl group represented by $R^W$ preferably has 6 to 30 carbon atoms, more preferably has 6 to 20 carbon atoms, and still more preferably has 6 to 12 carbon atoms. The aryl group represented by $R^W$ may further have a substituent. Examples of the substituent include the substituent T described later. In addition, $R^W$ may be linked to $X^1$ to form a ring. For example, in a case where $X^1$ is a group represented by $-NRx^1Rx^2$, $R^W$ may be linked to $Rx^1$ or $Rx^2$ to form a ring. The ring formed is preferably a 5-membered ring or a 6-membered ring.

$W^{12}$ of Formula (R-11) represents a single bond or an (n+1)-valent linking group. However, in a case where n is 1, $W^{12}$ is a single bond or a divalent linking group, and in a case where n is 2 or more, $W^{12}$ is an (n+1)-valent linking group. Examples of the linking group represented by $W^{12}$ include an aliphatic hydrocarbon group, an aromatic hydrocarbon group, a heterocyclic group, $-O-$, $-S-$, $-CO-$, $-COO-$, $-OCO-$, $-SO_2-$, $-NR^W-$, $-N<$, $-NR^WCO-$, $-CONR^W-$, $-NR^WSO_2-$, $-SO_2NR^W-$, and a group consisting of a combination thereof. $R^W$ has the same meaning as $R^W$ described above. $W^{12}$ is preferably a group including at least one selected from an aliphatic hydrocarbon group, an aromatic hydrocarbon group, or a heterocyclic group. Examples of the aliphatic hydrocarbon group, the aromatic hydrocarbon group, and the heterocyclic group include those described above. Specific examples of the linking group represented by $W^{12}$ include an aliphatic hydrocarbon group, an aromatic hydrocarbon group, a heterocyclic group, and a group of a combination of at least one selected from an aliphatic hydrocarbon group, an aromatic hydrocarbon group, or a heterocyclic group, and at least one selected from $-O-$, $-S-$, $-CO-$, $-COO-$, $-OCO-$, $-SO_2-$, $-NR^W-$, $-N<$, $-NR^WCO-$, $-CONR^W-$, $-NR^WSO_2-$, or $-SO_2NR^W-$. Examples of one preferred aspect of $W^{12}$ include a group including at least one selected from an aromatic hydrocarbon group or a heterocyclic group. Examples of the group including at least one selected from an aromatic hydrocarbon group or a heterocyclic group include groups represented by Formulae (W12-1) to (W12-6).

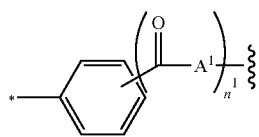
(W12-1)

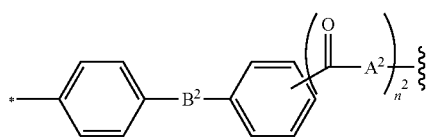
(W12-2)

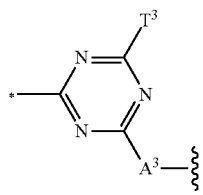
(W12-3)

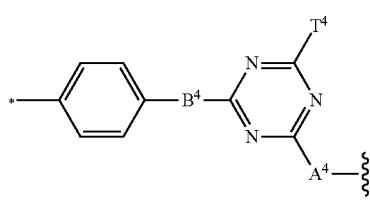
(W12-4)

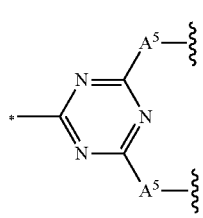
(W12-5)

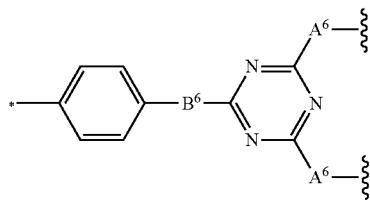
(W12-6)

In Formulae (W12-1) to (W12-6), * represents a bonding portion with $W^{11}$ of Formula (R-1) and a wavy line represents a bonding portion with $W^{13}$ of Formula (R-1).

A1 of Formula (W12-1) represents O or $NR^{W12}$. $R^{W12}$ has the same meaning as $R^W$ described above. $n^1$ represents an integer of 1 to 4.

$A^2$ and $n^2$ of Formula (W12-2) have the same meaning as $A^1$ and $n^1$. $B^2$ represents a single bond, —O—, —S—, —CO—, —COO—, —OCO—, —SO$_2$—, —$NR^W$—, —$NR^W$CO—, —$CONR^W$—, —$NR^W$SO$_2$—, or —SO$_2NR^W$—. $R^{W12}$ has the same meaning as $R^W$ described above.

$T^3$ of Formula (W12-3) represents the substituent T described later. $A^3$ has the same meaning as $A^1$.

$T^4$, $A^4$, and $B^4$ of Formula (W12-4) have the same meaning as $T^3$, $A^1$, and $B^2$.

$A^5$ of Formula (W12-5) has the same meaning as $A^1$.

$A^6$ and $B^6$ of Formula (W12-6) have the same meaning as $A^1$ and $B^2$.

As $T^3$ and $T^4$ described above, a hydroxy group, an amino group, an alkoxy group, an aryloxy group, a thioalkyl group, a thioaryl group, or a halogen atom is preferable, and a hydroxy group or an amino group is more preferable. The amino group is preferably an alkylamino group or an arylamino group, and more preferably an arylamino group.

$W^{13}$ of Formula (R-11) represents an alkylene group. The number of carbon atoms in the alkylene group preferably is 2 to 10, more preferably 2 to 8, and still more preferably 2 to 5.

$X^1$ of Formula (R-11) represents an acid group or a basic group. $X^1$ of Formula (R-11) has the same meaning as $X^1$ of Formula (R-1).

n of Formula (R-11) represents an integer of 1 to 5, and is preferably 1 to 3, more preferably 1 or 2, and still more preferably 1.

(Substituent T)

Examples of the substituent T include the following groups: a halogen atom (for example, a fluorine atom, a chlorine atom, a bromine atom, and an iodine atom), an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), a heteroaryl group (preferably a heteroaryl group having 1 to 30 carbon atoms), an alkoxy group (preferably an alkoxy group having 1 to 30 carbon atoms), an aryloxy group (preferably an aryloxy group having 6 to 30 carbon atoms), a heteroaryloxy group (preferably a heteroaryloxy group having 1 to 30 carbon atoms), an acyl group (preferably an acyl group having 2 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), a heteroaryloxycarbonyl group (preferably a heteroaryloxycarbonyl group having 2 to 30 carbon atoms), an acyloxy group (preferably an acyloxy group having 2 to 30 carbon atoms), an acylamino group (preferably an acylamino group having 2 to 30 carbon atoms), an aminocarbonylamino group (preferably an aminocarbonylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a sulfamoylamino group (preferably a sulfamoylamino group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably a heteroarylthio group having 1 to 30 carbon atoms), an alkylsulfonyl group (preferably an alkylsulfonyl group having 1 to 30 carbon atoms), an alkylsulfonylamino group (preferably an alkylsulfonylamino group having 1 to 30 carbon atoms), an arylsulfonyl group (preferably an arylsulfonyl group having 6 to 30 carbon atoms), an arylsulfonylamino group (preferably an arylsulfonylamino group having 6 to 30 carbon atoms), a heteroarylsulfonyl group (preferably a heteroarylsulfonyl group having 1 to 30 carbon atoms), a heteroarylsulfonylamino group (preferably a heteroarylsulfonylamino group having 1 to 30 carbon atoms), an alkylsulfinyl group (preferably an alkylsulfinyl group having 1 to 30 carbon atoms), an arylsulfinyl group (preferably an arylsulfinyl group having 6 to 30 carbon atoms), a heteroarylsulfinyl group (preferably a heteroarylsulfinyl group having 1 to 30 carbon atoms), a ureide group (preferably a ureide group having 1 to 30 carbon atoms), a hydroxy group, a nitro group, an imide group, a mercapto group, a cyano group, an alkylsulfino group, an arylsulphino group, an arylazo group, a heteroarylazo group, a silyl group, a hydradino group, and an imino group. In a case where the above-described groups can be further substituted, the groups may further have a substituent. Examples of the substituent include the groups described regarding the substituent T.

The compound S-1 is preferably a compound represented by Formula (11).

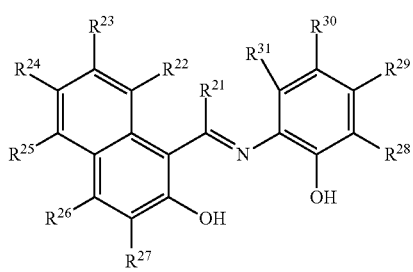

In Formula (11), $R^{21}$ represents a hydrogen atom, an alkyl group, or an aryl group, and $R^{22}$ to $R^{31}$ each independently represent a hydrogen atom or a substituent, in which any one of $R^{22}$ to $R^{31}$ includes the group represented by Formula (R-1).

$R^{21}$ of Formula (11) has the same meaning as $R^1$ of Formula (1), and a preferred range thereof is also the same.

Examples of the substituent represented by $R^{22}$ to $R^{31}$ of Formula (11) include the substituent T and the group represented by Formula (R-1). As the substituent other than the group represented by Formula (R-1), a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group is preferable; a halogen atom, an alkyl group, an aryl group, a heteroaryl group, a cyano group, a hydroxy group, a nitro group, an alkoxy group, an aryloxy group, an acyl group, an aryloxycarbonyl group, an alkoxycarbonyl group, or a carbamoyl group is more preferable; a halogen atom, an aryl group, a cyano group, a hydroxy group, a nitro group, an alkoxy group, an aryloxy group, or an acyl group is still more preferable; and a halogen atom, an aryl group, a cyano group, or a nitro group is particularly preferable.

In Formula (11), it is preferable that $R^{24}$, $R^{29}$, or $R^{30}$ is the group represented by Formula (R-1), it is more preferable that $R^{29}$ or $R^{30}$ is the group represented by Formula (R-1), and it is still more preferable that $R^{30}$ is the group represented by Formula (R-1). In addition, it is preferable that the remaining group is a hydrogen atom.

In the compound S, the compound S-2 is a compound having a structure in which the above-described compound S-1 is coordinated to a metal atom. Examples of the metal atom include copper, zinc, iron, titanium, aluminum, tin, magnesium, and chromium, and copper or zinc is preferable. In the compound S-2, one compound S-1 may be coordinated to these metal atoms, or two or more compounds S-1 may be coordinated to these metal atoms. In addition, a ligand other than the compound S-1 may be further coordinated to the metal atom. Examples of the ligand include a heterocyclic compound (for example, pyridine, pyrimidine, imidazole, pyrazole, triazole, tetrazole, quinoline, 1,10-phenanthroline, and the like), a protonic compound (for example, water, methanol, ethanol, and the like), an amine compound (for example, triethylamine, N,N,N',N'-tetramethylenediamine, ethylenediamine tetraacetic acid, N,N,N', N'',N'''-pentamethyldiethylenetriamine, and the like), an amide compound (for example, N,N-dimethylacetamide, N-methylpyrrolidone, and the like), dimethylsulfoxide, sulfolane, and a nitrile compound (for example, acetonitrile and the like). In addition, a dinuclear complex may be used as the compound S-2.

The compound S-2 is preferably a compound represented by Formula (1a), and more preferably a compound represented by Formula (11a). In the following formulae, the nitrogen atom is coordinated to the metal atom ($M^1$ or $M^2$), but the nitrogen atom may not be coordinated to the metal atom ($M^1$ or $M^2$) depending on the state of the metal atom.

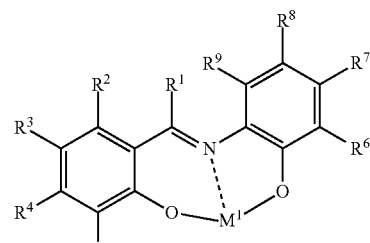

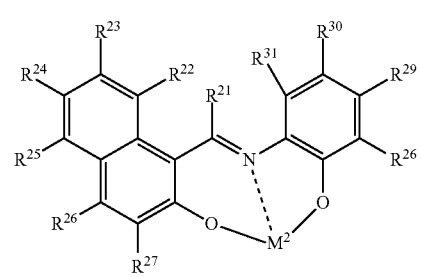

In Formula (1a), $R^1$ represents a hydrogen atom, an alkyl group, or an aryl group, $R^2$ to $R^9$ each independently represent a hydrogen atom or a substituent, two adjacent groups among $R^2$ to $R^9$ may be bonded to each other to form a ring, and $M^1$ represents a metal atom which may be coordinated with a ligand, in which any one of $R^2$ to $R^9$ includes the group represented by Formula (R-1).

In Formula (11a), $R^{21}$ represents a hydrogen atom, an alkyl group, or an aryl group, $R^{22}$ to $R^{31}$ each independently represent a hydrogen atom or a substituent, and $M^2$ represents a metal atom which may be coordinated with a ligand, in which any one of $R^{22}$ to $R^{31}$ includes the group represented by Formula (R-1).

$R^1$ to $R^9$ of Formula (1a) have the same meanings as $R^1$ to $R^9$ of Formula (1), and preferred ranges thereof are also the same.

$R^{21}$ to $R^{31}$ of Formula (11a) have the same meanings as $R^{21}$ to $R^{31}$ of Formula (11), and preferred ranges thereof are also the same.

Examples of the metal atom to which the ligand may be coordinated, which is represented by $M^1$ of Formula (1a) and $M^2$ of Formula (11a), include copper, zinc, iron, titanium, aluminum, tin, magnesium, and chromium, and copper or zinc is preferable. Examples of the ligand which may be coordinated to these metal atoms include ligands mentioned in the ligand other than the compound S-1. In addition, the compound represented by Formula (1) may be further coordinated thereto.

The compound S is preferably a compound represented by Formula (1-1), Formula (1a-1), Formula (11-1), or Formula (11a-1). These compounds are also the compound according to the embodiment of the present invention. In the following formulae, the nitrogen atom is coordinated to the metal atom ($M^{1a}$ or $M^{2a}$), but the nitrogen atom may not be coordinated to the metal atom ($M^{1a}$ or $M^{2a}$) depending on the state of the metal atom.

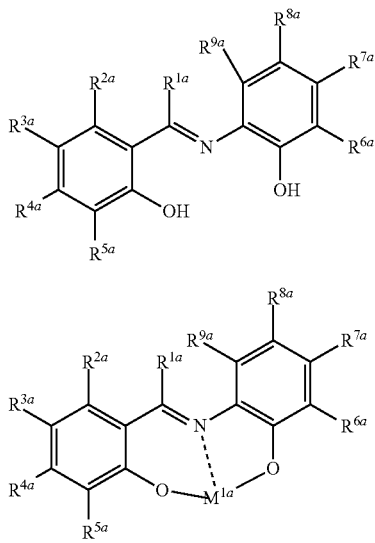

(1-1)

(1a-1)

In Formula (1-1) and Formula (1a-1), $R^{1a}$ represents a hydrogen atom, an alkyl group, or an aryl group.

$R^{2a}$ to $R^{9a}$ each independently represent a hydrogen atom, a salt of a carboxy group, a salt of a sulfo group, a salt of a phosphoric acid group, a group represented by —SO$_2$NHSO$_2$Rf$^1$, a salt of a group represented by —SO$_2$NHSO$_2$Rf$^1$, a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group.

Rf$^1$ represents a group including a fluorine atom.

$M^{1a}$ represents a metal atom which may be coordinated with a ligand.

However, any one of $R^{2a}$ to $R^{9a}$ is a salt of a sulfo group, a group represented by —SO$_2$NHSO$_2$Rf$^1$, or a salt of a group represented by —SO$_2$NHSO$_2$Rf$^1$.

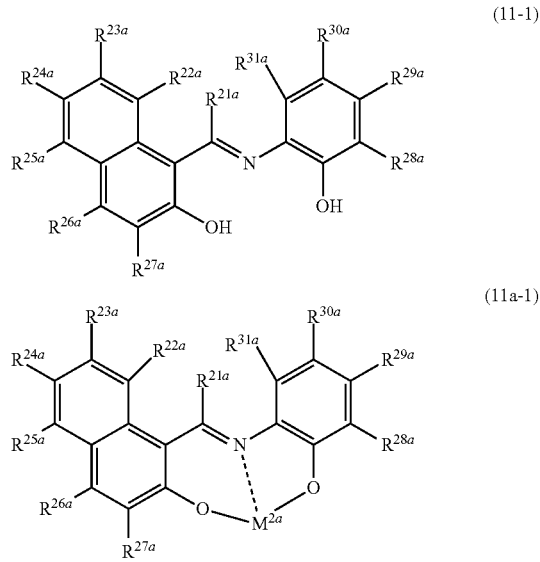

(11-1)

(11a-1)

In Formula (11-1) and Formula (11a-1), $R^{21a}$ represents a hydrogen atom, an alkyl group, or an aryl group.

$R^{22a}$ to $R^{31a}$ each independently represent a hydrogen atom, a salt of a carboxy group, a salt of a sulfo group, a salt of a phosphoric acid group, a group represented by —SO$_2$NHSO$_2$Rf$^1$, a salt of a group represented by —SO$_2$NHSO$_2$Rf$^1$, a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group.

Rf$^1$ represents a group including a fluorine atom. $M^{2a}$ represents a metal atom which may be coordinated with a ligand.

However, any one of $R^{22a}$ to $R^{31a}$ is a salt of a sulfo group, a group represented by —SO$_2$NHSO$_2$Rf$^1$, or a salt of a group represented by —SO$_2$NHSO$_2$Rf$^1$.

In Formula (1-1) and Formula (1a-1), it is preferable that $R^{3a}$, $R^{7a}$, or $R^{8a}$ is a salt of a sulfo group, a group represented by —SO$_2$NHSO$_2$Rf$^1$, or a salt of a group represented by —SO$_2$NHSO$_2$Rf$^1$; it is more preferable that $R^{7a}$ or $R^{8a}$ is a salt of a sulfo group, a group represented by —SO$_2$NHSO$_2$Rf$^1$, or a salt of a group represented by —SO$_2$NHSO$_2$Rf$^1$; and it is still more preferable that $R^{8a}$ is a salt of a sulfo group, a group represented by —SO$_2$NHSO$_2$Rf$^1$, or a salt of a group represented by —SO$_2$NHSO$_2$Rf$^1$.

In Formula (11-1) and Formula (11a-1), it is preferable that $R^{24a}$, $R^{29a}$, or $R^{30a}$ is a salt of a sulfo group, a group represented by —$SO_2NHSO_2Rf^1$, or a salt of a group represented by —$SO_2NHSO_2Rf^1$; it is more preferable that $R^{29a}$ or $R^{30a}$ is a salt of a sulfo group, a group represented by —$SO_2NHSO_2Rf^1$, or a salt of a group represented by —$SO_2NHSO_2Rf^1$; and it is still more preferable that $R^{30a}$ is a salt of a sulfo group, a group represented by —$SO_2NHSO_2Rf^1$, or a salt of a group represented by —$SO_2NHSO_2Rf^1$.

Examples of the metal atom to which the ligand may be coordinated, which is represented by $M^{1a}$ of Formula (1a-1) and $M^{2a}$ of Formula (11a-1), include copper, zinc, iron, titanium, aluminum, tin, magnesium, and chromium, and copper or zinc is preferable. Examples of the ligand which may be coordinated to these metal atoms include ligands mentioned in the ligand other than the compound S-1. In addition, the compound represented by Formula (1-1) or the compound represented by (11-1) may be further coordinated thereto.

Specific examples of the compound S include compounds (S-1) to (S-20) described in Examples described later.

Examples of a method for synthesizing the compound S include methods shown below.

(i) method of performing a synthesis by reacting a raw material into which an acid group or a basic group has been introduced in advance (hydroxy-substituted arylaldehyde or hydroxy-substituted aniline) and a metal source.

(ii) method of performing a synthesis by introducing an acid group or a basic group into an azomethine compound synthesized by reacting hydroxy-substituted arylaldehyde or hydroxy-substituted aniline with a metal source.

In the case of the synthesis method (i), the reaction can be carried out by simultaneously mixing the hydroxy-substituted arylaldehyde or the hydroxy-substituted aniline with the metal source, or the hydroxy-substituted arylaldehyde or the hydroxy-substituted aniline can also be reacted first and then reacted with the metal source. In this reaction, for example, an acidic compound (for example, acetic acid, sulfuric acid, and the like) or a basic compound (for example, triethylamine, pyridine, and the like) may be added. As a solvent, a known solvent can be selected, and examples thereof include an alcohol-based solvent (for example, methanol, ethanol, isopropanol, propylene glycol monomethyl ether, and the like), an amide-based solvent (for example, N,N-dimethylacetamide, N,N-dimethylformamide, N-methylpyrrolidone, N-ethylpyrrolidone, 3-methoxy-N,N-dimethylpropanamide, and the like), other polar solvents (dimethylsulfoxide, dimethylimidazolidinone, sulfolane, and the like), water, an ester-based solvent (for example, propylene glycol monomethyl ether acetate, ethyl acetate, butyl acetate, and the like), an acidic solvent (for example, acetic acid and the like), an ether-based solvent (for example, tetrahydrofuran, t-butyl methyl ether, and the like), a ketone-based solvent (for example, cyclohexanone, cyclopentanone, acetone, methyl ethyl ketone, methyl isobutyl ketone, and the like), a hydrocarbon-based solvent (for example, hexane, heptane, and the like), an aromatic solvent (for example, toluene and the like), and a basic solvent (for example, pyridine and the like). Among these, an alcohol-based solvent, an amide-based solvent, dimethylsulfoxide, or dimethylimidazolidinone is preferable. Although the temperature and time cannot be uniquely determined, the reaction is preferably carried out in a range of 10° C. to 100° C. for 1 to 24 hours.

As the metal source, any metal source used for synthesizing a C. I. Pigment Yellow 129-type compound can be used without particular limitation, and examples thereof include acetates, halide salts, and sulfonates. In addition, a ligand such as 8-hydroxyquinoline may be mixed and reacted.

The hydroxy-substituted arylaldehyde and the hydroxy-substituted aniline, which have an acid group or a base in the synthesis method (i), can be synthesized according to, for example, JP2013-510156B, Chemistry—A European Journal, 2009, vol. 15, sha-pu 33, pp. 8283 to 8295, and the like.

In the synthesis method (ii), OH, $NH_2$, $CO_2H$, or $SO_3H$ can be introduced into the azomethine compound in advance, and the functional group thereof is reacted with a compound having an acid group or an amino group to synthesize the compound S.

A content of the compound S in the total solid content of the coloring composition is preferably 0.1% to 30% by mass. The lower limit is preferably 0.5% by mass or more and more preferably 1% by mass or more. The upper limit is preferably 20% by mass or less and more preferably 15% by mass or less.

In addition, the content of the compound S is preferably 1 to 50 parts by mass with respect to 100 parts by mass of the pigment. The lower limit is preferably 3 parts by mass or more, more preferably 5 parts by mass or more, and still more preferably 10 parts by mass or more. The upper limit is preferably 40 parts by mass or less and more preferably 30 parts by mass or less.

As the compound S, one kind may be included, or two or more kinds may be included. In a case where two or more kinds thereof are included, the total amount thereof is preferably within the above-described range. In addition, the compound S may include a structural isomer, and a proportion of the structural isomer in the compound S is preferably 50% by mass or less, more preferably 30% by mass or less, particularly preferably 10% by mass or less. In addition, it is particularly preferable that the compound S does not include the structural isomer.

<<Resin>>

(Specific Resin)

The coloring composition according to the embodiment of the present invention contains a resin P (hereinafter, also referred to as a resin). The resin is blended in, for example, an application for dispersing a pigment or the like in the coloring composition or an application as a binder. Mainly, a resin which is used for dispersing a pigment or the like in the coloring composition is also referred to as a dispersant. However, such applications of the resin are merely exemplary, and the resin can also be used for other purposes in addition to such applications.

The resin included in the coloring composition according to the embodiment of the present invention includes at least one selected from a graft resin P-1 which has a graft chain including at least one structure selected from a polyester structure, a polyether structure, or a poly(meth)acrylic structure (hereinafter, also referred to as a graft resin P-1), a block copolymer P-2 including at least one structure selected from a polyester structure, a polyether structure, or a poly(meth)acrylic structure (hereinafter, also referred to as a block copolymer P-2), or a resin P-3 in which at least one terminal of a polymer chain including at least one structure selected from a polyester structure, a polyether structure, or a poly(meth)acrylic structure is capped with an acid group (hereinafter, also referred to as a resin P-3). Hereinafter, the graft resin P-1, the block copolymer P-2, and the resin P-3 are collectively referred to as a specific resin.

In a case where the graft resin P-1 is used as the specific resin, due to a network structure, strength of a film obtained using the coloring composition is increased, and a pixel having excellent scratch resistance can be formed. In addition, in a case where the block copolymer P-2 is used as the specific resin, coating properties and the like of the coloring composition can be improved. In addition, in a case where the resin P-3 is used as the specific resin, since the resin P-3 has a relatively high adsorption speed to the pigment, the pigment can be dispersed in the composition in a shorter time during production of the coloring composition.

The specific resin may be used alone or in a combination of two or more kinds thereof. In a case where two kinds of the specific resin are used in combination, two or more kinds of the graft resin P-1 may be used in combination; two or more kinds of the block copolymer P-2 may be used in combination; two or more kinds of the resin P-3 may be used in combination; one or more kinds of the graft resin P-1 and one or more kinds of the block copolymer P-2 may be used in combination; one or more kinds of the graft resin P-1 and one or more kinds of the resin P-3 may be used in combination; or one or more kinds of the graft resin P-1, one or more kinds of the block copolymer P-2, and one or more kinds of the resin P-3 may be used in combination.

Hereinafter, each resin used as the specific resin will be described.

[Graft Resin P-1]

The graft resin P-1 has a graft chain including at least one structure selected from a polyester structure, a polyether structure, or a poly(meth)acrylic structure. Examples of the polyester structure include a structure represented by Formula (G-1), Formula (G-4), or Formula (G-5). Examples of the polyether structure include a structure represented by Formula (G-2). Examples of the poly(meth)acrylic structure include a structure represented by Formula (G-3).

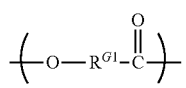 (G-1)

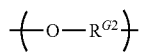 (G-2)

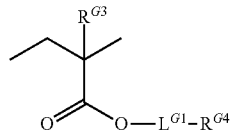 (G-3)

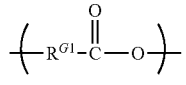 (G-4)

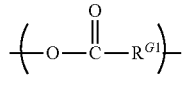 (G-5)

In the formulae, $R^{G1}$ and $R^{G2}$ each represent an alkylene group. As the alkylene group represented by $R^{G1}$ and $R^{G2}$, a linear or branched alkylene group having 1 to 20 carbon atoms is preferable, a linear or branched alkylene group having 2 to 16 carbon atoms is more preferable, and a linear or branched alkylene group having 3 to 12 carbon atoms is still more preferable.

In the formulae, $R^{G3}$ represents a hydrogen atom or a methyl group.

In the formulae, $L^{G1}$ represents a single bond or a divalent linking group. Examples of the divalent linking group include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group formed by a combination of two or more of these groups.

$R^{G4}$ represents a hydrogen atom or a substituent. Examples of the substituent include an alkyl group, an aryl group, a heteroaryl group, an alkoxy group, an aryloxy group, a heteroaryloxy group, an alkylthioether group, an arylthioether group, a heteroarylthioether group, an ethylenically unsaturated bond-containing group, a cyclic ether group, and a blocked isocyanate group. Examples of the ethylenically unsaturated bond-containing group include a vinyl group, a (meth)allyl group, and a (meth)acryloyl group. Examples of the cyclic ether group include an epoxy group and an oxetanyl group.

A terminal structure of the graft chain is not particularly limited. The terminal structure may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among these, from the viewpoint of improvement of the dispersibility of the pigment, a group having a steric repulsion effect is preferable, and an alkyl group or alkoxy group having 5 to 30 carbon atoms is preferable. The alkyl group and the alkoxy group may be linear, branched, or cyclic, and are preferably linear or branched.

The graft chain means a molecular chain branched from a main chain. In addition, the main chain means a molecular chain having the most branch points.

A weight-average molecular weight of the graft chain in the graft resin P-1 is preferably 500 to 30000, more preferably 1000 to 20000, and still more preferably 2000 to 10000.

The graft resin P-1 is preferably a resin including a repeating unit represented by Formula (P-1-1).

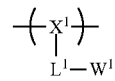 (P-1-1)

In Formula (P-1-1), $X^1$ represents a trivalent linking group, $L^1$ represents a single bond or a divalent linking group, and $W^1$ represents a graft chain including at least one structure selected from a polyester structure, a polyether structure, or a poly(meth)acrylic structure.

Examples of the trivalent linking group represented by $X^1$ include a poly(meth)acrylic linking group, a polyalkyleneimine-based linking group, a polyester-based linking group, a polyurethane-based linking group, a polyuria-based linking group, a polyamide-based linking group, a polyether-based linking group, and a polystyrene-based linking group. Among these, a poly(meth)acrylic linking group, a polyalkyleneimine-based linking group, or a polyester-based linking group is preferable, and a poly(meth)acrylic linking group is more preferable.

Examples of the divalent linking group represented by $L^1$ include an alkylene group, an arylene group, —O—, —CO—, —COO—, —OCO—, —NH—, —S—, and a group formed by a combination of two or more of these groups. The number of carbon atoms in the alkylene group preferably is 1 to 30, more preferably 1 to 20, and still more preferably 1 to 15. The alkylene group may be linear, branched, or cyclic. The number of carbon atoms in the arylene group is preferably 6 to 30, more preferably 6 to 20, and still more preferably 6 to 10. The alkylene group and the arylene group may have a substituent.

Examples of the graft chain represented by $W^1$ include those described above, and a preferred range thereof is also the same.

From the viewpoint of adsorption to the pigment, a main chain of the graft resin P-1 preferably includes a repeating unit having at least one selected from an acid group, a basic group, or a pigment-like skeleton. Examples of the acid group include a carboxy group, a sulfo group, and a phosphoric acid group, and a carboxy group is preferable. Examples of the basic group include a group represented by Formula (a-1) and a group represented by Formula (a-2). Examples of the pigment-like skeleton include an aromatic ring (for example, phenyl and naphthyl) and a hetero ring (for example, phenylmaleimide, naphthalimide, benzimidazole, benzmidazolone, anthraquinone, and the like).

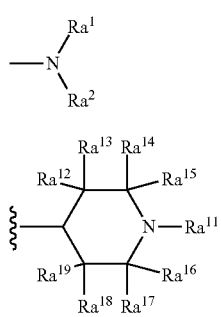

In Formula (a-1), $Ra^1$ and $Ra^2$ each independently represent a hydrogen atom, an alkyl group, or an aryl group, and $Ra^1$ and $Ra^2$ may be bonded to each other to form a ring;

in Formula (a-2), $Ra^{11}$ represents a hydrogen atom, a hydroxy group, an alkyl group, an alkoxy group, an aryl group, an aryloxy group, an acyl group, or an oxyradical, and $Ra^{12}$ to $Ra^{19}$ each independently represent a hydrogen atom, an alkyl group, or an aryl group.

The alkyl group represented by $Ra^1$, $Ra^2$, and $Ra^{11}$ to $W^{19}$ preferably has 1 to 30 carbon atoms, more preferably has 1 to 15 carbon atoms, still more preferably has 1 to 8 carbon atoms, and particularly preferably has 1 to 5 carbon atoms. The alkyl group may be linear, branched, or cyclic, and is preferably linear or branched and more preferably linear. The alkyl group may have a substituent.

The aryl group represented by $Ra^1$, $Ra^2$, and $Ra^{11}$ to $Ra^{19}$ preferably has 6 to 30 carbon atoms, more preferably has 6 to 20 carbon atoms, and still more preferably has 6 to 12 carbon atoms. The aryl group may have a substituent.

The alkoxy group represented by $Ra^{11}$ preferably has 1 to 30 carbon atoms, more preferably has 1 to 15 carbon atoms, still more preferably has 1 to 8 carbon atoms, and particularly preferably has 1 to 5 carbon atoms. The alkoxy group may have a substituent.

The aryloxy group represented by $Ra^{11}$ preferably has 6 to 30 carbon atoms, more preferably has 6 to 20 carbon atoms, and still more preferably has 6 to 12 carbon atoms. The aryloxy group may have a substituent.

The acyl group represented by $Ra^{11}$ preferably has 2 to 30 carbon atoms, more preferably has 2 to 20 carbon atoms, and still more preferably has 2 to 12 carbon atoms. The acyl group may have a substituent.

The main chain of the graft resin P-1 also preferably includes a repeating unit having a polymerizable group. Examples of the polymerizable group include ethylenically unsaturated bond-containing groups such as a vinyl group, a (meth)allyl group, and a (meth)acryloyl group.

A weight-average molecular weight of the graft resin P-1 is preferably 2000 to 50000, more preferably 3000 to 45000, and still more preferably 4000 to 40000.

In a case where the graft resin P-1 has an acid group, an acid value of the graft resin P-1 is preferably 10 to 200 mgKOH/g, more preferably 20 to 150 mgKOH/g, and still more preferably 30 to 120 mgKOH/g. In a case where the graft resin P-1 has a basic group, an amine value of the graft resin P-1 is preferably 10 to 200 mgKOH/g, more preferably 20 to 150 mgKOH/g, and still more preferably 30 to 120 mgKOH/g.

Specific examples of the graft resin P-1 include dispersants B-1, B-2, B-3, B-4, B-6, B-7, B-8, B-9, B-10, and the like described in Examples later. In addition, examples thereof also include resins described in paragraph Nos. 0025 to 0094 of JP2012-255128A, paragraph Nos. 0022 to 0097 of JP2009-203462A, and paragraph Nos. 0102 to 0166 of JP2012-255128A.

[Block Copolymer P-2]

The block copolymer P-2 includes at least one structure selected from a polyester structure, a polyether structure, or a poly(meth)acrylic structure. Examples of the polyester structure include the above-described structure represented by Formula (G-1), Formula (G-4), or Formula (G-5). Examples of the polyether structure include the above-described structure represented by Formula (G-2). Examples of the poly(meth)acrylic structure include the above-described structure represented by Formula (G-3). In the present specification, the block copolymer means a copolymer having blocks of a plurality of polymers.

The block copolymer P-2 is preferably a block copolymer of a block (hereinafter, also referred to as a block A) of a polymer having a repeating unit including an acid group or a basic group and a block (hereinafter, also referred to as a block B) of a polymer having a repeating unit which does not include an acid group and a basic group. Examples of the acid group and the basic group include the acid groups and basic groups described in the graft resin P-1, and the preferred ranges are also the same.

It is preferable that at least one of the block A or the block B includes the at least one structure selected from a polyester structure, a polyether structure, or a poly(meth)acrylic structure, it is more preferable that both the block A and the block B include the at least one structure selected from a polyester structure, a polyether structure, or a poly(meth)acrylic structure, and it is still more preferable that both the block A and the block B include the poly(meth)acrylic structure.

In addition, the block A is preferably a block of a polymer having a repeating unit including a basic group.

At least one of the block A or the block B may include a polymerizable group.

A weight-average molecular weight of the block copolymer P-2 is preferably 2000 to 50000, more preferably 3000 to 45000, and still more preferably 4000 to 40000.

In a case where the block copolymer P-2 has an acid group, an acid value of the block copolymer P-2 is preferably 10 to 200 mgKOH/g, more preferably 20 to 150 mgKOH/g, and still more preferably 30 to 120 mgKOH/g. In a case where the block copolymer P-2 has a basic group, an amine value of the block copolymer P-2 is preferably 10 to 200 mgKOH/g, more preferably 20 to 150 mgKOH/g, and still more preferably 30 to 120 mgKOH/g.

Specific examples of the block copolymer P-2 include dispersants B-5 and the like described in Examples later. As the block copolymer P-2, a block copolymer (B) described in paragraph Nos. 0063 to 0112 of JP2014-219665A or a block copolymer A1 described in paragraph Nos. 0046 to 0076 of JP2018-156021A can also be used, the contents of which are incorporated herein by reference.

[Resin P-3]

The resin P-3 is a resin in which at least one terminal of a polymer chain including at least one structure selected from a polyester structure, a polyether structure, or a poly(meth)acrylic structure is capped with an acid group. Examples of the polyether structure include the above-described structure represented by Formula (G-2). Examples of the poly(meth)acrylic structure include the above-described structure represented by Formula (G-3).

In the resin P-3, examples of the acid group capping the terminal of the polymer chain include a carboxy group, a sulfo group, and a phosphoric acid group, and a phosphoric acid group is preferable.

The resin P-3 is preferably a resin having a structure represented by Formula P-3-1.

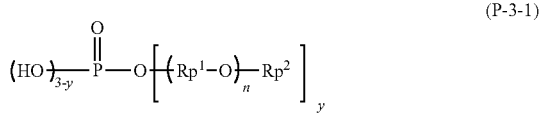

(P-3-1)

In the formula, $Rp^1$ represents an alkylene group, $Rp^2$ represents a hydrogen atom or a substituent, n represents a number of 10 to 1000, and y represents a number or 1 or 2.

The alkylene group represented by $Rp^1$ preferably has 1 to 10 carbon atoms, more preferably has 1 to 5 carbon atoms, and still more preferably has 2 or 3 carbon atoms. $Rp^1$ is preferably an ethylene group.

Examples of the substituent represented by $Rp'$ include an alkyl group, an aryl group, and a heteroaryl group, and an alkyl group is preferable. The alkyl group preferably has 5 to 30 carbon atoms. The alkyl group may be linear, branched, or cyclic, and is preferably linear or branched and more preferably branched.

A weight-average molecular weight of the resin P-3 is preferably 2000 to 50000, more preferably 3000 to 45000, and still more preferably 4000 to 40000.

An acid value of the resin P-3 is preferably 10 to 200 mgKOH/g, more preferably 20 to 150 mgKOH/g, and still more preferably 30 to 120 mgKOH/g.

Specific examples of the resin P-3 include dispersants B-11, B-12, B-13, and the like described in Examples later.

(Other Resins)

The coloring composition according to the embodiment of the present invention can contain a resin (hereinafter, also referred to as other resins) other than the above-described specific resin.

Examples of the other resins include a (meth)acrylic resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyimine resin, a polyolefin resin, a cyclic olefin resin, a polyester resin, and a styrene resin. These resins may be used singly or as a mixture of two or more kinds thereof.

A weight-average molecular weight (Mw) of the other resins is preferably 2000 to 2000000. The upper limit is preferably 1000000 or less and more preferably 500000 or less. The lower limit is preferably 3000 or more and more preferably 5000 or more.

As the other resins, an alkali-soluble resin can be used. Examples of the alkali-soluble resin include resins having an acid group. Examples of the type of the acid group include a carboxy group, a phosphoric acid group, a sulfo group, and a phenolic hydroxy group. In addition, as the resin having an acid group, a resin in which an acid anhydride is reacted with a hydroxy group generated by an epoxy ring opening to introduce an acid group may be used. Examples of such a resin include resins described in JP6349629B. The resin having an acid group can also be used as a dispersant. In addition, as the alkali-soluble resin, an alkali-soluble resin described in JP2017-173787A can also be used.

An acid value of the alkali-soluble resin is preferably 30 to 500 mgKOH/g. The lower limit is preferably 50 mgKOH/g or more and more preferably 70 mgKOH/g or more. The upper limit is preferably 400 mgKOH/g or less, more preferably 200 mgKOH/g or less, still more preferably 150 mgKOH/g or less, and most preferably 120 mgKOH/g or less.

As the other resins, it is possible to use a resin including a repeating unit derived from a compound represented by Formula (ED1) and/or a compound represented by Formula (ED2) (hereinafter, these compounds will also be referred to as an "ether dimer").

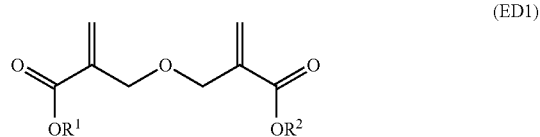

(ED1)

In Formula (ED1), $R^1$ and $R^2$ each independently represent a hydrogen atom or a hydrocarbon group having 1 to 25 carbon atoms, which may have a substituent.

(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph No. 0317 of JP2013-029760A, the contents of which are incorporated herein by reference.

As the other resins, a resin including a repeating unit having a polymerizable group can be used.

As the resin, it is possible to use a resin including a repeating unit derived from a compound represented by Formula (X).

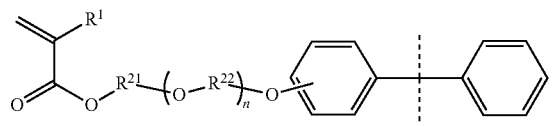

In the formula, $R^1$ represents a hydrogen atom or a methyl group, $R^{21}$ and $R^{22}$ each independently represent an alkylene group, and n represents an integer of 0 to 15. The number of carbon atoms in the alkylene group represented by $R^{21}$ and $R^{22}$ is preferably 1 to 10, more preferably 1 to 5, still more preferably 1 to 3, and particularly preferably 2 or 3. n represents an integer of 0 to 15, and is preferably an integer of 0 or 5, more preferably an integer of 0 to 4, and still more preferably an integer of 0 to 3.

Examples of the compound represented by Formula (X) include ethylene oxide- or propylene oxide-modified (meth) acrylate of para-cumylphenol. Examples of a commercially available product thereof include ARONIX M-110 (manufactured by TOAGOSEI CO., LTD.).

As the other resins, a resin as a dispersant can also be used. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group is 70 mol % or more in a case where the total amount of the acid group and the basic group is 100 mol %. The acid group included in the acidic dispersant (acidic resin) is preferably a carboxy group. An acid value of the acidic dispersant (acidic resin) is preferably 10 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

It is also preferable that the resin used as a dispersant are a resin including a repeating unit having an ethylenically unsaturated bond-containing group in the side chain. A content of the repeating unit having an ethylenically unsaturated bond-containing group in the side chain is preferably 10 mol % or more, more preferably 10 to 80 mol %, and still more preferably 20 to 70 mol % with respect to the total repeating units of the resin. In addition, as the dispersant, a resin described in JP2018-087939A can also be used.

A content of the resin in the total solid content of the coloring composition is preferably 1% to 60% by mass. The lower limit is preferably 5% by mass or more, more preferably 10% by mass or more, still more preferably 15% by mass or more, and particularly preferably 20% by mass or more. The upper limit is preferably 50% by mass or less and more preferably 40% by mass or less.

A content of the specific resin in the total solid content of the coloring composition is preferably 1% to 60% by mass. The lower limit is preferably 5% by mass or more, more preferably 10% by mass or more, still more preferably 15% by mass or more, and particularly preferably 20% by mass or more. The upper limit is preferably 50% by mass or less and more preferably 40% by mass or less.

In addition, the content of the specific resin in the resins included in the coloring composition is preferably 10% by mass or more, more preferably 20% by mass or more, and still more preferably 30% by mass or more.

In addition, the content of the specific resin is preferably 10 to 100 parts by mass with respect to 100 parts by mass of the pigment. The lower limit is preferably 15 parts by mass or more, more preferably 20 parts by mass or more, and still more preferably 25 parts by mass or more. The upper limit is preferably 60 parts by mass or less, more preferably 45 parts by mass or less, and still more preferably 40 parts by mass or less.

The coloring composition according to the embodiment of the present invention may contain one resin or two or more kinds of resins. In a case of including two or more kinds of resins, it is preferable that the total amount thereof is within the above-described range.

<<Solvent>>

The coloring composition according to the embodiment of the present invention contains a solvent. The solvent is preferably an organic solvent. Examples of the organic solvent include an ester-based solvent, a ketone-based solvent, an alcohol-based solvent, an amide-based solvent, an ether-based solvent, and a hydrocarbon-based solvent. The details of the organic solvent can be found in paragraph No. 0223 of WO2015/166779A, the content of which is incorporated herein by reference. In addition, an ester-based solvent in which a cyclic alkyl group is substituted or a ketone-based solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, 3-pentanone, 4-heptanone, cyclohexanone, 2-methylcyclohexanone, 3-methylcyclohexanone, 4-methylcyclohexanone, cycloheptanone, cyclooctanone, cyclohexyl acetate, cyclopentanone, ethylcarbitol acetate, butylcarbitol acetate, propylene glycol monomethyl ether, propylene glycol monomethyl ether acetate, 3-methoxy-N,N-dimethylpropanamide, 3-butoxy-N,N-dimethylpropanamide, γ-butyrolactone, N-methyl-2-pyrrolidone, propylene glycol diacetate, sulfolane, anisole, 1,4-diacetoxybutane, diethylene glycol monoethyl ether acetate, butane diacetate-1,3-diyl, dipropylene glycol methyl ether acetate, and diacetone alcohol. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

In the present invention, an organic solvent having a low metal content is preferably used. For example, the metal content in the organic solvent is preferably 10 mass parts per billion (ppb) or less. Optionally, an organic solvent having a metal content at a mass parts per trillion (ppt) level may be used. For example, such an organic solvent is available from Toyo Gosei Co., Ltd. (The Chemical Daily, Nov. 13, 2015).

Examples of a method for removing impurities such as a metal from the organic solvent include distillation (such as molecular distillation and thin-film distillation) and filtration using a filter. The filter pore size of the filter used for the filtration is preferably 10 µm or less, more preferably 5 µm or less, and still more preferably 3 µm or less. As a material of the filter, polytetrafluoroethylene, polyethylene, or nylon is preferable.

The organic solvent may include an isomer (a compound having the same number of atoms and a different structure). In addition, only one kind of isomers may be included, or a plurality of isomers may be included.

The organic solvent preferably has the content of peroxides of 0.8 mmol/L or less, and more preferably, the organic solvent does not substantially include peroxides.

A content of the solvent in the coloring composition is preferably 10% to 95% by mass, more preferably 20% to 90% by mass, and still more preferably 30% to 90% by mass.

In addition, from the viewpoint of environmental regulation, it is preferable that the coloring composition according to the embodiment of the present invention does not substantially contain environmentally regulated substances. In the present invention, the description "does not substantially contain environmentally regulated substances" means that the content of the environmentally regulated substances in the coloring composition is 50 ppm by mass or less, preferably 30 ppm by mass or less, still more preferably 10 ppm by mass or less, and particularly preferably 1 ppm by mass or less. Examples of the environmentally regulated substances include benzenes; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent in a case of producing respective components used in the coloring composition, and may be incorporated into the coloring composition as a residual solvent. From the viewpoint of human safety and environmental considerations, it is preferable to reduce these substances as much as possible. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, coloring composition produced by mixing these compounds, or the like.

<<Other Pigment Derivatives>>

The coloring composition according to the embodiment of the present invention can contain a pigment derivative other than the above-described compound S (hereinafter, also referred to as other pigment derivatives). Examples of the other pigment derivatives include a compound having a structure in which an acid group or a basic group is bonded to a coloring agent skeleton. Examples of the coloring agent skeleton constituting the pigment derivative include a quinoline coloring agent skeleton, a benzoimidazolone coloring agent skeleton, a benzoisoindole coloring agent skeleton, a benzothiazole coloring agent skeleton, an iminium coloring agent skeleton, a squarylium coloring agent skeleton, a croconium coloring agent skeleton, an oxonol coloring agent skeleton, a pyrrolopyrrole coloring agent skeleton, a diketopyrrolopyrrole coloring agent skeleton, an azo coloring agent skeleton, a phthalocyanine coloring agent skeleton, a naphthalocyanine coloring agent skeleton, an anthraquinone coloring agent skeleton, a quinacridone coloring agent skeleton, a dioxazine coloring agent skeleton, a perinone coloring agent skeleton, a perylene coloring agent skeleton, a thioindigo coloring agent skeleton, an isoindrin coloring agent skeleton, a isoindolinone coloring agent skeleton, a quinophthalone coloring agent skeleton, a dithiol coloring agent skeleton, a triarylmethane coloring agent skeleton, and a pyrromethene coloring agent skeleton. Examples of the acid group include a sulfo group, a carboxy group, a phosphoric acid group, and a salt thereof. Examples of an atom or atomic group constituting the salts include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion. Examples of the basic group include an amino group, a salt of an ammonium group, and a phthalimidomethyl group. Examples of an atom or atomic group constituting the salts include a hydroxide ion, a halogen ion, a carboxylate ion, a sulfonate ion, and a phenoxide ion.

As the other pigment derivatives, a pigment derivative having excellent visible transparency (hereinafter, also referred to as a transparent pigment derivative) can be contained. The maximum value ($\varepsilon$max) of a molar absorption coefficient of the transparent pigment derivative in a wavelength range of 400 to 700 nm is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less. The lower limit of $\varepsilon$max is, for example, 1 $L \cdot mol^{-1} \cdot cm^{-1}$ or more and may be 10 $L \cdot mol^{-1} \cdot cm^{-1}$ or more.

Specific examples of the other pigment derivatives include compounds described in Example described later and compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, paragraph Nos. 0063 to 0094 of WO2012/102399A, paragraph No. 0082 of WO2017/038252A, paragraph No. 0171 of JP2015-151530A, paragraph Nos. 0162 to 0183 of JP2011-252065A, JP2003-081972A, JP5299151B, JP2015-172732A, JP2014-199308A, JP2014-085562A, JP2014-035351A, and JP2008-081565A.

A content of the other pigment derivatives is preferably 30 parts by mass or less, more preferably 20 parts by mass or less, still more preferably 15 parts by mass or less, and particularly preferably 10 parts by mass or less with respect to 100 parts by mass of the pigment.

In addition, the content of the other pigment derivatives is preferably 0.01 to 100 parts by mass, more preferably 0.1 to 10 parts by mass, and still more preferably 0.2 to 5 parts by mass with respect to 100 parts by mass of the compound S.

In addition, the total content of the other pigment derivatives and the above-described compound S is preferably 1 to 30 parts by mass with respect to 100 parts by mass of the pigment. The lower limit is preferably 2 parts by mass or more and more preferably 3 parts by mass or more. The upper limit is preferably 20 parts by mass or less and more preferably 15 parts by mass or less.

The other pigment derivatives may be used singly or in a combination of two or more kinds thereof. In a case where two or more kinds thereof are used in combination, the total amount thereof is preferably within the above-described range.

<<Infrared Absorber>>

The coloring composition according to the embodiment of the present invention can contain an infrared absorber. For example, in a case of forming an infrared transmitting filter using the coloring composition according to the embodiment of the present invention, by containing an infrared absorber in the coloring composition, a wavelength of light transmitted through a film to be obtained can be shifted to a longer wavelength side. The infrared absorber is preferably a compound having a maximal absorption wavelength on a wavelength side longer than a wavelength of 700 nm. The infrared absorber is preferably a compound having a maximal absorption wavelength in a wavelength range of more than 700 nm and 1800 nm or less. In addition, in the infrared absorber, a ratio $A^1/A^2$, which is a ratio of an absorbance $A^1$ at a wavelength of 500 nm to an absorbance $A^2$ at the maximal absorption wavelength, is preferably 0.08 or less and more preferably 0.04 or less.

Examples of the infrared absorber include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride. Examples of the pyrrolopyrrole compound include compounds described in paragraph Nos. 0016 to 0058 of JP2009-263614A, compounds described in paragraph Nos. 0037 to 0052 of JP2011-068731A, and compounds described in paragraph Nos. 0010 to 0033 of WO2015/166873A. Examples of the squarylium compound include compounds described in paragraph Nos. 0044 to 0049 of JP2011-208101A, compounds described in paragraph Nos. 0060 and 0061 of JP6065169B, compounds described in paragraph No. 0040 of WO2016/181987A, compounds described in JP2015-176046A, compounds described in paragraph No. 0072 of WO2016/190162A, compounds described in paragraph Nos. 0196 to 0228 of JP2016-074649A, compounds described in paragraph No. 0124 of JP2017-067963A, compounds described in WO2017/135359A, compounds described in JP2017-114956A, compounds described in JP6197940B, and compounds described in WO2016/120166A. Examples of the cyanine compound include compounds described in paragraph Nos. 0044 and 0045 of JP2009-108267A, compounds described in paragraph Nos. 0026 to 0030 of JP2002-194040A, compounds described in JP2015-172004A, compounds described in JP2015-172102A, compounds described in JP2008-088426A, compounds described in paragraph No. 0090 of WO2016/190162A, and compounds described in JP2017-031394A. Examples of the croconium compound include compounds described in JP2017-082029A. Examples of the iminium compound include compounds described in JP2008-528706A, compounds described in JP2012-012399A, compounds described in JP2007-092060A, and compounds described in paragraph Nos. 0048 to 0063 of WO2018/043564A. Examples of the phthalocyanine compound include compounds described in paragraph No. 0093 of JP2012-077153A, oxytitanium phthalocyanine described in JP2006-343631A, compounds described in paragraph Nos. 0013 to 0029 of JP2013-195480A, and vanadium phthalocyanine compounds described in JP6081771B. Examples of the naphthalocyanine compound include compounds described in paragraph No. 0093 of JP2012-077153A. Examples of the dithiolene metal complex include compounds described in JP5733804B. Examples of the metal oxide include indium tin oxide, antimony tin oxide, zinc oxide, Al-doped zinc oxide, fluorine-doped tin dioxide, niobium-doped titanium dioxide, and tungsten oxide. The details of tungsten oxide can be found in paragraph Nos. 0080 of JP2016-006476A, the content of which is incorporated herein by reference. Examples of the metal boride include lanthanum boride. Examples of a commercially available product of the lanthanum boride include $LaB_6$—F (manufactured by Japan New Metals Co., Ltd.). In addition, compounds described in WO2017/119394A can also be used as the metal boride. Examples of a commercially available product of indium tin oxide include F-ITO (manufactured by DOWA HIGHTECH CO., LTD.).

In addition, as the infrared absorber, squarylium compounds described in JP2017-197437A, squarylium compounds described in JP2017-025311A, squarylium compounds described in WO2016/154782A, squarylium compounds described in JP5884953B, squarylium compounds described in JP6036689B, squarylium compounds described in JP5810604B, squarylium compounds described in paragraph Nos. 0090 to 0107 of WO2017/213047A, pyrrole ring-containing compounds described in paragraph Nos. 0019 to 0075 of JP2018-054760A, pyrrole ring-containing compounds described in paragraph Nos. 0078 to 0082 of JP2018-040955A, pyrrole ring-containing compounds described in paragraph Nos. 0043 to 0069 of JP2018-002773A, squarylium compounds having an aromatic ring at the α-amide position described in paragraph Nos. 0024 to 0086 of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029, asymmetric compounds described in paragraph Nos. 0027 to 0114 of JP2017-068120A, pyrrole ring-containing compounds (carbazole type) described in JP2017-067963A, phthalocyanine compounds described in JP6251530B, and the like can also be used.

In a case where the coloring composition according to the embodiment of the present invention contains an infrared absorber, a content of the infrared absorber in the total solid content of the coloring composition is preferably 1% to 40% by mass. The lower limit is preferably 2% by mass or more, more preferably 5% by mass or more, and still more preferably 10% by mass or more. The upper limit is preferably 30% by mass or less and more preferably 25% by mass or less. The coloring composition according to the embodiment of the present invention may contain one infrared absorber or two or more kinds of infrared absorbers. In a case of containing two or more kinds of infrared absorbers, it is preferable that the total amount thereof is within the above-described range.

<<Polymerizable Compound>>

The coloring composition according to the embodiment of the present invention can contain a polymerizable compound. As the polymerizable compound, a known compound which is cross-linkable by a radical, an acid, or heat can be used. In the present invention, the polymerizable compound is preferably, for example, a compound having an ethylenically unsaturated bond-containing group. Examples of the ethylenically unsaturated bond-containing group include a vinyl group, a (meth)allyl group, and a (meth)acryloyl group. The polymerizable compound used in the present invention is preferably a radically polymerizable compound.

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more.

The polymerizable compound is preferably a compound including 3 or more ethylenically unsaturated bond-containing groups, more preferably a compound including 3 to 15 ethylenically unsaturated bond-containing groups, and still more preferably a compound including 3 to 6 ethylenically unsaturated bond-containing groups. In addition, the polymerizable compound is preferably a trifunctional to pentadecafunctional (meth)acrylate compound and more preferably a trifunctional to hexafunctional (meth)acrylate compound. Specific examples of the polymerizable compound include compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, and JP6031807B, the contents of which are incorporated herein by reference.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer Company Inc.) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), DPHA-40H (manufactured by Nippon Kayaku Co., Ltd.), UA-306H, UA-306T, UA-3061, AH-600, T-600, AI-600, and LINC-202UA (manufactured by KYOEISHA CHEMICAL Co., LTD.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the polymerizable compound, a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate can also be used. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

In addition, as the polymerizable compound, a compound having an acid group can also be used. By using a polymerizable compound having an acid group, the polymerizable compound in a non-exposed portion is easily removed during development and the generation of a development residue can be suppressed. Examples of the acid group include a carboxy group, a sulfo group, and a phosphoric acid group, and a carboxy group is preferable. Examples of the polymerizable compound having an acid group include succinic acid-modified dipentaerythritol penta(meth)acrylate. Examples of a commercially available product of the polymerizable compound having an acid group include ARONIX M-510, M-520, and ARONIX TO-2349 (manufactured by TOAGOSEI CO., LTD.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

In addition, as the polymerizable compound, a compound having a caprolactone structure can also be used. Examples of a commercially available product of the polymerizable compound having a caprolactone structure include KAYARAD DPCA-20, DPCA-30, DPCA-60, and DPCA-120 (all manufactured by Nippon Kayaku Co., Ltd.).

In addition, as the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a 3-functional to 6-functional (meth)acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having four ethyleneoxy groups, and KAYARAD TPA-330, which is a trifunctional (meth)acrylate having three isobutyleneoxy groups.

In addition, as the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

A content of the polymerizable compound in the total solid content of the coloring composition is preferably 0.1% to 50% by mass. The lower limit is more preferably 0.5% by mass or more and still more preferably 1% by mass or more. The upper limit is more preferably 45% by mass or less and still more preferably 40% by mass or less. The polymerizable compound may be used singly or in a combination of two or more kinds thereof. In a case where two or more kinds thereof are used in combination, the total thereof is preferably within the above-described range.

<<Polymerization Initiator>>

The coloring composition according to the embodiment of the present invention can contain a polymerization initiator. Examples of the polymerization initiator include a photopolymerization initiator and a thermal polymerization initiator, and a photopolymerization initiator is preferable. In addition, the polymerization initiator is preferably a radical polymerization initiator.

Examples of the thermal polymerization initiator include azo compounds such as 2,2'-azobisisobutyronitrile (AIBN), 3-carboxypropionitrile, azobismalononitrile, and dimethyl-(2,2')-azobis(2-methylpropionate), and organic peroxides such as tert-butyl peroxybenzoate, benzoyl peroxide, lauroyl peroxide, and potassium persulfate.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, and an acylphosphine compound is more preferable, and an oxime compound is still more preferable. In addition, as the photopolymerization initiator, compounds described in paragraphs 0065 to 0111 of JP2014-130173A, compounds described in JP6301489B, peroxide-based photopolymerization initiators described in MATERIAL STAGE, p. 37 to 60, vol. 19, No. 3, 2019, photopolymerization initiators described in WO2018/221177A, photopolymerization initiators described in WO2018/110179A, photopolymerization initiators described in JP2019-043864A, and photopolymerization initiators described in JP2019-044030A, the contents of which are incorporated herein by reference.

Examples of a commercially available product of the α-hydroxyketone compound include Omnirad 184, Omnirad 1173, Omnirad 2959, and Omnirad 127 (all of which are manufactured by IGM Resins B.V.), Irgacure 184, Irgacure 1173, Irgacure 2959, and Irgacure 127 (all of which are manufactured by BASF SE). Examples of a commercially available product of the α-aminoketone compound include Omnirad 907, Omnirad 369, Omnirad 369E, and Omnirad 379EG (all of which are manufactured by IGM Resins B.V.), Irgacure 907, Irgacure 369, Irgacure 369E, and Irgacure 379EG (all of which are manufactured by BASF SE). Examples of a commercially available product of the acylphosphine compound include Omnirad 819 and Omnirad TPO (both of which are manufactured by IGM Resins B.V.), Irgacure 819 and Irgacure TPO (both of which are manufactured by BASF SE).

Examples of the oxime compound include the compounds described in JP2001-233842A, the compounds described in JP2000-080068A, the compounds described in JP2006-342166A, the compounds described in J. C. S. Perkin II (1979, pp. 1653 to 1660), the compounds described in J. C. S. Perkin II (1979, pp. 156 to 162), the compounds described in Journal of Photopolymer Science and Technology (1995, pp. 202 to 232), the compounds described in JP2000-066385A, the compounds described in JP2004-534797A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluenesulfonyloxy)iminobutane-2-one, and 2-ethoxycarbonyloxyimino-1-phenylpropane-1-one.

Examples of a commercially available product thereof include Irgacure OXE01, Irgacure OXE02, Irgacure OXE03, and Irgacure OXE04 (all of which are manufactured by BASF SE), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product thereof include ADEKA ARKLS NCI-730, NCI-831, and NCI-930 (all of which are manufactured by ADEKA Corporation).

An oxime compound having a fluorene ring can also be used as the photopolymerization initiator. Specific examples of the oxime compound having a fluorene ring include compounds described in JP2014-137466A.

As the photopolymerization initiator, an oxime compound having a skeleton in which at least one benzene ring of a carbazole ring is a naphthalene ring can also be used. Specific examples of such an oxime compound include the compounds described in WO2013/083505A.

An oxime compound having a fluorine atom can also be used as the photopolymerization initiator. Specific examples of the oxime compound having a fluorine atom include compounds described in JP2010-262028A, Compounds 24 and 36 to 40 described in JP2014-500852A, and Compound (C-3) described in JP2013-164471A.

An oxime compound having a nitro group can be used as the photopolymerization initiator. The oxime compound having a nitro group is also preferably used in the form of a dimer. Specific examples of the oxime compound having a nitro group include a compound described in paragraph Nos. 0031 to 0047 of JP2013-114249A and paragraph Nos. 0008 to 0012 and 0070 to 0079 of JP2014-137466A, a compound described in paragraph Nos. 0007 to 0025 of JP4223071B, and ADEKA ARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

In the present invention, as the photopolymerization initiator, an oxime compound in which a substituent having a hydroxy group is bonded to a carbazole skeleton can also be used. Examples of such a photopolymerization initiator include compounds described in WO2019/088055A.

As the photopolymerization initiator, an oxime compound having an aromatic ring group $Ar^{OX1}$ in which an electron withdrawing group is introduced into an aromatic ring (hereinafter, also referred to as an oxime compound OX) is used can also be used. Examples of the electron withdrawing group included in the above-described aromatic ring group $Ar^{OX1}$ include an acyl group, a nitro group, a trifluoromethyl group, an alkylsulfinyl group, an arylsulfinyl group, an alkylsulfonyl group, an arylsulfonyl group, and a cyano group. Among these, an acyl group or a nitro group is preferable, and from the reason that it is easy to form a film with excellent light resistance, an acyl group is more preferable, and a benzoyl group is still more preferable. The benzoyl group may have a substituent. As the substituent, a halogen atom, a cyano group, a nitro group, a hydroxy group, an alkyl group, an alkoxy group, an aryl group, an aryloxy group, a heterocyclic group, a heterocyclic oxy group, an alkenyl group, an alkylsulfanyl group, an arylsulfanyl group, an acyl group, or an amino group is preferable, an alkyl group, an alkoxy group, an aryl group, an aryloxy group, a heterocyclic oxy group, an alkylsulfanyl group, an arylsulfanyl group, or an amino group is more preferable, and an alkoxy group, an alkylsulfanyl group, or an amino group is still more preferable.

The oxime compound OX is preferably at least one selected from a compound represented by Formula (OX1) or a compound represented by Formula (OX2), and more preferably a compound represented by Formula (OX2).

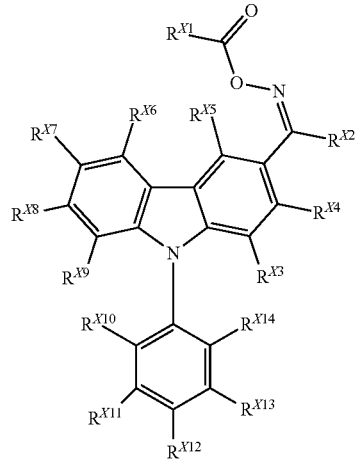

(OX1)

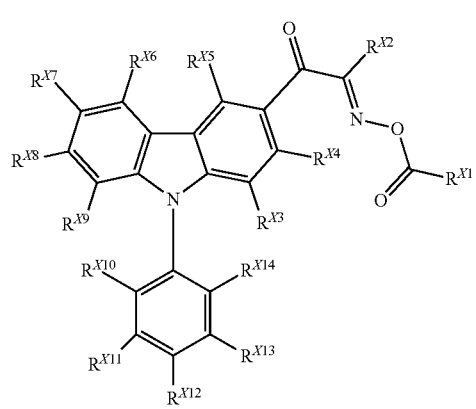

(OX2)

In the formulae, $R^{X1}$ represents an alkyl group, an alkenyl group, an alkoxy group, an aryl group, an aryloxy group, a heterocyclic group, a heterocyclic oxy group, an alkylsulfanyl group, an arylsulfanyl group, an alkylsulfinyl group, an arylsulfinyl group, an alkylsulfonyl group, an arylsulfonyl group, an acyl group, an acyloxy group, an amino group, a phosphinoyl group, a carbamoyl group, or a sulfamoyl group.

$R^{X2}$ represents an alkyl group, an alkenyl group, an alkoxy group, an aryl group, an aryloxy group, a heterocyclic group, a heterocyclic oxy group, an alkylsulfanyl group, an arylsulfanyl group, an alkylsulfinyl group, an arylsulfinyl group, an alkylsulfonyl group, an arylsulfonyl group, an acyloxy group, or an amino group.

$R^{X3}$ to $R^{X14}$ each independently represent a hydrogen atom or a substituent.

At least one of $R^{X10}$, . . . , or $R^{X14}$ is an electron withdrawing group.

In the formulae, it is preferable that $R^{X12}$ is an electron withdrawing group, and $R^{X10}$, $R^{X11}$, $R^{X13}$, and $R^{X14}$ are hydrogen atoms.

Specific examples of the oxime compound OX include compounds described in paragraph Nos. 0083 to 0105 of JP4600600B.

Specific examples of the oxime compound which are preferably used in the present invention are shown below, but the present invention is not limited thereto.

(C-1)
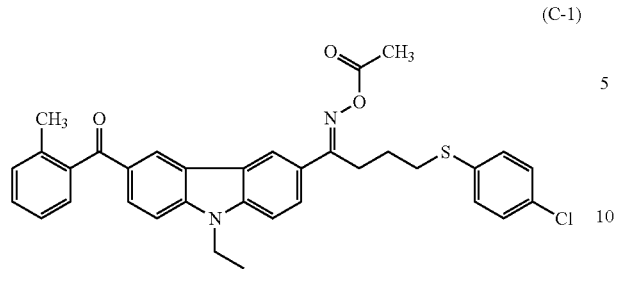
(C-2)
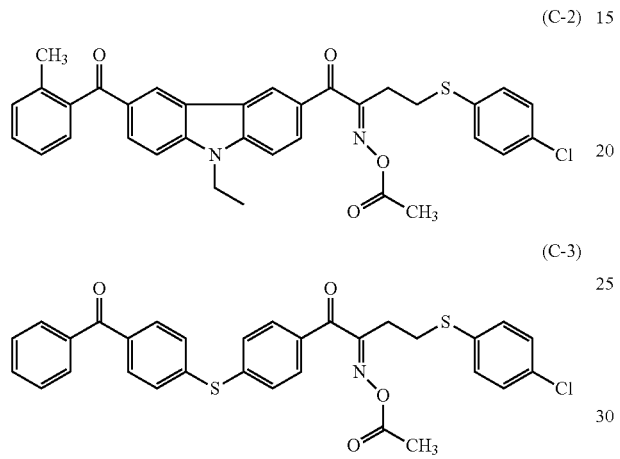
(C-3)
(C-4)
(C-5)
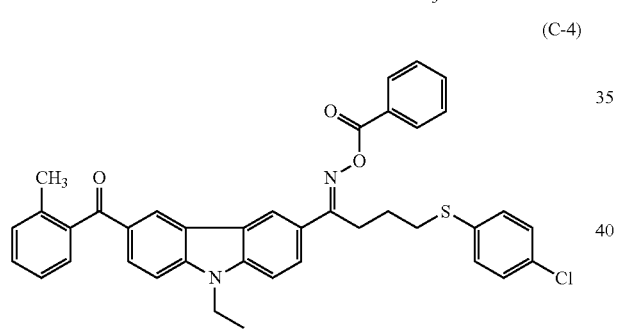
(C-6)
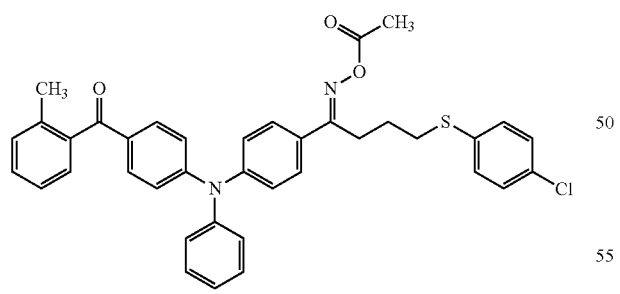
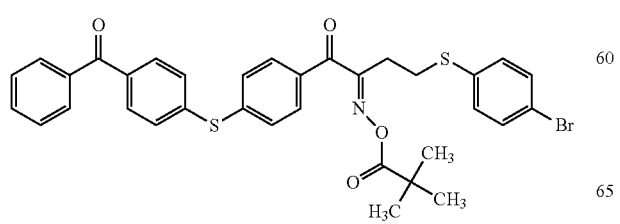
(C-7)
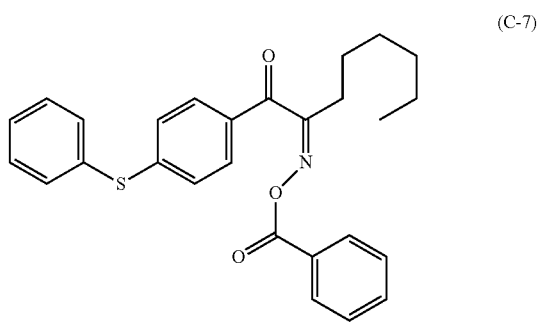
(C-8)
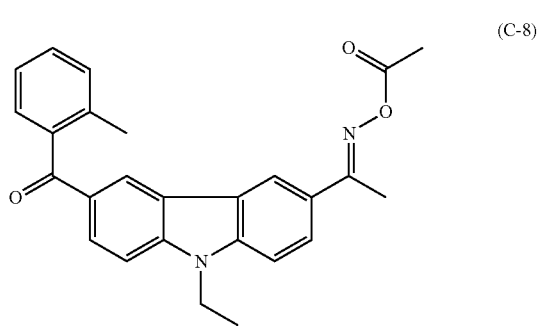
(C-9)
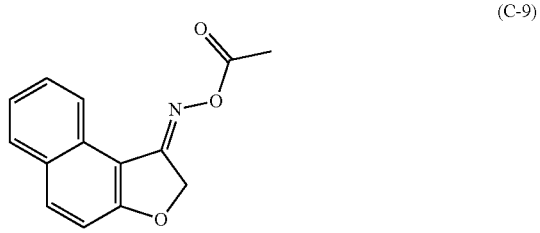
(C-10)
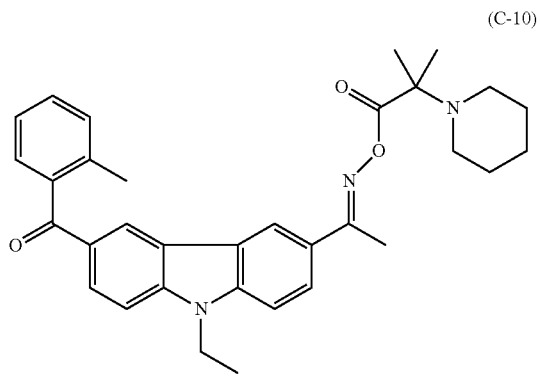
(C-11)
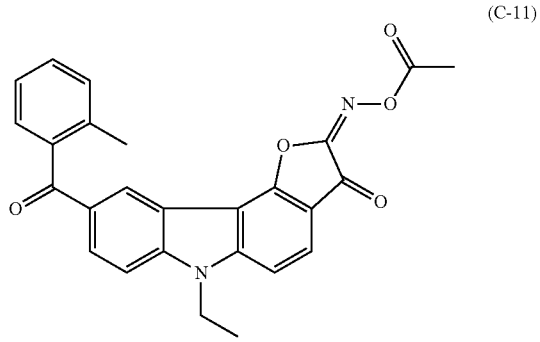

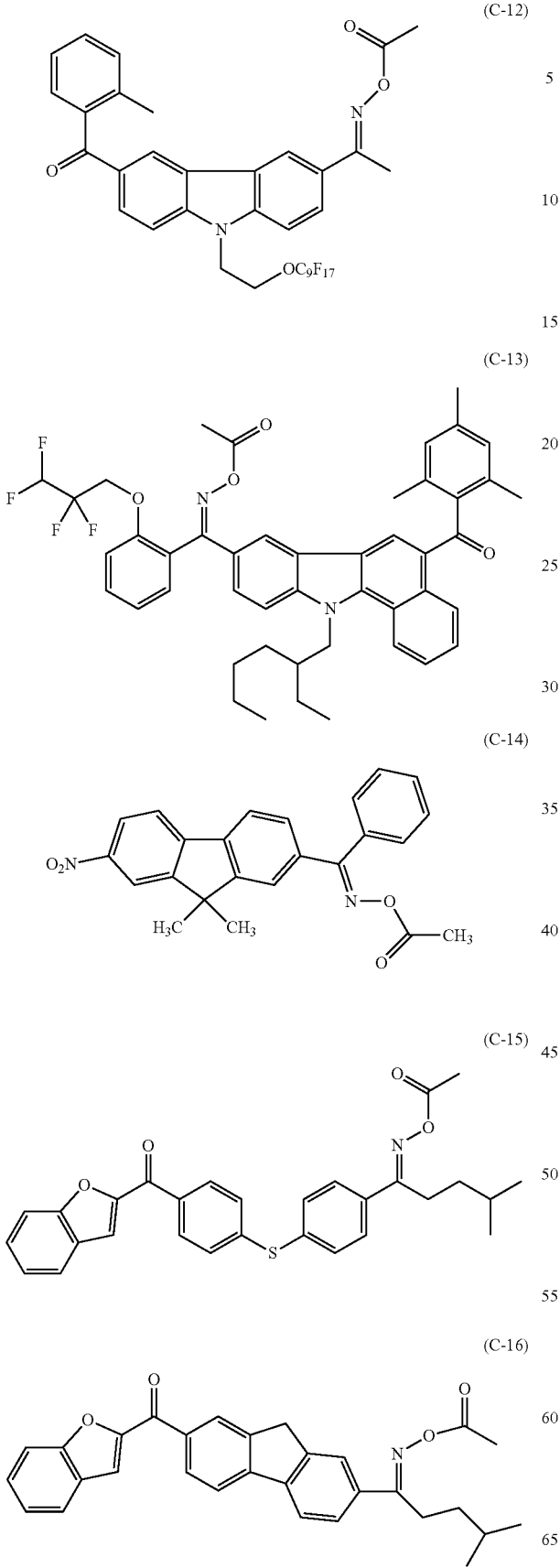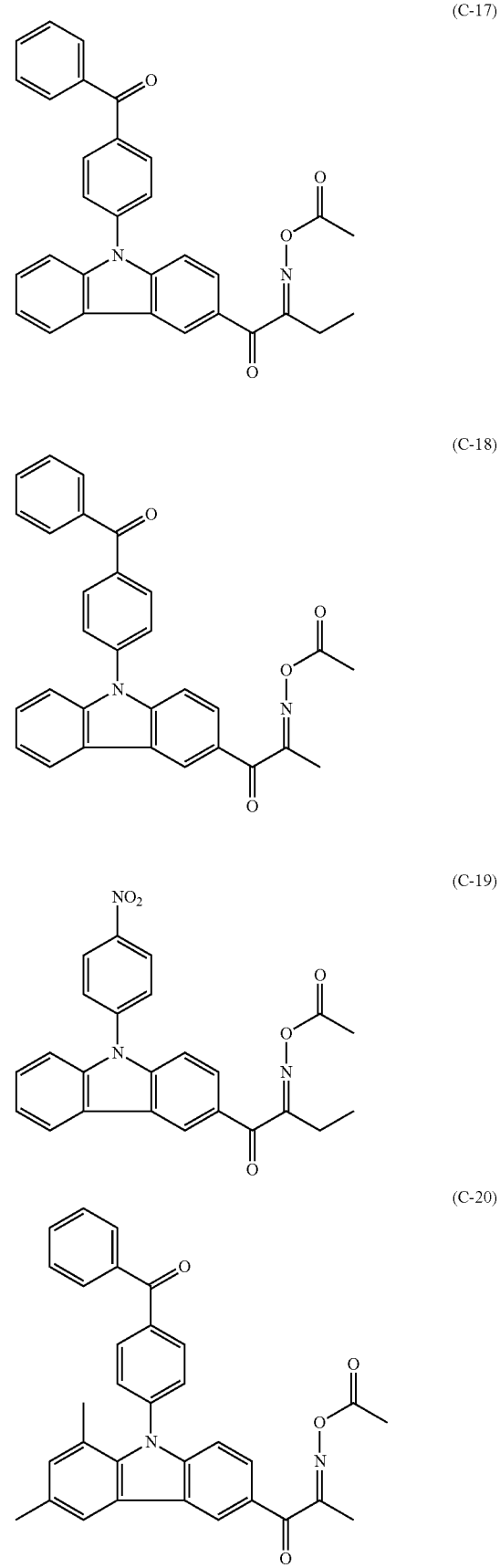

(C-21)
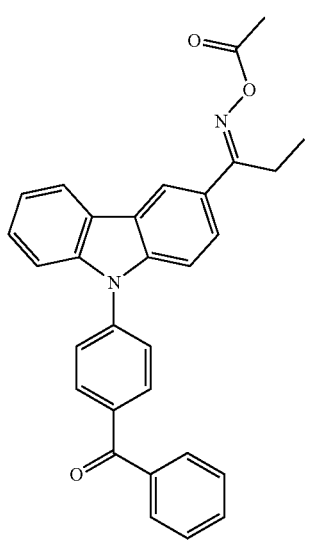
(C-22)
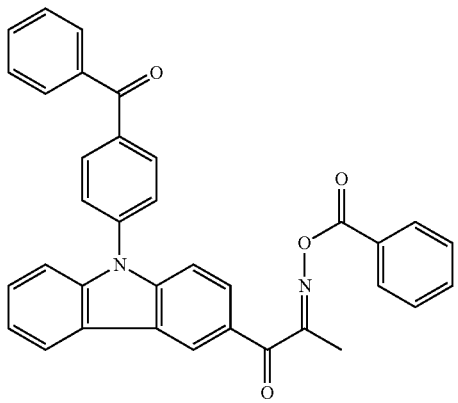
(C-23)
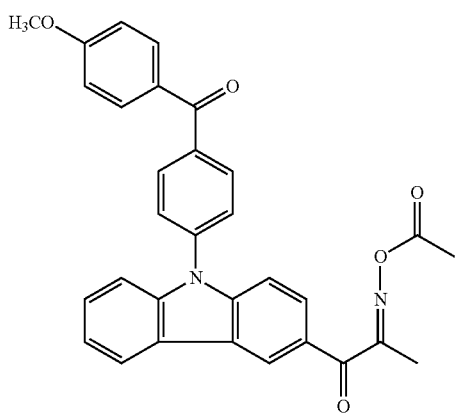
(C-24)
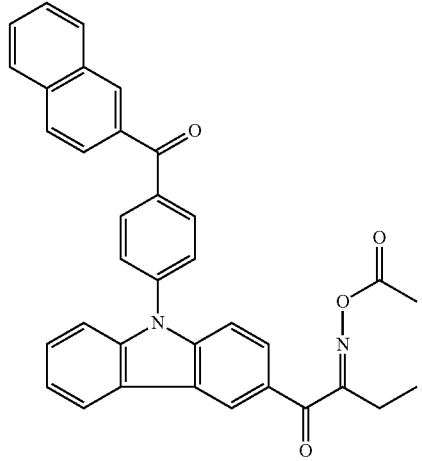
(C-25)
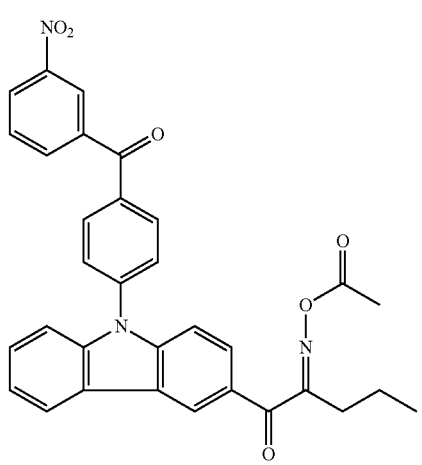
(C-26)
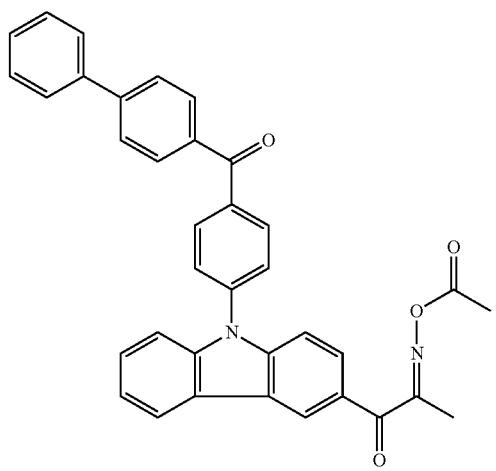

(C-27) 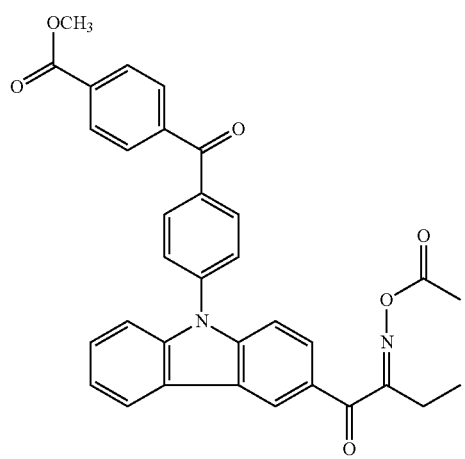
(C-30) 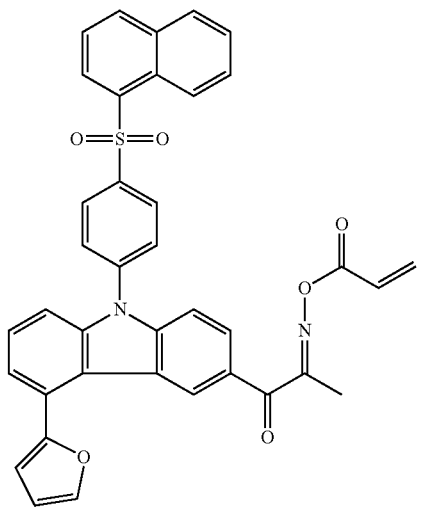
(C-28) 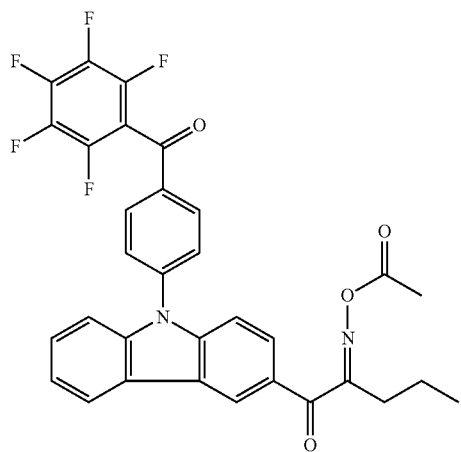
(C-31) 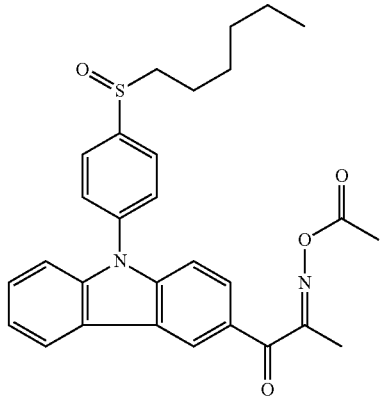
(C-29) 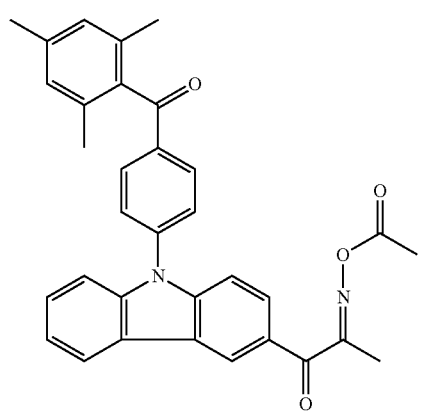
(C-32) 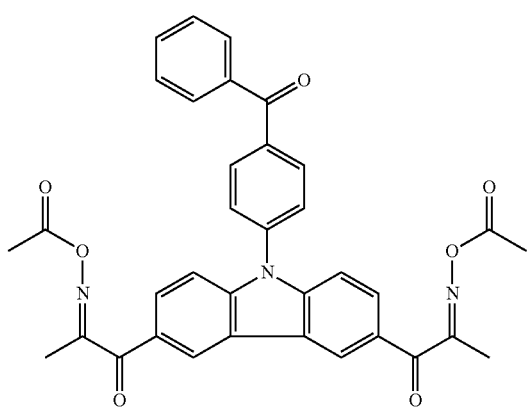

-continued (C-33)

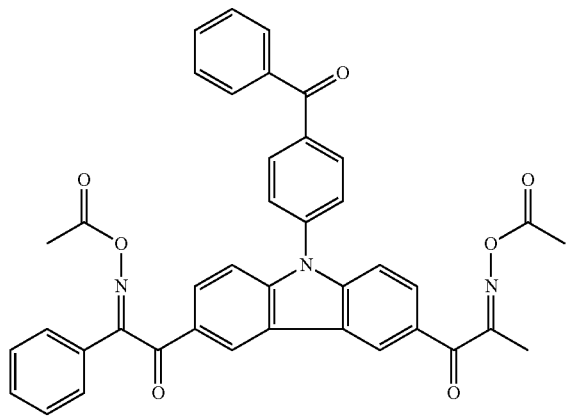

(C-34)

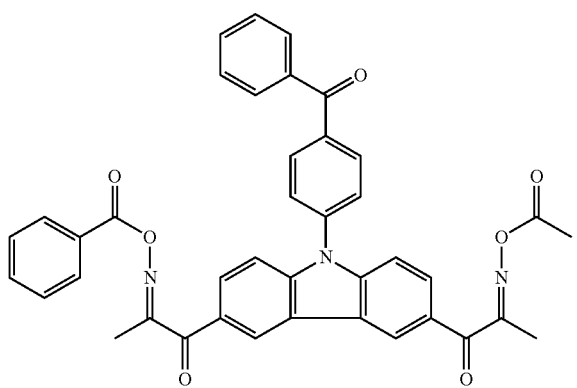

The oxime compound is preferably a compound having a maximal absorption wavelength in a wavelength range of 350 to 500 nm and more preferably a compound having a maximal absorption wavelength in a wavelength range of 360 to 480 nm. In addition, from the viewpoint of sensitivity, a molar absorption coefficient of the oxime compound at a wavelength of 365 nm or 405 nm is preferably high, more preferably 1000 to 300000, still more preferably 2000 to 300000, and particularly preferably 5000 to 200000. The molar absorption coefficient of a compound can be measured using a known method. For example, it is preferable that the molar absorption coefficient can be measured using a spectrophotometer (Cary-5 spectrophotometer, manufactured by Varian Medical Systems, Inc.) and ethyl acetate at a concentration of 0.01 g/L.

As the photopolymerization initiator, it is also preferable to use Irgacure OXE01 (manufactured by BASF SE) and/or Irgacure OXE02 (manufactured by BASF SE) and Omnirad 2959 (manufactured by IGM Resins B.V.) in combination.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the coloring composition can be improved. Specific examples of the bifunctional or tri- or higher functional photoradical polymerization initiator include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A; the compound (E) and compound (G) described in JP2013-522445A; Cmpd 1 to 7 described in WO2016/034963A; the oxime ester photoinitiators described in paragraph No. 0007 of JP2017-523465A; the photoinitiators described in paragraph Nos. 0020 to 0033 of JP2017-167399A; the photopolymerization initiator (A) described in paragraph Nos. 0017 to 0026 of JP2017-151342A; and the oxime ester photoinitiators described in JP6469669B.

A content of the polymerization initiator in the total solid content of the coloring composition is preferably 0.1% to 30% by mass. The lower limit is preferably 0.5% by mass or more and more preferably 1% by mass or more. The upper limit is preferably 20% by mass or less and more preferably 15% by mass or less. In the coloring composition according to the embodiment of the present invention, the polymerization initiator may be used singly or in a combination of two or more kinds thereof. In a case where two or more kinds thereof are used, the total amount thereof is preferably within the above-described range.

<<Compound Having Cyclic Ether Group>>

The coloring composition according to the embodiment of the present invention can contain a compound having a cyclic ether group. Examples of the cyclic ether group include an epoxy group and an oxetanyl group. It is preferable that the compound having a cyclic ether group is a compound having an epoxy group (hereinafter, also referred to as an "epoxy compound"). As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A, and the compounds described in JP2017-179172A can also be used. The contents thereof are incorporated herein by reference.

The epoxy compound may be a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the epoxy compound is preferably 200 to 100000 and more preferably 500 to 50000. The upper limit of the weight-average molecular weight is preferably 10000 or less, more preferably 5000 or less, and still more preferably 3000 or less.

As the epoxy compound, an epoxy resin can be preferably used. Examples of the epoxy resin include an epoxy resin which is a glycidyl etherified product of a phenol compound, an epoxy resin which is a glycidyl etherified product of various novolac resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 to 3300 g/eq, more preferably 310 to 1700 g/eq, and still more preferably 310 to 1000 g/eq.

Examples of a commercially available product of the compound having a cyclic ether group include EHPE 3150 (manufactured by Daicel Corporation), EPICLON N-695

(manufactured by DIC Corporation), and MARPROOF G-0150M, G-0105SA, G-0130SP, G-0250SP, G-1005S, G-1005SA, G-1010S, G-2050M, G-01100, and G-01758 (all of which are manufactured by NOF Corporation., an epoxy group-containing polymer).

A content of the compound having a cyclic ether group in the total solid content of the coloring composition is preferably 0.1% to 20% by mass. The lower limit is, for example, preferably 0.5% by mass or more and more preferably 1% by mass or more. The upper limit is, for example, preferably 15% by mass or less and still more preferably 10% by mass or less. The compound having a cyclic ether group may be used singly or in a combination of two or more kinds thereof. In a case of using two or more kinds thereof, it is preferable that the total content thereof is within the above-described range.

<<Curing Accelerator>>

The coloring composition according to the embodiment of the present invention may contain a curing accelerator. Examples of the curing accelerator include a thiol compound, a methylol compound, an amine compound, a phosphonium salt compound, an amidine salt compound, an amide compound, a base generator, an isocyanate compound, an alkoxysilane compound, and an onium salt compound. Specific examples of the curing accelerator include compounds described in paragraph Nos. 0094 to 0097 of WO2018/056189A, compounds described in paragraph Nos. 0246 to 0253 of JP2015-034963A, compounds described in paragraph Nos. 0186 to 0251 of JP2013-041165A, ionic compounds described in JP2014-055114A, compounds described in paragraph Nos. 0071 to 0080 of JP2012-150180A, alkoxysilane compounds having an epoxy group, described in JP2011-253054A, compounds described in paragraph Nos. 0085 to 0092 of JP5765059B, and carboxy group-containing epoxy curing agent described in JP2017-036379A. A content of the curing accelerator in the total solid content of the coloring composition is preferably 0.3% to 8.9% by mass and more preferably 0.8% to 6.4% by mass.

<<Ultraviolet Absorber>>

The coloring composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, and the like can be used. Examples of such a compound include compounds described in paragraph Nos. 0038 to 0052 of JP2009-217221A, paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Examples of a commercially available product of the ultraviolet absorber include UV-503 (manufactured by Daito Chemical Co., Ltd., conjugated diene compound); TINUVIN 400, TINUVIN 405, TINUVIN 460, TINUVIN 477, and TINUVIN 479 (all manufactured by BASF SE, triazine-based compound); TINUVIN PS, TINUVIN 99-2, TINUVIN 109, TINUVIN 326, TINUVIN 328, TINUVIN 384-2, TINUVIN 900, TINUVIN 928, TINUVIN 171, and TINUVIN 1130 (all manufactured by BASF SE, benzotriazole-based compound); ADEKA STAB LA-31RG (manufactured by Adeka Corporation, benzotriazole compound); Uvinul A, Uvinul 3049, and Uvinul 3050 (all manufactured by BASF SE, benzophenone compound); and Sumisorb 130 (manufactured by Sumika Chemtex Co., Ltd., benzophenone compound). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B can also be used.

A content of the ultraviolet absorber in the total solid content of the coloring composition is preferably 0.01% to 10% by mass and more preferably 0.01% to 5% by mass. In the present invention, the ultraviolet absorber may be used singly or in a combination of two or more kinds thereof. In a case of using two or more kinds thereof, the total amount thereof is preferably within the above-described range.

<<Polymerization Inhibitor>>

The coloring composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, p-methoxyphenol is preferable. A content of the polymerization inhibitor in the total solid content of the coloring composition is preferably 0.0001% to 5% by mass. The polymerization inhibitor may be used singly or in a combination of two or more kinds thereof. In a case of two or more kinds thereof, the total amount thereof is preferably within the above-described range.

<<Silane Coupling Agent>>

The coloring composition according to the embodiment of the present invention can contain a silane coupling agent. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include N-β-aminoethyl-γ-aminopropyl methyldimethoxysilane (trade name: KBM-602, manufactured by Shin-Etsu Chemical Co., Ltd.), N-β-aminoethyl-γ-aminopropyl trimethoxysilane (trade name: KBM-603, manufactured by Shin-Etsu Chemical Co., Ltd.), N-β-aminoethyl-γ-aminopropyl triethoxysilane (trade name: KBE-602, manufactured by Shin-Etsu Chemical Co., Ltd.), γ-aminopropyl trimethoxysilane (trade name: KBM-903, manufactured by Shin-Etsu Chemical Co., Ltd.), γ-aminopropyl triethoxysilane (trade name: KBE-903, manufactured by Shin-Etsu Chemical Co., Ltd.), 3-methacryloxypropylmethyl dimethoxysilane (trade name: KBM-502, manufactured by Shin-Etsu Chemical Co., Ltd.), and 3-methacryloxypropyl trimethoxysilane (trade name: KBM-503, manufactured by Shin-Etsu Chemical Co., Ltd.). In addition, specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference. A content of the silane coupling agent in the total solid content of the coloring composition is preferably 0.01% to 15.0% by mass and more preferably 0.05% to 10.0% by mass. The silane coupling agent may be used singly or in a combination of two or more kinds thereof. In a case of two or more kinds thereof, the total amount thereof is preferably within the above-described range.

<<Surfactant>>

The coloring composition according to the embodiment of the present invention can contain a surfactant. As the surfactant, various surfactants such as a fluorine-based surfactant, a nonionic surfactant, a cationic surfactant, an anionic surfactant, and a silicone-based surfactant can be used. Examples of the surfactant include surfactants described in paragraph Nos. 0238 to 0245 of WO2015/166779A, the contents of which are incorporated herein by reference.

It is preferable that the surfactant is a fluorine-based surfactant. By containing a fluorine-based surfactant in the coloring composition, liquid characteristics (particularly, fluidity) are further improved, and liquid saving property can be further improved. In addition, it is possible to form a film with a small thickness unevenness.

The fluorine content in the fluorine-based surfactant is preferably 3% to 40% by mass, more preferably 5% to 30% by mass, and still more preferably 7% to 25% by mass. The fluorine-based surfactant in which the fluorine content is within the above-described range is effective in terms of the evenness of the thickness of the coating film or liquid saving property and the solubility of the surfactant in the coloring composition is also good.

Examples of the fluorine-based surfactant include surfactants described in paragraph Nos. 0060 to 0064 of JP2014-041318A (paragraph Nos. 0060 to 0064 of the corresponding WO2014/017669A) and the like, surfactants described in paragraph Nos. 0117 to 0132 of JP2011-132503A, and surfactants described in JP2020-008634A, the contents of which are incorporated herein by reference. Examples of a commercially available product of the fluorine-based surfactant include: MEGAFACE F-171, F-172, F-173, F-176, F-177, F-141, F-142, F-143, F-144, F-437, F-475, F-477, F-479, F-482, F-554, F-555-A, F-556, F-557, F-558, F-559, F-560, F-561, F-565, F-563, F-568, F-575, F-780, EXP, MFS-330, R-41, R-41-LM, R-01, R-40, R-40-LM, RS-43, TF-1956, RS-90, R-94, RS-72-K, and DS-21 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); POLYFOX PF636, PF656, PF6320, PF6520, and PF7002 (all of which are manufactured by OMNOVA Solutions Inc.); and FTERGENT 710FM, 610FM, 601AD, 601ADH2, 602A, 215M, and 245F (all of which are manufactured by NEOS COMPANY LIMITED).

In addition, as the fluorine-based surfactant, an acrylic compound, which has a molecular structure having a functional group containing a fluorine atom and in which, by applying heat to the molecular structure, the functional group containing a fluorine atom is broken to volatilize a fluorine atom, can also be suitably used. Examples of such a fluorine-based surfactant include MEGAFACE DS series manufactured by DIC Corporation (The Chemical Daily, Feb. 22, 2016; Nikkei Business Daily, Feb. 23, 2016) such as MEGAFACE DS-21.

In addition, it is also preferable that a polymer of a fluorine atom-containing vinyl ether compound having a fluorinated alkyl group or a fluorinated alkylene ether group, and a hydrophilic vinyl ether compound is used as the fluorine-based surfactant. Examples of such a fluorine-based surfactant include fluorine-based surfactants described in JP2016-216602A, the contents of which are incorporated herein by reference.

A block polymer can also be used as the fluorine-based surfactant. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. In addition, fluorine-containing surfactants described in paragraph Nos. 0016 to 0037 of JP2010-032698A, or the following compounds are also exemplified as the fluorine-based surfactant used in the present invention.

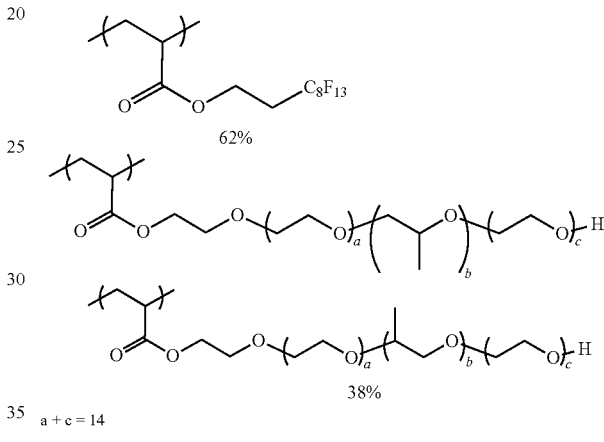

a + c = 14
b = 17

A weight-average molecular weight of the compound is preferably 3000 to 50000 and, for example, 14000. In the compound, "%" representing the proportion of a repeating unit is mol %.

In addition, as the fluorine-based surfactant, a fluorine-containing polymer having an ethylenically unsaturated bond-containing group in the side chain can be used. Specific examples thereof include compounds described in paragraph Nos. 0050 to 0090 and paragraph Nos. 0289 to 0295 of JP2010-164965A, and MEGAFACE RS-101, RS-102, RS-718K, and RS-72-K manufactured by DIC Corporation. In addition, as the fluorine-based surfactant, compounds described in paragraph Nos. 0015 to 0158 of JP2015-117327A can also be used.

Examples of the nonionic surfactant include glycerol, trimethylolpropane, trimethylolethane, an ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrizol Japan Ltd.), NCW-101, NCW-1001, and NCW-1002 (all of which are manufactured by FUJIFILM Wako Pure Chemical Corporation), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6001, and KF-6002 (all of which are manufactured by Shin-Etsu Silicone Co., Ltd.), and BYK307, BYK323, and BYK330 (all of which are manufactured by BYK Chemie).

A content of the surfactant in the total solid content of the coloring composition is preferably 0.001% by mass to 5.0% by mass and more preferably 0.005% to 3.0% by mass. The surfactant may be used singly or in a combination of two or more kinds thereof. In a case of two or more kinds thereof, the total amount thereof is preferably within the above-described range.

<<Antioxidant>>

The coloring composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitably used. In addition, as the antioxidant, compounds described in KR10-2019-0059371A can also be used. A content of the antioxidant in the total solid content of the coloring composition is preferably 0.01% to 20% by mass and more preferably 0.3% to 15% by mass. The antioxidant may be used singly or in combination of two or more kinds thereof. In a case of using two or more kinds thereof, the total amount thereof is preferably within the above-described range.

<<Other Components>>

Optionally, the coloring composition according to the embodiment of the present invention may further contain a sensitizer, a curing accelerator, a filler, a thermal curing accelerator, a plasticizer, and other auxiliary agents (for example, conductive particles, a filling agent, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the coloring composition according to the embodiment of the present invention may contain a potential antioxidant. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid/a base catalyst. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation).

In order to adjust the refractive index of a film to be obtained, the coloring composition according to the embodiment of the present invention may contain a metal oxide. Examples of the metal oxide include $TiO_2$, $ZrO_2$, $Al_2O_3$, and $SiO_2$. A primary particle diameter of the metal oxide is preferably 1 to 100 nm, more preferably 3 to 70 nm, and still more preferably 5 to 50 nm. The metal oxide may have a core-shell structure. In addition, in this case, a core portion may be hollow.

The coloring composition according to the embodiment of the present invention may include a light-resistance improver. Examples of the light-resistance improver include the compounds described in paragraph Nos. 0036 and 0037 of JP2017-198787A, the compounds described in paragraph Nos. 0029 to 0034 of JP2017-146350A, the compounds described in paragraph Nos. 0036 and 0037, and 0049 to 0052 of JP2017-129774A, the compounds described in paragraph Nos. 0031 to 0034 and 0058 and 0059 of JP2017-129674A, the compounds described in paragraph Nos. 0036 and 0037, and 0051 to 0054 of JP2017-122803A, the compounds described in paragraph Nos. 0025 to 0039 of WO2017/164127A, the compounds described in paragraph Nos. 0034 to 0047 of JP2017-186546A, the compounds described in paragraph Nos. 0019 to 0041 of JP2015-025116A, the compounds described in paragraph Nos. 0101 to 0125 of JP2012-145604A, the compounds described in paragraph Nos. 0018 to 0021 of JP2012-103475A, the compounds described in paragraph Nos. 0015 to 0018 of JP2011-257591A, the compounds described in paragraph Nos. 0017 to 0021 of JP2011-191483A, the compounds described in paragraph Nos. 0108 to 0116 of JP2011-145668A, and the compounds described in paragraph Nos. 0103 to 0153 of JP2011-253174A.

From the viewpoint of environmental regulation, the use of perfluoroalkyl sulfonic acid and a salt thereof and use of perfluoroalkyl carboxylic acid and a salt thereof may be restricted. In the coloring composition according to the embodiment of the present invention, in a case of reducing a content of the above-described compounds, the content of the perfluoroalkyl sulfonic acid (particularly, perfluoroalkyl sulfonic acid in which a perfluoroalkyl group has 6 to 8 carbon atoms) and a salt thereof and the perfluoroalkyl carboxylic acid (particularly, perfluoroalkyl carboxylic acid in which a perfluoroalkyl group has 6 to 8 carbon atoms) and a salt thereof is preferably in a range of 0.01 ppb to 1,000 ppb, more preferably 0.05 ppb to 500 ppb, and still more preferably 0.1 ppb to 300 ppb with respect to the total solid content of the coloring composition. The coloring composition according to the embodiment of the present invention may be substantially free of the perfluoroalkyl sulfonic acid and a salt thereof and the perfluoroalkyl carboxylic acid and a salt thereof. For example, by using a compound which can substitute for the perfluoroalkyl sulfonic acid and a salt thereof and the perfluoroalkyl carboxylic acid and a salt thereof, a coloring composition which is substantially free of the perfluoroalkyl sulfonic acid and a salt thereof and the perfluoroalkyl carboxylic acid and a salt thereof may be selected. Examples of the compound which can substitute for the regulated compounds include a compound which is excluded from the regulation due to difference in number of carbon atoms of the perfluoroalkyl group. However, the above-described contents do not prevent the use of perfluoroalkyl sulfonic acid and a salt thereof and use of perfluoroalkyl carboxylic acid and a salt thereof. The coloring composition according to the embodiment of the present invention may include the perfluoroalkyl sulfonic acid and a salt thereof and the perfluoroalkyl carboxylic acid and a salt thereof within the maximum allowable range.

It is also preferable that the coloring composition according to the embodiment of the present invention does not substantially include terephthalic acid ester. Here, the "does not substantially include" means that the content of terephthalic acid ester is 1000 mass ppb or less in the total amount of the coloring composition, and it is more preferable to be 100 mass ppb or less and particularly preferable to be 0.

A moisture content in the coloring composition according to the embodiment of the present invention is usually 3% by mass or less, preferably 0.01% to 1.5% by mass and more preferably in a range of 0.1% to 1.0% by mass. The moisture content can be measured by a Karl Fischer method.

The coloring composition according to the embodiment of the present invention can be used after viscosity is adjusted for the purposes of adjusting the state of a film surface (flatness or the like), adjusting a film thickness, or the like. A value of the viscosity can be appropriately selected as desired, and is, for example, preferably 0.3 mPa·s to 50 mPa·s, and more preferably 0.5 mPa·s to 20 mPa·s at 25° C. As for a method for measuring the viscosity, the viscosity can be measured, for example, with a temperature being adjusted to 25° C., using a cone plate-type viscometer.

<<Storage Container>>

A storage container for the coloring composition is not particularly limited, and a known storage container can be used. In addition, as the storage container, it is also preferable to use a multilayer bottle having an interior wall constituted with six layers from six kinds of resins or a bottle having a 7-layer structure from 6 kinds of resins for the purpose of suppressing infiltration of impurities into raw materials or coloring compositions. Examples of such a container include the containers described in JP2015-123351A. In addition, for the purpose of preventing metal elution from the container interior wall, improving storage stability of the coloring composition, and suppressing the alteration of components, it is also preferable that the container interior wall is formed of glass, stainless steel, or the like.

<Method of Preparing Coloring Composition>

The coloring composition according to the embodiment of the present invention can be prepared by mixing the above-described components with each other. In the preparation of the coloring composition, all the components may be dissolved and/or dispersed at the same time in a solvent to prepare the coloring composition, or the respective components may be appropriately left in two or more solutions or dispersion liquids and mixed to prepare the coloring composition upon use (during coating), as desired.

In addition, in the preparation of the coloring composition, a process of dispersing the pigment is preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling step may be performed. A material, a device, process conditions, and the like used in the salt milling step can be found in, for example, JP2015-194521A and JP2012-046629A.

During the preparation of the coloring composition, it is preferable that the coloring composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE) and polyvinylidene fluoride (PVDF); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including a high-density polypropylene) and nylon are preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY, DFA4201NAEY, DFA4201J006P, and the like), Toyo Roshi Kaisha., Ltd., Nihon Entegris K.K. (formerly Nippon Microlith Co., Ltd.), Kitz Micro Filter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHPX type series (SHPX003 and the like), all manufactured by Roki Techno Co., Ltd. In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and the filtering using the second filter may be performed on a mixture of the dispersion liquid and other components. In addition, the filter can be appropriately selected according to hydrophilicity or hydrophobicity of the coloring composition.

<Film>

A film according to an embodiment of the present invention is a film obtained from the above-described coloring composition according to the embodiment of the present invention. The film according to the embodiment of the present invention can be used for an optical filter such as a color filter or an infrared transmitting filter.

A thickness of the film according to the embodiment of the present invention can be adjusted according to the purpose. For example, the film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

In a case where the film according to the embodiment of the present invention is used as a color filter, the film according to the embodiment of the present invention preferably has a hue of green, red, blue, cyan, magenta, or yellow, and more preferably has a hue of green, red, or yellow. In addition, the film according to the embodiment of the present invention can be preferably used as a colored pixel of a color filter. Examples of the colored pixel include a red pixel, a green pixel, a blue pixel, a magenta pixel, a cyan pixel, and a yellow pixel, and a red pixel, a green pixel, or a yellow pixel is preferable, a red pixel or a green pixel is more preferable, and a green pixel is still more preferable.

In addition, in the film according to the embodiment of the present invention, a wavelength at which a light transmittance is 50% preferably exists in a wavelength range of 470 to 520 nm, more preferably exists in a wavelength range of 475 to 520 nm, and still more preferably exists in a wavelength range of 480 to 520 nm. Among these, the wavelength at which the light transmittance is 50% preferably exists in each wavelength range of 470 to 520 nm and wavelength range of 575 to 625 nm. In this aspect, a wavelength on a short wavelength side, at which the light transmittance is 50%, preferably exists in a wavelength range of 475 to 520 nm, and more preferably exists in a wavelength range of 480 to 520 nm. In addition, a wavelength on a long wavelength side, at which the light transmittance is 50%, preferably exists in a wavelength range of 580 to 620 nm, and more preferably exists in a wavelength range of 585 to 615 nm. A film having such spectral characteristics is preferably used as a green pixel.

In a case where the film according to the embodiment of the present invention is used as an infrared transmitting filter, it is preferable that the film according to the embodiment of the present invention has, for example, any one of the following spectral characteristics (1) to (4).

(1): film in which maximum value of a light transmittance of the film in a thickness direction in a wavelength range of 400 to 640 nm is 20% or less (preferably 15% or less and more preferably 10% or less) and the minimum value of a light transmittance of the film in the thickness direction in a wavelength range of 800 to 1300 nm is 70% or more (preferably 75% or more and more preferably 80% or more). A film having such spectral characteristics can shield light having a wavelength range of 400 to 640 nm, and can transmit light having a wavelength exceeding 700 nm.

(2): film in which the maximum value of a light transmittance of the film in a thickness direction in a wavelength range of 400 to 750 nm is 20% or less (preferably 15% or less and more preferably 10% or less) and the minimum value of a light transmittance of the film in the thickness direction in a wavelength range of 900 to 1300 nm is 70% or more (preferably 75% or more and more preferably 80% or more). A film having such spectral characteristics can shield light having a wavelength range of 400 to 750 nm, and can transmit light having a wavelength exceeding 850 nm.

(3): film in which the maximum value of a light transmittance of the film in a thickness direction in a wavelength range of 400 to 830 nm is 20% or less (preferably 15% or less and more preferably 10% or less) and the minimum value of a light transmittance of the film in the thickness direction in a wavelength range of 1000 to 1300 nm is 70% or more (preferably 75% or more and more preferably 80% or more). A film having such spectral characteristics can shield light having a wavelength range of 400 to 830 nm, and can transmit light having a wavelength exceeding 940 nm.

(4): film in which the maximum value of a light transmittance of the film in a thickness direction in a wavelength range of 400 to 950 nm is 20% or less (preferably 15% or less and more preferably 10% or less) and the minimum value of a light transmittance of the film in the thickness direction in a wavelength range of 1100 to 1300 nm is 70% or more (preferably 75% or more and more preferably 80% or more). A film having such spectral characteristics can shield light having a wavelength range of 400 to 950 nm, and can transmit light having a wavelength exceeding 1040 nm.

<Method for Producing Film>

Next, a method for producing the film according to the embodiment of the present invention will be described. The film according to the embodiment of the present invention can be formed through a step of applying the coloring composition according to the embodiment of the present invention. The method for producing the film preferably further includes a step of forming a pattern (pixel). Examples of a method for forming the pattern (pixel) include a photolithography method and a dry etching method, and a photolithography method is preferable. Since the coloring composition according to the embodiment of the present invention has an excellent exposure latitude, it is particularly excellent in pattern formation by a photolithography method.

Pattern formation by a photolithography method preferably includes a step of forming a coloring composition layer on a support using the coloring composition according to the embodiment of the present invention, a step of exposing the coloring composition layer in a patterned manner, and a step of removing a non-exposed portion of the coloring composition layer by development to form a pattern (pixel). A step (pre-baking step) of baking the coloring composition layer and a step (post-baking step) of baking the developed pattern (pixel) may be provided, optionally.

In the step of forming a coloring composition layer, the coloring composition layer is formed on a support using the coloring composition according to the embodiment of the present invention. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, a base layer may be provided on the silicon substrate so as to improve adhesiveness to an upper layer, prevent the diffusion of materials, or planarize the surface of the substrate. The base layer may be formed of a composition obtained by removing a colorant from the coloring composition described in the present specification, a composition including the curable compound, surfactant, and the like described in the present specification, or the like. A surface contact angle of the base layer is preferably 20° to 70° in a case of being measured with diiodomethane. In addition, the surface contact angle of the base layer is preferably 30° to 80° in a case of being measured with water. In a case where the surface contact angle of the base layer is within the above-described range, coating property of the coloring composition is good. The surface contact angle of the base layer can be adjusted by, for example, adding a surfactant.

As a method of applying the coloring composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprinting method. The application method using an ink jet method is not particularly limited, and examples thereof include a method (in particular, pp. 115 to 133) described in "Extension of Use of Ink Jet— Infinite Possibilities in Patent—" (published in February, 2005, S. B. Research Co., Ltd.) and methods described in JP2003-262716A, JP2003-185831A, JP2003-261827A, JP2012-126830A, and JP2006-169325A. In addition, with regard to the method for applying the coloring composition, reference can be made to the description in WO2017/030174A and WO2017/018419A, the contents of which are incorporated herein by reference.

The coloring composition layer formed on the support may be dried (pre-baked). In a case of producing a film by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 to 300 seconds, more preferably 40 to 250 seconds, and still more preferably 80 to 220 seconds. Pre-baking can be performed using a hot plate, an oven, or the like.

Next, the coloring composition layer is exposed in a patterned manner (exposing step). For example, the coloring composition layer can be exposed in a patterned manner using a stepper exposure device or a scanner exposure device through a mask having a predetermined mask pattern. Thus, the exposed portion can be cured.

Examples of the radiation (light) which can be used during the exposure include g-rays and i-rays. In addition, light (preferably light having a wavelength of 180 to 300 nm) having a wavelength of 300 nm or less can also be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less).

The irradiation amount (exposure amount) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

Next, the non-exposed portion of the coloring composition layer is removed by development to form a pattern (pixel). The non-exposed portion of the coloring composition layer can be removed by development using a developer. As a result, the coloring composition layer of the non-exposed portion in the exposing step is eluted into the developer, and as a result, only a photocured portion remains. The temperature of the developer is preferably, for example, 20° C. to 30° C. The development time is preferably 20 to 180 seconds. In addition, in order to further improve residues removing properties, a step of shaking the developer off per 60 seconds and supplying a new developer may be repeated multiple times.

Examples of the developer include an organic solvent and an alkali developer, and an alkali developer is preferably used. As the alkali developer, an alkaline aqueous solution (alkali developer) in which an alkaline agent is diluted with pure water is preferable. Examples of the alkali agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl)ammonium hydroxide, choline, pyrrole, piperidine, and 1,8-diazabicyclo-[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkaline agent in the alkaline aqueous solution is preferably 0.001% to 10% by mass and more preferably 0.01% to 1% by mass. In addition, the developer may further contain a surfactant. From the viewpoint of transportation, storage, and the like, the developer may be first produced as a concentrated solution and then diluted to a concentration required upon the use. The dilution factor is not particularly limited and, for example, can be set to be in a range of 1.5 to 100 times. In addition, it is also preferable to wash (rinse) with pure water after development. In addition, it is preferable that the rinsing is performed by supplying a rinsing liquid to the coloring composition layer after development while rotating the support on which the coloring composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to carry out an additional exposure treatment or a heating treatment (post-baking) after carrying out drying. The additional exposure treatment or the post-baking is a curing treatment after development in order to complete curing. The heating temperature in the post-baking is preferably, for example, 100° C. to 240° C. and more preferably 200° C. to 240° C. The film after development is post-baked continuously or batch-wise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be carried out by the method described in KR10-2017-0122130A.

Pattern formation by a dry etching method preferably includes a step of forming a coloring composition layer on a support using the coloring composition according to the embodiment of the present invention and curing the entire coloring composition layer to form a cured composition layer, a step of forming a photoresist layer on the cured composition layer, a step of exposing the photoresist layer in a patterned manner and then developing the photoresist layer to form a resist pattern, and a step of dry-etching the cured composition layer through this resist pattern as a mask and using an etching gas. It is preferable that pre-baking treatment is further performed in order to form the photoresist layer. In particular, as the forming process of the photoresist layer, it is desirable that a heating treatment after exposure and a heating treatment after development (post-baking treatment) are performed. The details of the pattern formation by the dry etching method can be found in paragraph Nos. 0010 to 0067 of JP2013-064993A, the content of which is incorporated herein by reference.

<Optical Filter>

An optical filter according to an embodiment of the present invention has the above-described film according to the embodiment of the present invention. Examples of the type of the optical filter include a color filter and an infrared transmitting filter, and a color filter is preferable. As the color filter, it is preferable to have the film according to the embodiment of the present invention as a colored pixel of the color filter.

In the optical filter, a thickness of the film according to the embodiment of the present invention can be appropriately adjusted depending on the purposes. The film thickness is preferably 5 µm or less, more preferably 1 µm or less, and still more preferably 0.6 µm or less. The lower limit of the film thickness is preferably 0.1 µm or more, more preferably 0.2 µm or more, and still more preferably 0.3 µm or more.

A line width of the pixel included in the optical filter is preferably 0.4 to 10.0 µm. The lower limit is preferably 0.4 µm or more, more preferably 0.5 µm or more, and still more preferably 0.6 µm or more. The upper limit is preferably 5.0 µm or less, more preferably 2.0 µm or less, still more preferably 1.0 µm or less, even more preferably 0.9 µm or less, and particularly preferably 0.8 µm or less. In addition, a Young's modulus of the pixel is preferably 0.5 to 20 GPa and more preferably 2.5 to 15 GPa.

Each pixel included in the optical filter preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 50° to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably $10^9$ Ω·cm or more and more preferably $10^{11}$ Ω·cm or more. The upper limit is not specified, but is, for example, preferably $10^{14}$ Ω·cm or less. The volume resistivity value of the pixel can be measured using an ultra-high resistance meter 5410 (manufactured by Advantest Corporation).

In the optical filter, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 to 10 µm and more preferably 0.1 to 5 µm. Examples of a method for forming the protective layer include a method of forming the protective layer by applying a resin composition dissolved in an organic solvent, a chemical vapor deposition method, and a method of attaching a molded resin with an adhesive material. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polyacrylonitrile resin, a cellulose resin, Si, C, W, $Al_2O_3$, Mo, $SiO_2$, and $Si_2N_4$, and two or more kinds of these components may be contained. For example, in a case of a protective layer for oxygen shielding, it is preferable that the protective layer contains a polyol resin, $SiO_2$, and $Si_2N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an ink jet method can be used. As the organic solvent contained in the resin composition, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic fine particles, an absorber of light (for example, ultraviolet rays, near-infrared rays, and the like) having a specific wavelength, a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of light having a specific wavelength, a known absorber can be used. The content of these additives can be appropriately adjusted, but is preferably 0.1% to 70% by mass and still more preferably 1% to 60% by mass with respect to the total mass of the protective layer. In addition, as the protective layer, the protective layers described in paragraph Nos. 0073 to 0092 of JP2017-151176A can also be used.

The optical filter may have a structure in which each pixel is embedded in a space partitioned in, for example, a lattice form by a partition wall.

<Solid-State Imaging Element>

A solid-state imaging element according to an embodiment of the present invention has the film according to the embodiment of the present invention. The configuration of the solid-state imaging element is not particularly limited as long as the solid-state imaging element is configured to include the film according to the embodiment of the present invention and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice shape by a partition wall. The partition wall in this case preferably has a low refractive index for each colored pixel. Examples of an imaging device having such a structure include the devices described in JP2012-227478A, JP2014-179577A, and WO2018/043654A. In addition, as described in JP2019-211559A, an ultraviolet absorbing layer may be provided in the structure of the solid-state imaging element to improve light resistance. An imaging device including the solid-state imaging element according to the embodiment of the present invention can also be used as a vehicle camera or a surveillance camera, in addition to a digital camera or electronic apparatus (mobile phones or the like) having an imaging function.

<Image Display Device>

An image display device according to an embodiment of the present invention has the film according to the embodiment of the present invention. Examples of the image display device include a liquid crystal display device or an organic electroluminescent display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinafter, the present invention will be described in detail using Examples. Materials, used amounts, proportions, treatment details, treatment procedures, and the like shown in the following examples can be appropriately changed within a range not departing from the scope of the present invention. Accordingly, the scope of the present invention is not limited to the following specific examples.

Synthesis Example of Compound S (Synthesis Example 1) Synthesis of Compound (S-1)

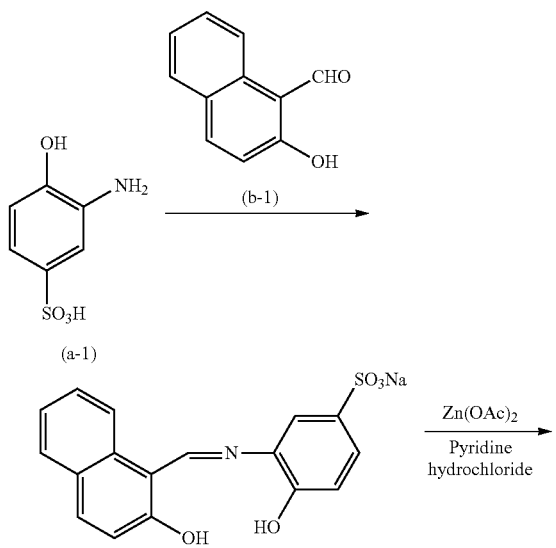

-continued

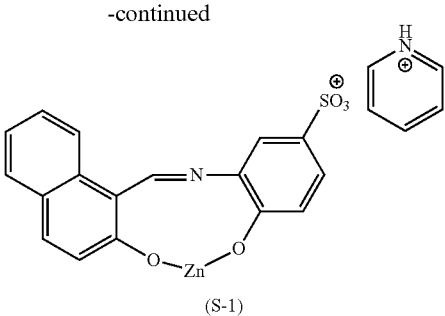

(S-1)

19 parts by mass of a compound (a-1), 8.0 parts by mass of sodium hydroxide, and 400 parts by mass of methanol were mixed and stirred at room temperature for 1 hour. Next, 17 parts by mass of a compound (b-1) and 18 parts by mass of acetic acid were added thereto, and the mixture was heated and stirred at an outside temperature of 70° C. for 5 hours. Next, 22 parts by mass of zinc acetate $(Zn(OAc)_2)$ was added thereto, and the mixture was heated and stirred at 70° C. for 12 hours. After allowing to cool, the precipitated solid was collected by filtration. 15 parts by mass of pyridine hydrochloride and 400 parts by mass of methanol were mixed with the obtained solid, the mixture was heated and stirred at an outside temperature of 70° C. for 5 hours. The obtained solid was washed with methanol. The obtained solid was dried under reduced pressure at 60° C. to obtain 45 parts by mass of a compound (S-1). A value of (M—H) (nega) in mass spectrum of the obtained compound (S-1) was 404, and a peak of pyridine corresponding to a pyridinium ion was confirmed by a gas chromatography measurement.

(Synthesis Examples 2 to 18) Synthesis of Compounds (S-2) to (S-18)

Compounds (S-2) to (S-18) were obtained by performing the same operation as in Synthesis Example 1, except that the compound (a-1), the compound (b-1), the metal salt, and the hydrochloride were changed to the types and charged amounts shown in Table 1. In a case where the obtained compounds (S-2) to (S-18) were subjected to the gas chromatography measurement in the same manner as in the compound (S-1), a peak of each cation source was detected for the compounds (S-2) to (S-18).

TABLE 1

| Synthesis Example | Compound | Compound (a) | | Compound (b) | | Metal salt | | Hydrochloride | |
|---|---|---|---|---|---|---|---|---|---|
| | | Type | Addition amount (part by mass) | Type | Addition amount (part by mass) | Type | Addition amount (part by mass) | Type | Addition amount (part by mass) |
| Synthesis Example 1 | S-1 | a-1 | 19 | b-1 | 17 | m-1 | 22 | c-1 | 15 |
| Synthesis Example 2 | S-2 | a-1 | 19 | b-1 | 17 | m-2 | 18 | c-1 | 15 |
| Synthesis Example 3 | S-3 | a-1 | 19 | b-1 | 17 | m-3 | 18 | c-1 | 15 |
| Synthesis Example 4 | S-4 | a-2 | 32 | b-1 | 17 | m-2 | 18 | c-1 | 15 |
| Synthesis Example 5 | S-5 | a-3 | 19 | b-2 | 12 | m-2 | 18 | c-2 | 15 |
| Synthesis Example 6 | S-6 | a-4 | 19 | b-1 | 17 | m-2 | 18 | c-1 | 15 |
| Synthesis Example 7 | S-7 | a-5 | 19 | b-1 | 17 | m-2 | 18 | c-1 | 15 |
| Synthesis Example 8 | S-8 | a-6 | 32 | b-1 | 17 | m-2 | 18 | c-3 | 12 |
| Synthesis Example 9 | S-9 | a-7 | 11 | b-3 | 25 | m-2 | 18 | c-1 | 15 |
| Synthesis Example 10 | S-10 | a-8 | 19 | b-1 | 17 | m-2 | 18 | c-1 | 15 |
| Synthesis Example 11 | S-11 | a-7 | 11 | b-4 | 25 | m-2 | 18 | c-1 | 15 |
| Synthesis Example 12 | S-12 | a-7 | 11 | b-5 | 38 | m-2 | 18 | c-1 | 15 |
| Synthesis Example 13 | S-13 | a-9 | 24 | b-1 | 17 | m-2 | 18 | c-1 | 15 |
| Synthesis Example 14 | S-14 | a-10 | 27 | b-1 | 17 | m-2 | 18 | c-1 | 15 |
| Synthesis Example 15 | S-15 | a-7 | 11 | b-6 | 28 | m-2 | 18 | c-1 | 15 |
| Synthesis Example 16 | S-16 | a-11 | 16 | b-7 | 20 | m-2 | 18 | c-1 | 15 |
| Synthesis Example 17 | S-17 | a-1 | 19 | b-1 | 17 | — | — | c-1 | 15 |
| Synthesis Example 18 | S-18 | a-7 | 11 | b-3 | 25 | — | — | c-1 | 15 |

The compounds (a-1) to (a-11) and the compounds (b-1) to (b-7) are compounds having the structures shown below, respectively. In addition, the metal salt (m-1) is zinc acetate, the metal salt (m-2) is copper acetate, and the metal salt (m-3) is iron acetate; and the hydrochloride (c-1) is pyridine hydrochloride, the hydrochloride (c-2) is imidazole hydrochloride, and the hydrochloride (c-3) is trimethylamine hydrochloride.

(a-1)
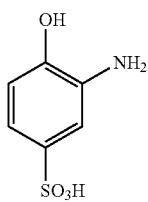

(a-2)
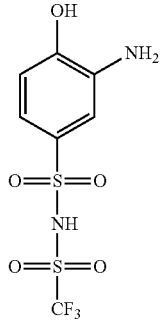

(a-3)
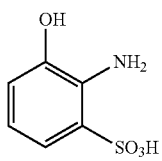

(a-4)
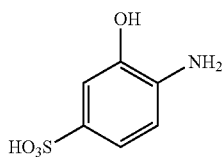

(a-5)
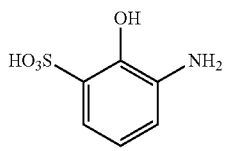

(a-6)
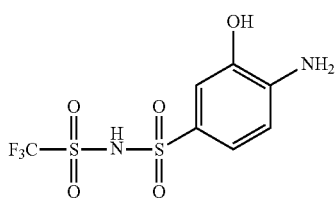

(a-7)
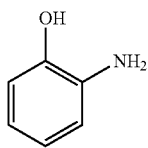

(a-8)
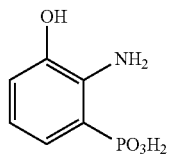

(a-9)
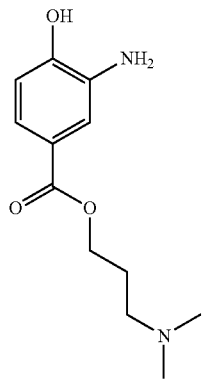

(a-10)
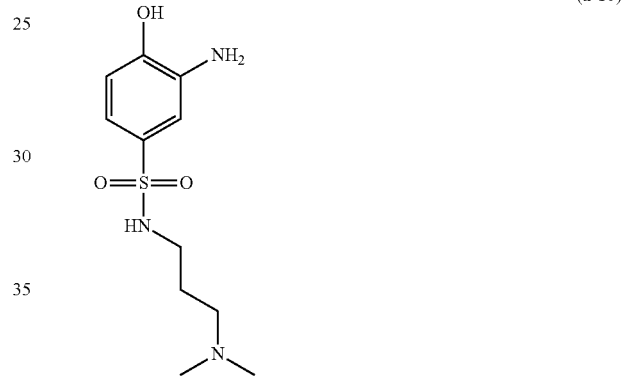

(a-11)
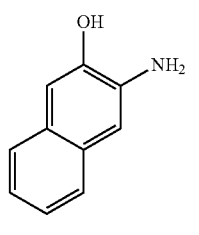

(b-1)
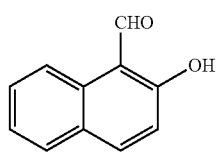

(b-2)

(b-3)
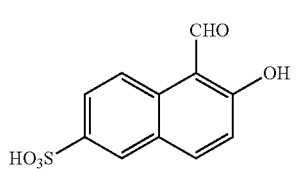

-continued

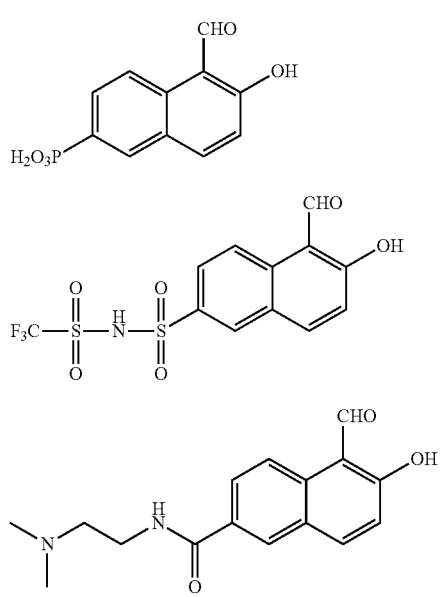

(Synthesis Example 19) Synthesis of Compound (S-19)

10 parts by mass of the compound (S-1) obtained in Synthesis Example 1 was dissolved in 100 parts by mass of ion exchange water, and this solution was passed through a column filled with 1000 parts by mass of an ion exchange resin (Amberlite IR120B, manufactured by ORGANO) over 1 hour. The obtained solution was concentrated with an evaporator and further dried under reduced pressure at 60° C. to obtain 3 parts by mass of a compound (S-19). A value of (M—H) (nega) in mass spectrum of the compound (S-19) was 404, and it was confirmed by a gas chromatography measurement that a peak of pyridine corresponding to a pyridinium ion disappeared.

(Synthesis Example 20) Synthesis of Compound (S-20)

A compound (S-20) was obtained by the same operation as in Synthesis Example 19, except that the compound (S-1) of Synthesis Example 19 was changed to the compound (S-4). In the gas chromatography measurement of the compound (S-20), and it was confirmed that a peak of pyridine corresponding to a pyridinium ion disappeared.

Structural formulae and measurement results of mass spectrometry (M—H (nega)) of the compounds (S-1) to (S-20) are shown below. In the following structural formulae, the nitrogen atom is not coordinated to the metal atom, but the nitrogen atom may be coordinated to the metal atom depending on the state of the metal atom.

-continued
(S-7)
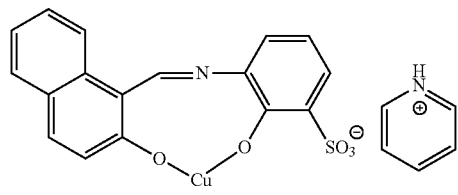
(S-8)
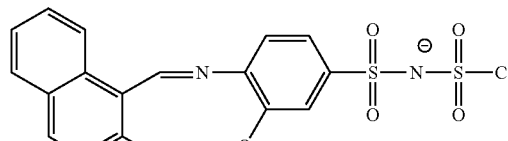
(S-9)
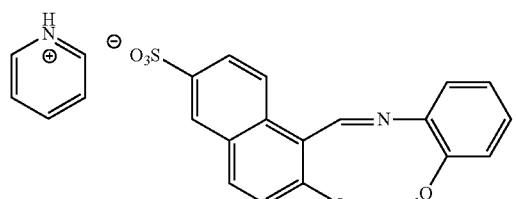
(S-10)
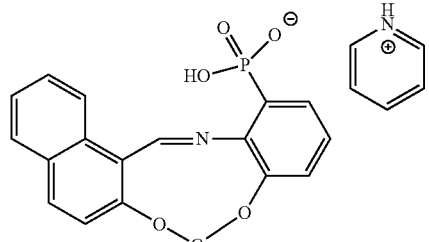
(S-11)
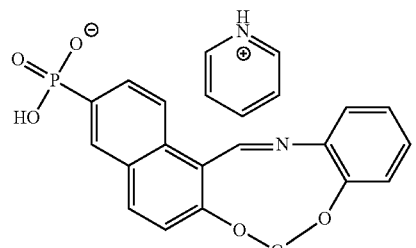
(S-12)
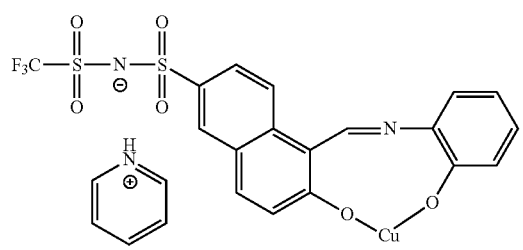
-continued
(S-13)
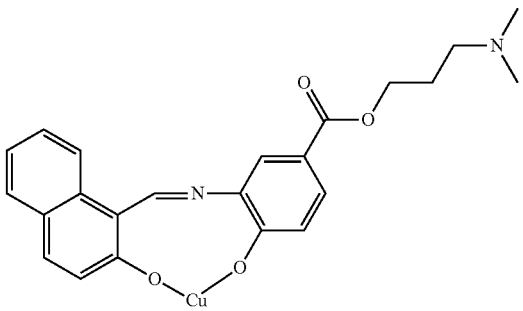
(S-14)
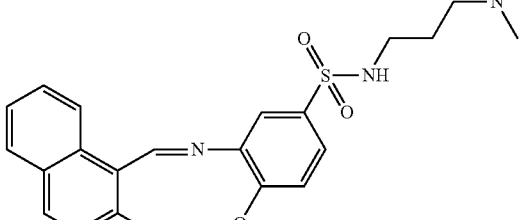
(S-15)
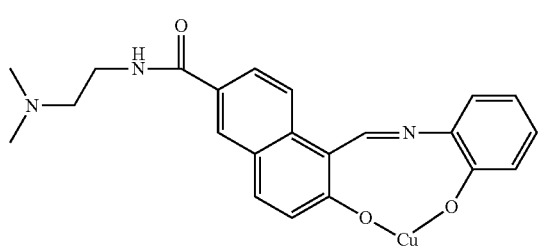
(S-16)
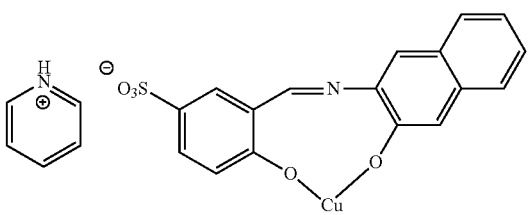
(S-17)
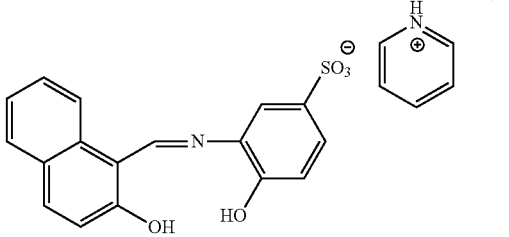
(S-18)

-continued

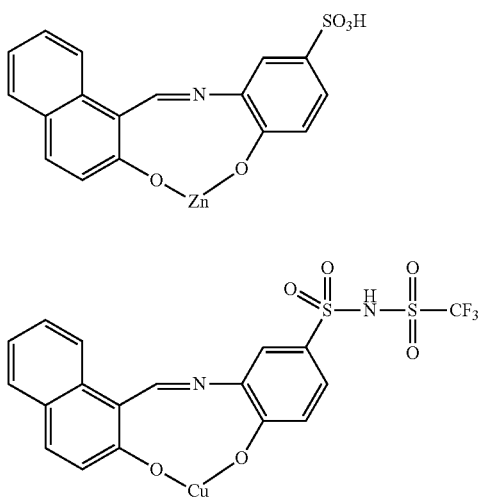

(S-19)

(S-20)

TABLE 2

| Compound | Results of mass spectrometry (M - H (nega)) |
|---|---|
| S-1 | 404 |
| S-2 | 403 |
| S-3 | 396 |
| S-4 | 534 |
| S-5 | 353 |

TABLE 2-continued

| Compound | Results of mass spectrometry (M - H (nega)) |
|---|---|
| S-6 | 403 |
| S-7 | 403 |
| S-8 | 534 |
| S-9 | 403 |
| S-10 | 403 |
| S-11 | 403 |
| S-12 | 534 |
| S-13 | 452 |
| S-14 | 487 |
| S-15 | 437 |
| S-16 | 403 |
| S-17 | 342 |
| S-18 | 342 |
| S-19 | 404 |
| S-20 | 534 |

<Production of Dispersion Liquid>

A mixed solution obtained by mixing raw materials shown in the following tables was mixed and dispersed for 3 hours using a beads mill (zirconia beads having a diameter of 0.1 mm). Next, using a high-pressure disperser NANO-3000-10 (manufactured by Nippon BEE Chemical Co., Ltd.) equipped with a pressure reducing mechanism, the dispersion liquid was dispersed under a pressure of 2000 kg/cm$^2$ at a flow rate of 500 g/min. The dispersion treatment was repeated a total of 10 times to obtain a dispersion liquid. The numerical values indicating the addition amount shown in the following tables indicate parts by mass. The numerical value of the addition amount of the dispersant is a numerical value expressed in terms of solid contents.

TABLE 3

| | Pigment | | Dispersant | | Specific compound | | Solvent | | Proportion with respect to pigment | |
|---|---|---|---|---|---|---|---|---|---|---|
| Dispersion liquid | Type | Addition amount (part by mass) | Type | Addition amount (part by mass) | Type | Addition amount (part by mass) | Type | Addition amount (part by mass) | Dispersant (% by mass) | Specific compound (% by mass) |
| (D-1) | PY129 | 90 | B-5 | 30 | S-1 | 20 | PGMEA | 700 | 33 | 22 |
| (D-2) | PY129 | 90 | B-5 | 30 | S-2 | 20 | PGMEA | 700 | 33 | 22 |
| (D-3) | PY129 | 90 | B-5 | 30 | S-3 | 20 | PGMEA | 700 | 33 | 22 |
| (D-4) | PY129 | 90 | B-5 | 30 | S-4 | 20 | PGMEA | 700 | 33 | 22 |
| (D-5) | PY129 | 90 | B-5 | 30 | S-5 | 20 | PGMEA | 700 | 33 | 22 |
| (D-6) | PY129 | 90 | B-5 | 30 | S-6 | 20 | PGMEA | 700 | 33 | 22 |
| (D-7) | PY129 | 90 | B-5 | 30 | S-7 | 20 | PGMEA | 700 | 33 | 22 |
| (D-8) | PY129 | 90 | B-5 | 30 | S-8 | 20 | PGMEA | 700 | 33 | 22 |
| (D-9) | PY129 | 90 | B-5 | 30 | S-9 | 20 | PGMEA | 700 | 33 | 22 |
| (D-10) | PY129 | 90 | B-5 | 30 | S-10 | 20 | PGMEA | 700 | 33 | 22 |
| (D-11) | PY129 | 90 | B-5 | 30 | S-11 | 20 | PGMEA | 700 | 33 | 22 |
| (D-12) | PY129 | 90 | B-5 | 30 | S-12 | 20 | PGMEA | 700 | 33 | 22 |
| (D-13) | PY129 | 90 | B-1 | 30 | S-13 | 20 | PGMEA | 700 | 33 | 22 |
| (D-14) | PY129 | 90 | B-1 | 30 | S-14 | 20 | PGMEA | 700 | 33 | 22 |
| (D-15) | PY129 | 90 | B-1 | 30 | S-15 | 20 | PGMEA | 700 | 33 | 22 |
| (D-16) | PY129 | 90 | B-1 | 30 | S-16 | 20 | PGMEA | 700 | 33 | 22 |
| (D-17) | PY129 | 90 | B-5 | 30 | S-17 | 20 | PGMEA | 700 | 33 | 22 |
| (D-18) | PY129 | 90 | B-5 | 30 | S-18 | 20 | PGMEA | 700 | 33 | 22 |
| (D-19) | PY129 | 90 | B-5 | 30 | S-19 | 20 | PGMEA | 700 | 33 | 22 |
| (D-20) | PY129 | 90 | B-5 | 30 | S-20 | 20 | PGMEA | 700 | 33 | 22 |
| (D-21) | PY129 | 90 | B-2 | 30 | S-13 | 20 | PGMEA | 700 | 33 | 22 |
| (D-22) | PY129 | 90 | B-3 | 30 | S-13 | 20 | PGMEA | 700 | 33 | 22 |
| (D-23) | PY129 | 90 | B-4 | 30 | S-13 | 20 | PGMEA | 700 | 33 | 22 |
| (D-24) | PY129 | 90 | B-6 | 30 | S-13 | 20 | PGMEA | 700 | 33 | 22 |
| (D-25) | PY129 | 90 | B-10 | 30 | S-13 | 20 | PGMEA | 700 | 33 | 22 |
| (D-26) | PY129 | 90 | B-11 | 30 | S-13 | 20 | PGMEA | 700 | 33 | 22 |
| (D-27) | PY129 | 90 | B-12 | 30 | S-13 | 20 | PGMEA | 700 | 33 | 22 |
| (D-28) | PY129 | 90 | B-13 | 30 | S-13 | 20 | PGMEA | 700 | 33 | 22 |
| (D-29) | PY129 | 90 | B-7 | 30 | S-1 | 20 | PGMEA | 700 | 33 | 22 |
| (D-30) | PY129 | 90 | B-8 | 30 | S-1 | 20 | PGMEA | 700 | 33 | 22 |

TABLE 4

| Dispersion liquid | Pigment Type | Pigment Addition amount (part by mass) | Dispersant Type | Dispersant Addition amount (part by mass) | Specific compound Type | Specific compound Addition amount (part by mass) | Solvent Type | Solvent Addition amount (part by mass) | Proportion with respect to pigment Dispersant (% by mass) | Proportion with respect to pigment Specific compound (% by mass) |
|---|---|---|---|---|---|---|---|---|---|---|
| (D-31) | PY129 | 90 | B-9 | 30 | S-1 | 20 | PGMEA | 700 | 33 | 22 |
| (D-32) | PY117 | 90 | B-5 | 30 | S-1 | 20 | PGMEA | 700 | 33 | 22 |
| (D-33) | PY138 | 90 | B-5 | 30 | S-1 | 20 | PGMEA | 700 | 33 | 22 |
| (D-34) | PY139 | 90 | B-5 | 30 | S-1 | 20 | PGMEA | 700 | 33 | 22 |
| (D-35) | PY150 | 90 | B-5 | 30 | S-1 | 20 | PGMEA | 700 | 33 | 22 |
| (D-36) | PY185 | 90 | B-5 | 30 | S-1 | 20 | PGMEA | 700 | 33 | 22 |
| (D-37) | Y-1 | 90 | B-5 | 30 | S-1 | 20 | PGMEA | 700 | 33 | 22 |
| (D-38) | Y-2 | 90 | B-5 | 30 | S-1 | 20 | PGMEA | 700 | 33 | 22 |
| (D-39) | Y-3 | 90 | B-5 | 30 | S-1 | 20 | PGMEA | 700 | 33 | 22 |
| (D-40) | PG7 | 90 | B-5 | 30 | S-1 | 20 | PGMEA | 700 | 33 | 22 |
| (D-41) | PG36 | 90 | B-5 | 30 | S-1 | 20 | PGMEA | 700 | 33 | 22 |
| (D-42) | PG58 | 90 | B-5 | 30 | S-1 | 20 | PGMEA | 700 | 33 | 22 |
| (D-43) | PG59 | 90 | B-5 | 30 | S-1 | 20 | PGMEA | 700 | 33 | 22 |
| (D-44) | PG62 | 90 | B-5 | 30 | S-1 | 20 | PGMEA | 700 | 33 | 22 |
| (D-45) | PG63 | 90 | B-5 | 30 | S-1 | 20 | PGMEA | 700 | 33 | 22 |
| (D-46) | PR254 | 90 | B-5 | 30 | S-1 | 20 | PGMEA | 700 | 33 | 22 |
| (D-47) | PR264 | 90 | B-5 | 30 | S-1 | 20 | PGMEA | 700 | 33 | 22 |
| (D-48) | PR272 | 90 | B-5 | 30 | S-1 | 20 | PGMEA | 700 | 33 | 22 |
| (D-49) | PR122 | 90 | B-5 | 30 | S-1 | 20 | PGMEA | 700 | 33 | 22 |
| (D-50) | PG38/PY185 (mass ratio 70/30) | 90 | B-5 | 30 | S-1 | 20 | PGMEA | 700 | 33 | 22 |
| (D-51) | PG36/PY139/PY129 (mass ratio 70/20/10) | 90 | B-5 | 30 | S-1 | 20 | PGMEA | 700 | 33 | 22 |
| (D-52) | PG58/Y-1 (mass ratio 80/20) | 90 | B-5 | 30 | S-1 | 20 | PGMEA | 700 | 33 | 22 |
| (D-53) | PR254/PY139 (mass ratio 80/20) | 90 | B-5 | 30 | S-1 | 20 | PGMEA | 700 | 33 | 22 |

TABLE 5

| Dispersion liquid | Pigment Type | Pigment Addition amount (part by mass) | Dispersant Type | Dispersant Addition amount (part by mass) | Specific compound Type | Specific compound Addition amount (part by mass) | Solvent Type | Solvent Addition amount (part by mass) | Proportion with respect to pigment Dispersant (% by mass) | Proportion with respect to pigment Specific compound (% by mass) |
|---|---|---|---|---|---|---|---|---|---|---|
| (D-54) | PY129 | 90 | B-5 | 30 | S-2/S-6/S-9 (mass ratio 25/25/50) | 20 | PGMEA | 700 | 33 | 22 |
| (D-55) | PY129 | 90 | B-5 | 30 | S-13/SD-1 (mass ratio 50/50) | 20 | PGMEA | 700 | 33 | 22 |
| (D-56) | PY129 | 90 | B-5 | 30 | S-14/SD-2 (mass ratio 80/20) | 20 | PGMEA | 700 | 33 | 22 |
| (D-57) | PY129 | 90 | B-5 | 30 | S-2/SH-1 (mass ratio 50/50) | 20 | PGMEA | 700 | 33 | 22 |
| (D-58) | PY129 | 90 | B-5 | 30 | S-1 | 20 | PGMEA/PGME (mass ratio 70/30) | 700 | 33 | 22 |
| (D-59) | PY129 | 90 | B-5 | 30 | S-1 | 20 | PGMEA/CHN (mass ratio 50/50) | 700 | 33 | 22 |
| (D-60) | PY129 | 90 | B-5/b3 (mass ratio 80/20) | 30 | S-1 | 20 | PGMEA | 700 | 33 | 22 |
| (D-61) | PY129 | 90 | B-6/B-12 (mass ratio 70/30) | 30 | S-1 | 20 | PGMEA | 700 | 33 | 22 |
| (D-62) | PY129 | 90 | B-5 | 50 | S-1 | 20 | PGMEA | 800 | 56 | 22 |
| (D-63) | PY129 | 90 | B-5 | 44 | S-1 | 20 | PGMEA | 770 | 49 | 22 |
| (D-64) | PY129 | 90 | B-5 | 23 | S-1 | 21 | PGMEA | 670 | 26 | 23 |
| (D-65) | PY129 | 90 | B-5 | 18 | S-1 | 22 | PGMEA | 650 | 20 | 24 |
| (D-66) | PY129 | 90 | B-5 | 35 | S-1 | 5 | PGMEA | 650 | 39 | 6 |
| (D-67) | PY129 | 90 | B-5 | 35 | S-1 | 10 | PGMEA | 675 | 39 | 11 |

TABLE 5-continued

| Dispersion liquid | Pigment Type | Pigment Addition amount (part by mass) | Dispersant Type | Dispersant Addition amount (part by mass) | Specific compound Type | Specific compound Addition amount (part by mass) | Solvent Type | Solvent Addition amount (part by mass) | Proportion with respect to pigment Dispersant (% by mass) | Proportion with respect to pigment Specific compound (% by mass) |
|---|---|---|---|---|---|---|---|---|---|---|
| (D-68) | PY129 | 90 | B-5 | 35 | S-1 | 25 | PGMEA | 750 | 39 | 28 |
| (D-69) | PY129 | 90 | B-5 | 35 | S-1 | 35 | PGMEA | 800 | 39 | 39 |
| (DH-1) | PY129 | 90 | B-5 | 35 | SH-1 | 20 | PGMEA | 725 | 39 | 22 |
| (DH-2) | PY129 | 90 | BH-1 | 35 | S-13 | 20 | PGMEA | 725 | 39 | 22 |

Details of the raw materials described by abbreviations shown in the above tables are as follows.

(Pigment)

PY117: C. I. Pigment Yellow 117 (azomethine copper complex, yellow pigment)

PY129: C. I. Pigment Yellow 129 (azomethine copper complex, yellow pigment)

PY138: C. I. Pigment Yellow 138 (quinophthalone compound, yellow pigment)

PY139: C. I. Pigment Yellow 139 (isoindoline compound, yellow pigment)

PY150: C. I. Pigment Yellow 150 (azonickel complex, yellow pigment)

PY185: C. I. Pigment Yellow 185 (isoindoline compound, yellow pigment)

Y-1: compound having the following structure (quinophthalone compound, yellow pigment)

Y-2: compound having the following structure (quinophthalone compound, yellow pigment)

Y-3: compound having the following structure (azomethine zinc complex, yellow pigment)

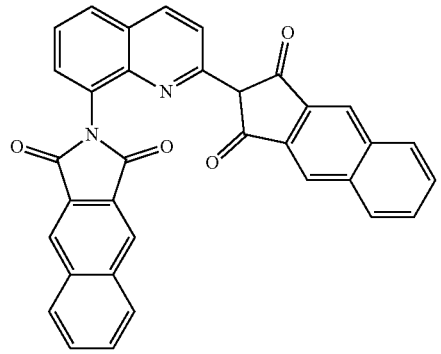

Y-1

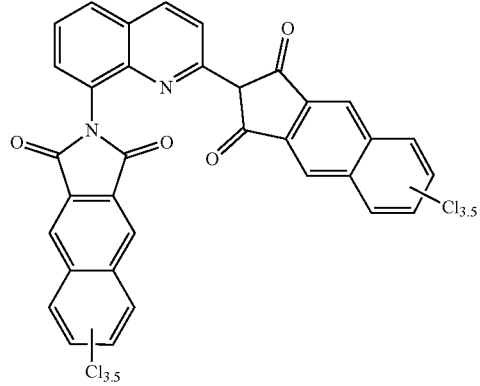

Y-2

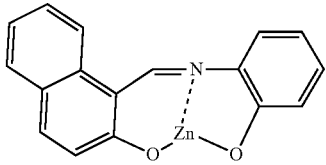

Y-3

PG7: C. I. Pigment Green 7 (copper phthalocyanine complex, green pigment)

PG36: C. I. Pigment Green 36 (copper phthalocyanine complex, green pigment)

PG58: C. I. Pigment Green 58 (zinc phthalocyanine complex, green pigment)

PG59: C. I. Pigment Green 59 (zinc phthalocyanine complex, green pigment)

PG62: C. I. Pigment Green 62 (aluminum phthalocyanine complex, green pigment)

PG63: C. I. Pigment Green 63 (aluminum phthalocyanine complex, green pigment)

PR254: C. I. Pigment Red 254 (diketopyrrolopyrrole compound, red pigment)

PR264: C. I. Pigment Red 264 (diketopyrrolopyrrole compound, red pigment)

PR272: C. I. Pigment Red 272 (diketopyrrolopyrrole compound, red pigment)

PR122: C. I. Pigment Red 122 (quinacridone compound, red pigment)

(Dispersant)

B-1: resin having the following structure (graft resin having a graft chain of a polyester structure; the numerical value described together with the main chain indicates a molar ratio, and the numerical value described together with the side chain indicates the number of repeating units; weight-average molecular weight: 24000, acid value: 47 mgKOH/g)

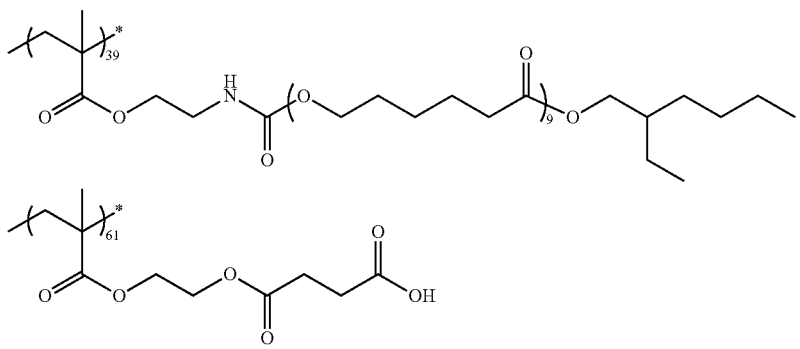

B-2: resin having the following structure (graft resin having a graft chain of a polyester structure; the numerical value described together with the main chain indicates a molar ratio, and the numerical value described together with the side chain indicates the number of repeating units; weight-average molecular weight: 16000, acid value: 67 mgKOH/g)

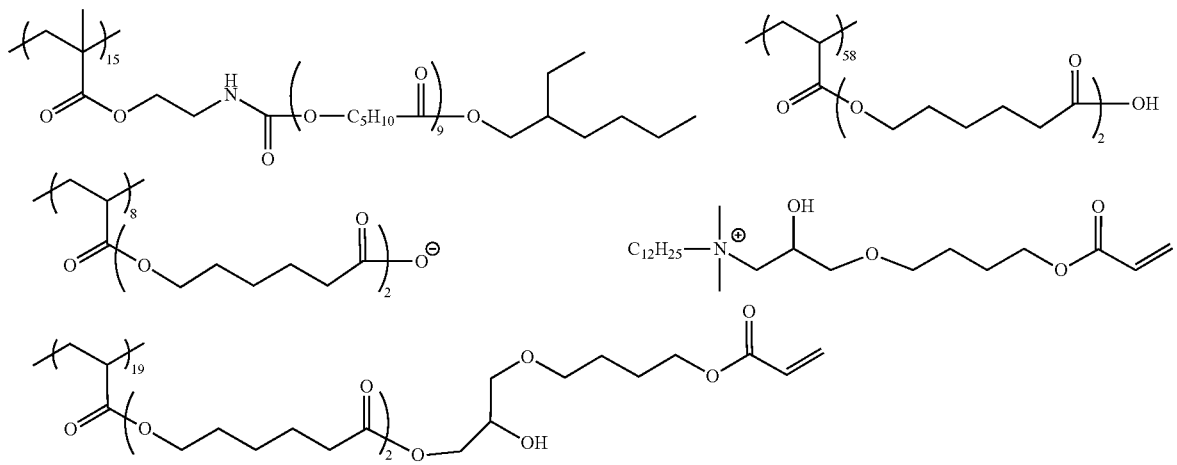

B-3: resin having the following structure (graft resin having a graft chain of a poly(meth)acrylic structure; the numerical value described together with the main chain indicates a mass ratio, and the numerical value described together with the side chain indicates the number of repeating units; weight-average molecular weight: 13000, acid value: 65 mgKOH/g)

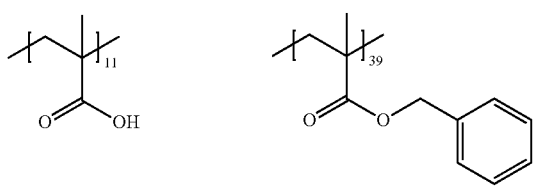

-continued

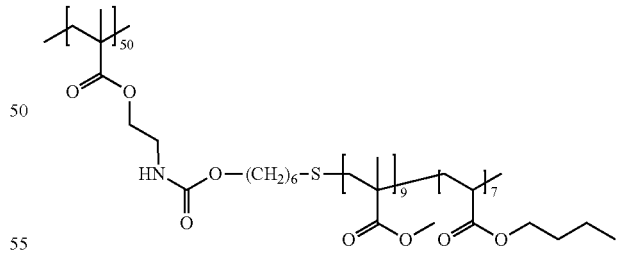

B-4: resin B-4 synthesized by the following method 50 parts by mass of methyl methacrylate, 30 parts by mass of n-butyl methacrylate, 20 parts by mass of t-butyl methacrylate, and 45.4 parts by mass of propylene glycol monomethyl ether acetate (PGMEA) were charged into a reaction container, and the atmosphere gas was replaced with nitrogen gas. The inside of the reaction container was heated to 70° C., 6 parts by mass of 3-mercapto-1,2-propanediol was added thereto, 0.12 parts by mass of azobisisobutyronitrile (AIBN) was further added thereto, and the mixture was reacted for 12 hours. It was confirmed by solid content measurement that 95% thereof was reacted. Next, 9.7 parts by mass of pyromellitic acid anhydride, 70.3 parts by mass of PGMEA, and 0.20 parts by mass of 1,8-diazabicyclo-[5.4.0]-7-undecene (DBU) as a catalyst were added thereto, and the mixture was reacted at 120° C. for 7 hours. It was confirmed by acid value measurement that 98% or more of the acid anhydride was half-esterified, and the reaction was terminated. PGMEA was added thereto to adjust non-volatile content (concentration of solid contents) to be 30% by mass, thereby obtaining a resin solution of a resin B-4 (graft resin having a graft chain of a poly(meth)acrylic structure) having the following structure, in which an acid value was 43 mgKOH/g and a weight-average molecular weight was 9000.

(B-4)

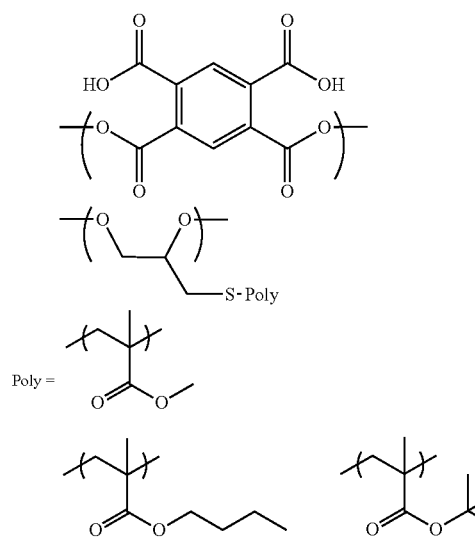

B-5: resin having the following structure (block copolymer having a poly(meth)acrylic structure; the numerical value described together with the main chain is a mass ratio; amine value: 71 mgKOH/g, weight-average molecular weight: 9900)

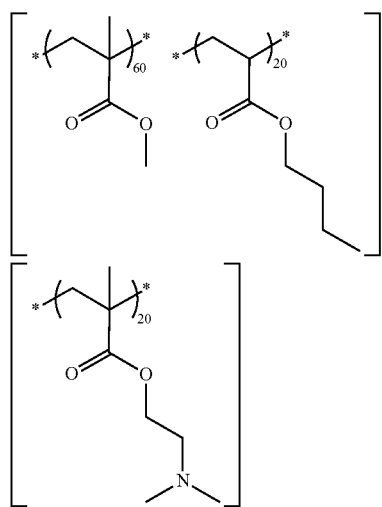

B-6: resin having the following structure (graft resin having a graft chain of a poly(meth)acrylic structure; weight-average molecular weight: 13000, $k/(l1+l2)/(m1+m2)/n = 10/50/5/35$ (molar ratio))

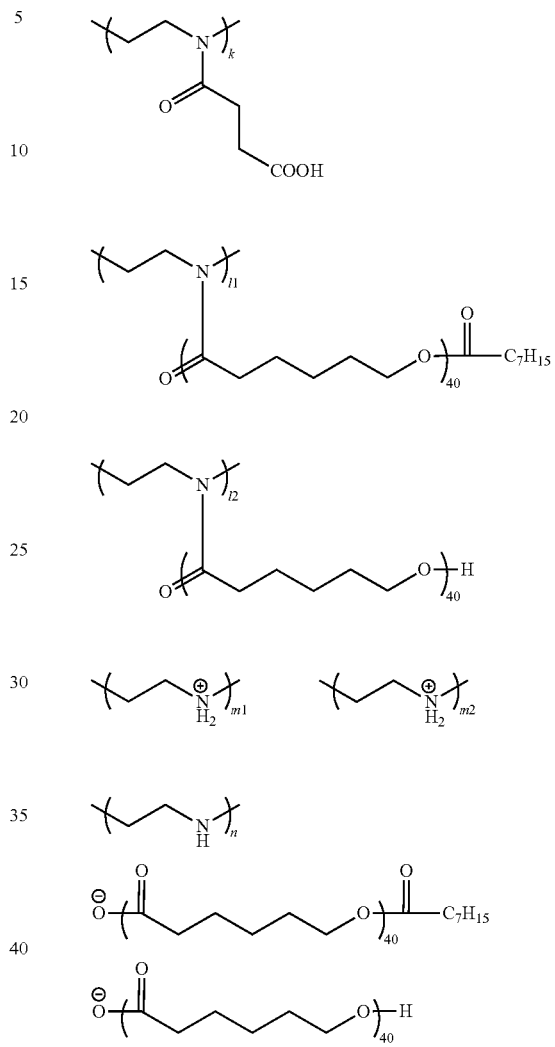

B-7: resin having the following structure (graft resin having a graft chain of polyether structure; weight-average molecular weight: 25000, amine value: 107 mgKOH/g)

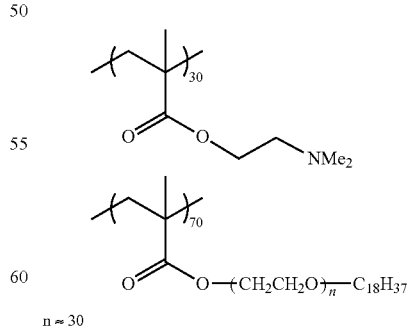

n ≈ 30

B-8: resin having the following structure (graft resin having a graft chain of polyester structure; weight-average molecular weight: 18000, amine value: 70 mgKOH/g)

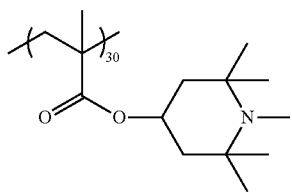

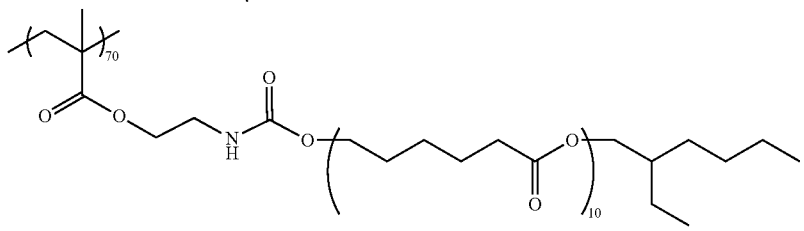

B-9: resin having the following structure (graft resin having a graft chain of poly(meth)acrylic structure; weight-average molecular weight: 34000, amine value: 99 mgKOH/g)

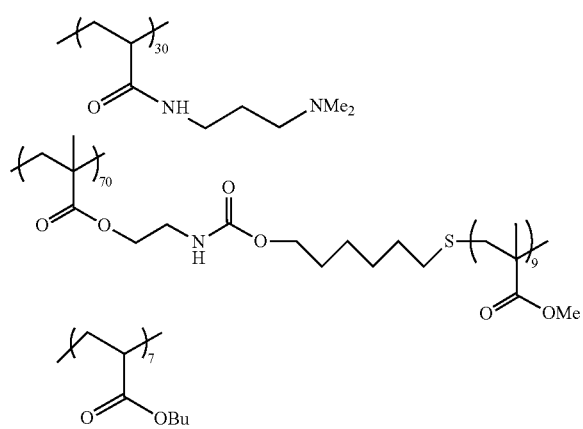

B-10: resin having the following structure (graft resin having a graft chain of polyether structure; weight-average molecular weight: 21000, acid value: 73 mgKOH/g)

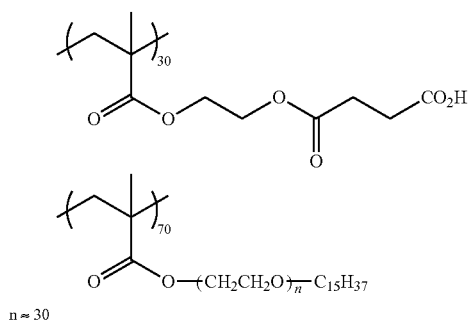

n ≈ 30

B-11: resin having the following structure (resin in which a terminal of a polymer chain of a polyether structure is capped with an acid group; weight-average molecular weight: 3800, acid value: 55 mgKOH/g (primary dissociation of phosphoric acid), y=1.5)

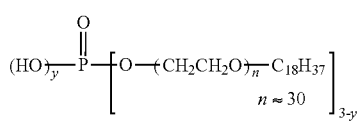

B-12: resin having the following structure (resin in which a terminal of a polymer chain of a poly(meth)acrylic structure is capped with an acid group; weight-average molecular weight: 3,200, acid value: 27 mgKOH/g)

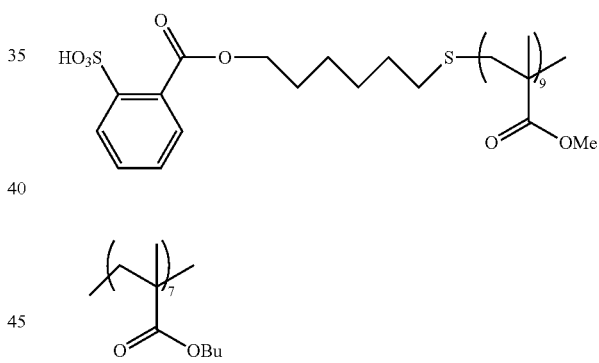

B-13: resin having the following structure (resin in which a terminal of a polymer chain of a poly(meth)acrylic structure is capped with an acid group; weight-average molecular weight: 3500, acid value: 77 mgKOH/g)

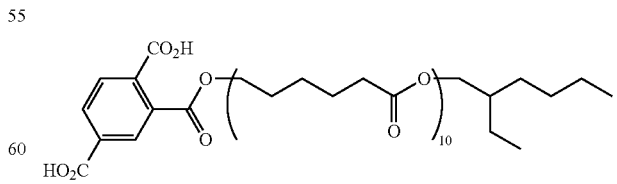

BH-1: polyamic acid having the following structure (the numerical value described together with the repeating unit is a molar ratio; weight-average molecular weight: 20000)

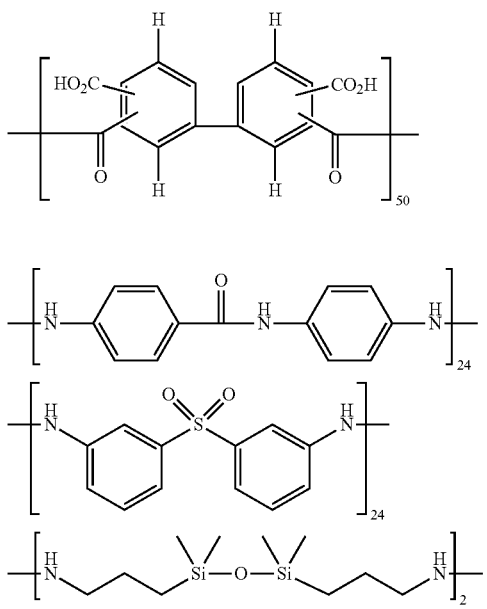

b3: resin having the following structure (a numerical value added to a main chain represents a molar ratio; weight-average molecular weight: 10000)

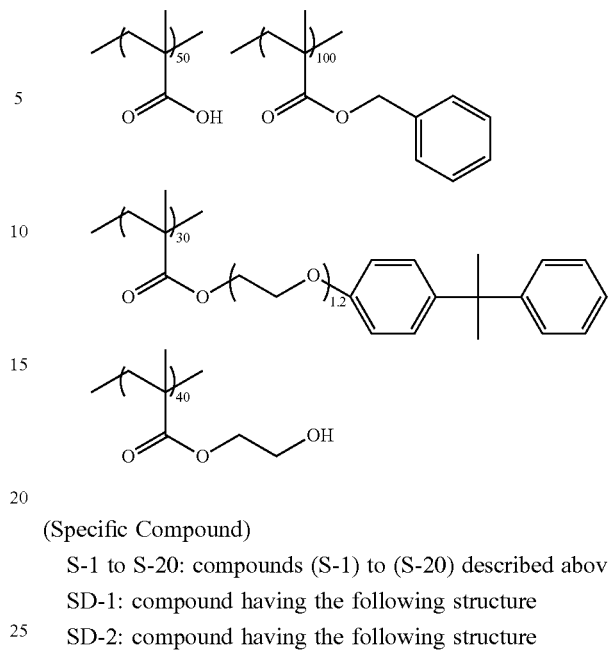

(Specific Compound)

S-1 to S-20: compounds (S-1) to (S-20) described above

SD-1: compound having the following structure

SD-2: compound having the following structure

SH-1: compound having the following structure (compound synthesized by the synthesis method described in paragraph No. 0073 of JP2009-035671A)

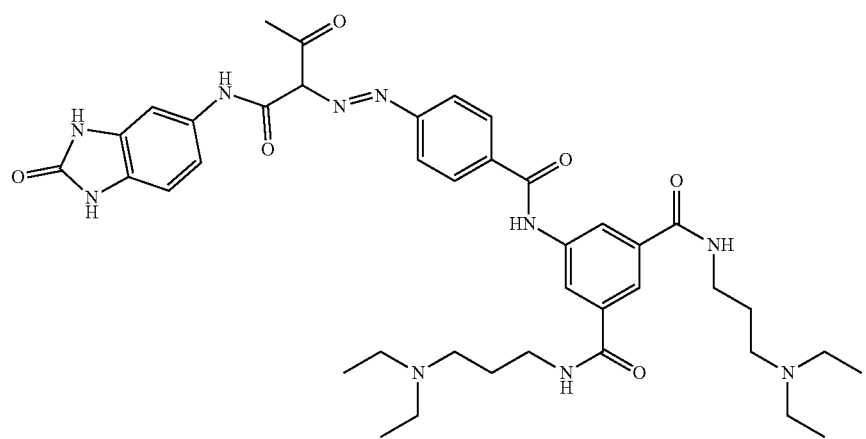

(SD-1)

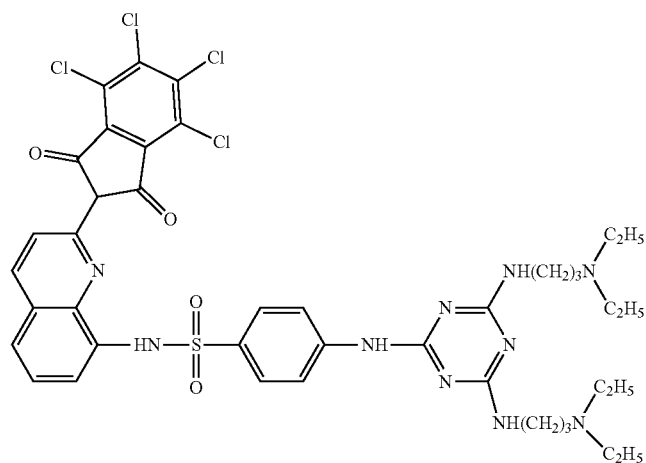

(SD-2)

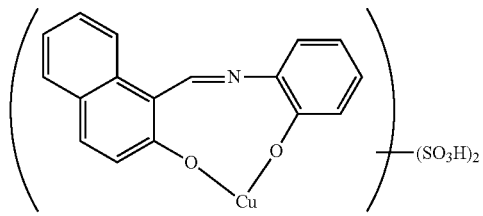

(Solvent)
PGMEA: propylene glycol monomethyl ether acetate
PGME: propylene glycol monomethyl ether
CHN: cyclopentanone In the dispersion liquids (D-26) to (D-28) and (D-61) using, as the dispersant, the resins (dispersants B-11 to B-13) in which the terminal of the polymer chain was capped with an acid group, the time to reach a target particle size (90 nm) was 1.5 times faster than the other dispersion liquid.

<Production of Coloring Composition>

A dispersion liquid shown in the following tables, a polymerizable compound shown in the following tables, a photopolymerization initiator shown in the following tables, a resin shown in the following tables, 1 part by mass of an epoxy compound (EHPE-3150, manufactured by Daicel Corporation), 1 part by mass of an ultraviolet absorber (TINUVIN 326, manufactured by BASF SE), 1 part by mass of the following surfactant 1, and 0.1 parts by mass of a polymerization inhibitor (p-methoxyphenol) were mixed to produce a coloring composition.

Surfactant 1: 1% by mass PGMEA solution of a compound having the following structure (weight-average molecular weight: 14000; the numerical value "%" representing the proportion of the repeating unit is mol %)

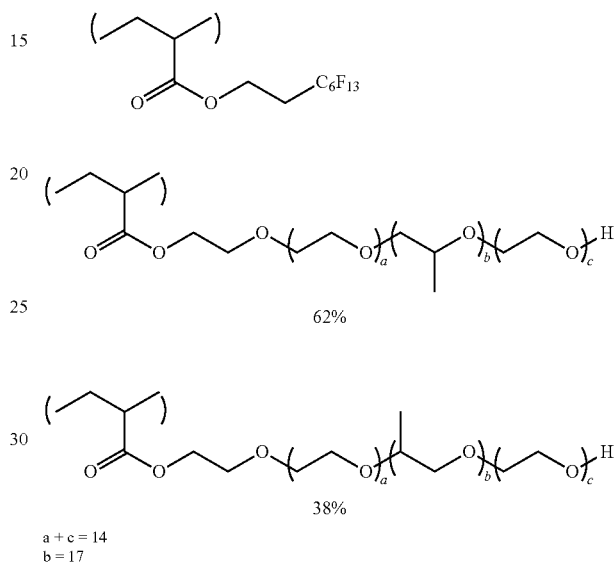

(SH-1)

$a + c = 14$
$b = 17$

TABLE 6

| | Dispersion liquid | | Polymerizable compound | | Photopolymerization initiator | | Resin | |
|---|---|---|---|---|---|---|---|---|
| Example | Type | Addition amount (part by mass) | Type | Addition amount (part by mass) | Type | Addition amount (part by mass) | Type | Addition amount (part by mass) |
| Example 1 | D-1 | 500 | M-1 | 5 | I-1 | 5 | b2 | 5 |
| Example 2 | D-2 | 500 | M-1 | 5 | I-5 | 5 | b2 | 4 |
| Example 3 | D-3 | 500 | M-1 | 5 | I-4 | 4 | b1 | 6 |
| Example 4 | D-4 | 500 | M-2 | 5 | I-2 | 5 | b1 | 5 |
| Example 5 | D-5 | 500 | M-1 | 5 | I-1 | 5 | b2 | 5 |
| Example 6 | D-6 | 500 | M-1/M-3 (50/50) | 5 | I-3 | 5 | b1 | 5 |
| Example 7 | D-7 | 500 | M-1 | 5 | I-1 | 5 | b2 | 5 |
| Example 8 | D-8 | 500 | M-3 | 5 | I-4 | 5 | b1 | 5 |
| Example 9 | D-9 | 500 | M-2 | 5 | I-1 | 5 | b2 | 5 |
| Example 10 | D-10 | 500 | M-1 | 5 | I-1 | 5 | b2 | 5 |
| Example 11 | D-11 | 500 | M-4 | 5 | I-3 | 5 | b2 | 5 |
| Example 12 | D-12 | 500 | M-3 | 5 | I-6 | 3 | b1 | 7 |
| Example 13 | D-13 | 500 | M-5 | 5 | I-3 | 5 | b3 | 5 |
| Example 14 | D-14 | 500 | M-4 | 2 | I-3 | 5 | b3 | 8 |
| Example 15 | D-15 | 500 | M-2 | 5 | I-2 | 5 | b3 | 5 |
| Example 16 | D-16 | 500 | M-5 | 5 | I-1 | 8 | b2 | 2 |
| Example 17 | D-17 | 500 | M-2 | 5 | I-1 | 5 | b2 | 5 |
| Example 18 | D-18 | 500 | M-2 | 5 | I-6 | 5 | b2 | 5 |
| Example 19 | D-19 | 500 | M-1 | 5 | I-1 | 5 | b2 | 5 |
| Example 20 | D-20 | 500 | M-1 | 5 | I-1 | 5 | b2 | 5 |
| Example 21 | D-21 | 500 | M-3 | 5 | I-5 | 6 | b3 | 4 |
| Example 22 | D-22 | 500 | M-5 | 3 | I-3 | 5 | b2 | 5 |
| Example 23 | D-23 | 500 | M-3 | 5 | I-4 | 5 | b2 | 5 |
| Example 24 | D-24 | 500 | M-1 | 5 | I-1/I-2 | 5 | b3 | 5 |

TABLE 6-continued

| Example | Dispersion liquid Type | Dispersion liquid Addition amount (part by mass) | Polymerizable compound Type | Polymerizable compound Addition amount (part by mass) | Photopolymerization initiator Type | Photopolymerization initiator Addition amount (part by mass) | Resin Type | Resin Addition amount (part by mass) |
|---|---|---|---|---|---|---|---|---|
| Example 25 | D-25 | 500 | M-5 | 5 | I-2 (50/50) | 5 | b2 | 5 |
| Example 26 | D-26 | 500 | M-1 | 5 | I-1/I-10 (50/50) | 5 | b2 | 5 |
| Example 27 | D-27 | 500 | M-4 | 5 | I-1 | 5 | b2 | 5 |
| Example 28 | D-28 | 500 | M-2 | 5 | I-5 | 5 | b2 | 5 |
| Example 29 | D-29 | 500 | M-1 | 6 | I-1 | 5 | b2 | 4 |
| Example 30 | D-30 | 500 | M-3 | 5 | I-2 | 5 | b1 | 5 |
| Example 31 | D-31 | 500 | M-2 | 6 | I-3 | 6 | b3 | 3 |
| Example 32 | D-32 | 500 | M-2 | 5 | I-3 | 5 | b3 | 5 |
| Example 33 | D-33 | 500 | M-1 | 5 | I-1 | 5 | b2 | 5 |
| Example 34 | D-34 | 500 | M-1 | 5 | I-1 | 5 | b2 | 5 |
| Example 35 | D-35 | 500 | M-2 | 5 | I-5 | 5 | b2 | 5 |
| Example 36 | D-36 | 500 | M-1 | 5 | I-1 | 5 | b2 | 5 |
| Example 37 | D-37 | 500 | M-1 | 5 | I-1 | 5 | b2 | 5 |
| Example 38 | D-38 | 500 | M-1 | 5 | I-1 | 5 | b2 | 5 |
| Example 39 | D-39 | 500 | M-1 | 5 | I-1 | 5 | b2 | 5 |
| Example 40 | D-40 | 500 | M-2 | 5 | I-6 | 5 | b2 | 5 |

TABLE 7

| Example | Dispersion liquid Type | Dispersion liquid Addition amount (part by mass) | Polymerizable compound Type | Polymerizable compound Addition amount (part by mass) | Photopolymerization initiator Type | Photopolymerization initiator Addition amount (part by mass) | Resin Type | Resin Addition amount (part by mass) |
|---|---|---|---|---|---|---|---|---|
| Example 41 | D-41 | 500 | M-3 | 5 | I-6 | 5 | b1 | 5 |
| Example 42 | D-42 | 500 | M-4 | 5 | I-1 | 5 | b1 | 5 |
| Example 43 | D-43 | 500 | M-3 | 5 | I-5 | 5 | b1/b3 (60/40) | 5 |
| Example 44 | D-44 | 500 | M-3 | 5 | I-2 | 5 | b2 | 5 |
| Example 45 | D-45 | 500 | M-1 | 5 | I-5 | 5 | b2 | 5 |
| Example 46 | D-46 | 500 | M-1 | 5 | I-1 | 5 | b2 | 5 |
| Example 47 | D-47 | 500 | M-1 | 5 | I-1 | 5 | b2 | 5 |
| Example 48 | D-48 | 500 | M-1 | 5 | I-1 | 5 | b2 | 5 |
| Example 49 | D-49 | 500 | M-1 | 5 | I-1 | 5 | b2 | 5 |
| Example 50 | D-50 | 500 | M-2 | 5 | I-6 | 5 | b3 | 5 |
| Example 51 | D-51 | 500 | M-4 | 5 | I-11 | 5 | b3 | 5 |
| Example 52 | D-52 | 500 | M-1 | 5 | I-1 | 5 | b3 | 5 |
| Example 53 | D-53 | 500 | M-1 | 5 | I-1 | 5 | b2 | 5 |
| Example 54 | D-54 | 500 | M-4 | 5 | I-5 | 5 | b1 | 5 |
| Example 55 | D-55 | 500 | M-1 | 5 | I-6 | 5 | b3 | 5 |
| Example 56 | D-56 | 500 | M-2 | 5 | I-5 | 5 | b3 | 5 |
| Example 57 | D-57 | 500 | M-4 | 5 | I-3 | 5 | b2 | 5 |
| Example 58 | D-58 | 500 | M-5 | 5 | I-11 | 5 | b3 | 5 |
| Example 59 | D-59 | 500 | M-1 | 5 | I-6 | 5 | b2 | 5 |
| Example 60 | D-60 | 500 | M-1 | 5 | I-1 | 5 | b2 | 5 |
| Example 61 | D-61 | 500 | M-1 | 5 | I-1 | 5 | b2 | 5 |
| Example 62 | D-62 | 500 | M-1 | 5 | I-1 | 5 | b2 | 5 |
| Example 63 | D-63 | 500 | M-1 | 5 | I-1 | 5 | b2 | 5 |
| Example 64 | D-64 | 500 | M-1 | 5 | I-1 | 5 | b2 | 5 |
| Example 65 | D-65 | 500 | M-1 | 5 | I-1 | 5 | b2 | 5 |
| Example 66 | D-66 | 500 | M-1 | 5 | I-1 | 5 | b2 | 5 |
| Example 67 | D-67 | 500 | M-1 | 5 | I-1 | 5 | b2 | 5 |
| Example 68 | D-68 | 500 | M-1 | 5 | I-1 | 5 | b2 | 5 |
| Example 69 | D-69 | 500 | M-1 | 5 | I-1 | 5 | b2 | 5 |
| Example 70 | D-1 | 500 | M-1 | 5 | I-7 | 5 | b2 | 5 |
| Example 71 | D-1 | 500 | M-1 | 5 | I-8 | 5 | b2 | 5 |
| Example 72 | D-1 | 500 | M-1 | 5 | I-9 | 5 | b2 | 5 |
| Example 73 | D-2 | 600 | M-1 | 5 | I-1 | 5 | b2 | 5 |
| Comparative Example 1 | DH-1 | 500 | M-1 | 5 | I-1 | 5 | b2 | 5 |
| Comparative Example 2 | DH-2 | 500 | M-1 | 5 | I-1 | 5 | b2 | 5 |

The raw materials described by abbreviations shown in the above tables are as follows.

(Dispersion Liquid)

D-1 to D-69, DH-1, DH-2: dispersion liquids D-1 to D-69, DH-1, and DH-2 described above (Polymerizable Compound)

M-1: KAYARAD DPHA (manufactured by Nippon Kayaku Co., Ltd.)

M-2: NK ESTER A-DPH-12E (manufactured by Shin-Nakamura Chemical Co., Ltd.)

M-3: NK ESTER A-TMMT (manufactured by Shin-Nakamura Chemical Co., Ltd.)

M-4: succinic acid-modified dipentaerythritol pentaacrylate

M-5: dipentaerythritol hexaacrylate (Photopolymerization Initiator)

I-1 to I-11: compounds having the following structures

I-1
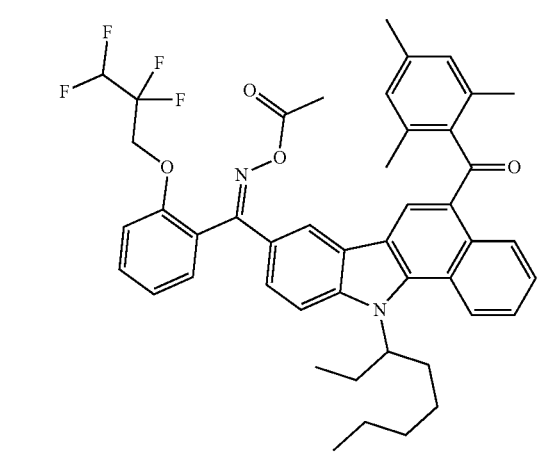

I-2
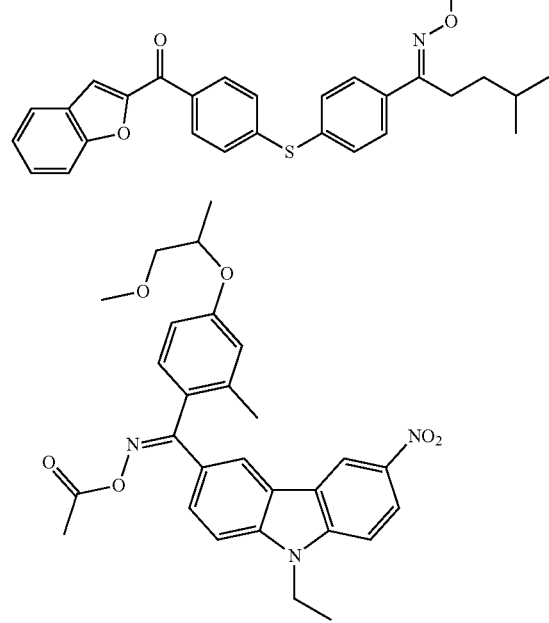

I-3

I-4
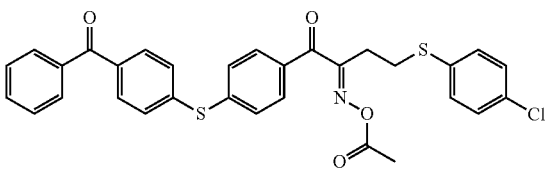

I-5
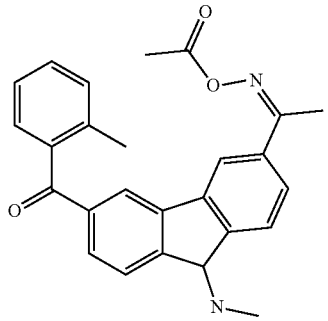

I-6
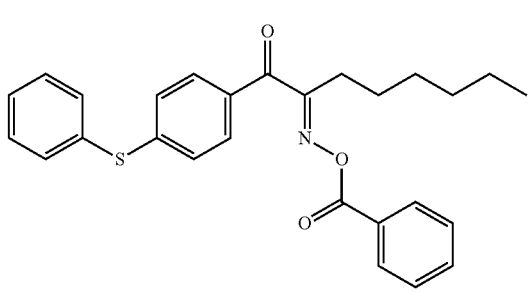

I-7
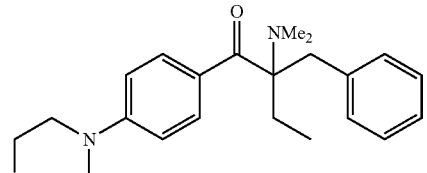

I-8
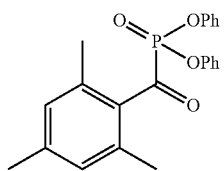

I-9
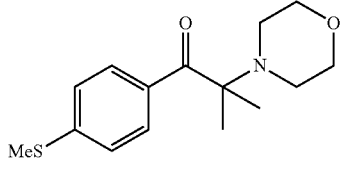

I-10
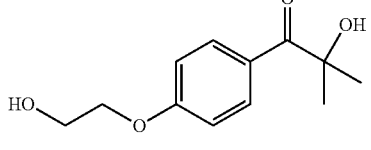

-continued

I-11

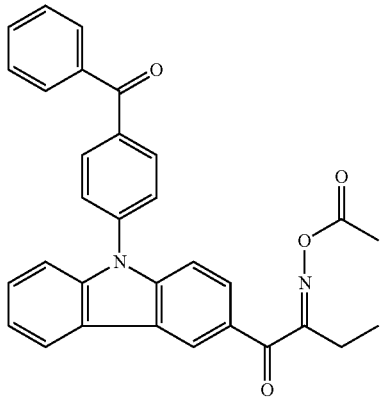

(Resin)

b1: resin having the following structure (a numerical value added to a main chain represents a molar ratio; weight-average molecular weight: 30000)

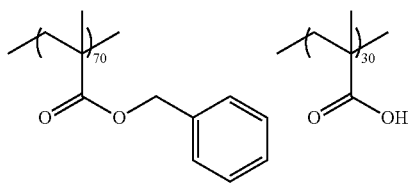

b2: resin having the following structure (a numerical value added to a main chain represents a molar ratio; weight-average molecular weight: 11000)

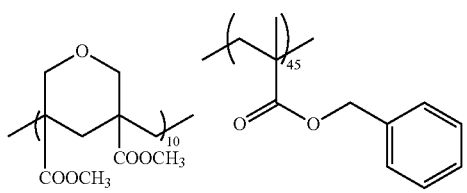

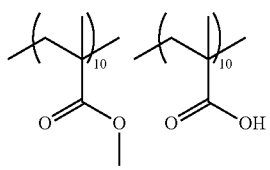

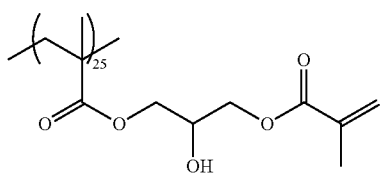

b3: resin having the structure described in the dispersant b3 above

<Production of Colored Pixel>

A transparent base coat agent (CT-4000L, manufactured by Fujifilm Electronic Materials Co., Ltd.) was applied onto a silicon wafer having a diameter of 8 inches (20.32 cm) so that a thickness of a dried film was 0.1 µm, dried to form a base layer, and heated at 220° C. for 5 minutes to obtain a silicon wafer with a base layer. Next, each of the coloring compositions of Examples and Comparative Examples, prepared as described above, was applied onto the base layer of the silicon wafer with a base layer to form a coloring composition layer (coating film). A heating treatment (pre-baking) was performed for 120 seconds using a hot plate at 100° C. so that a thickness of a dried film of the coating film was 0.5 µm. Next, using an i-ray stepper exposure device FPA-3000 i5+ (manufactured by Canon Inc.), the coating film was exposed with light having a wavelength of 365 nm through a mask having a 0.9 µm square Island pattern at various exposure amounts of 50 to 1200 mJ/cm². Next, the silicon wafer on which the exposed coating film was formed was placed on a horizontal rotary table of a spin-shower developing machine (DW-30 Type, manufactured by Chemitronics Co., Ltd.), and subjected to a puddle development at 23° C. for 60 seconds using a developer (CD-2000, manufactured by Fujifilm Electronic Materials Co., Ltd.). Next, the silicon wafer on which the film after the puddle development was formed was fixed on the horizontal rotary table by a vacuum chuck method, a rinse treatment was performed by supplying pure water from an ejection nozzle from above a rotation center in shower-like while rotating the silicon wafer at a rotation speed of 50 rpm by a rotation device, and then the silicon wafer was spray-dried. Next, a heating treatment (post-baking) was performed for 300 seconds using a hot plate at 200° C., thereby forming a colored pixel.

As described above, a monochromatic color filter having the colored pixel formed of the coloring compositions of Examples or Comparative Examples was produced.

Thereafter, using a length-measuring SEM "S-9260A" (manufactured by Hitachi High-Tech Corporation), a line width of the colored pixel was measured. An exposure amount at which the line width of the colored pixel was 1.2 µm was defined as the optimum exposure amount.

(Performance Evaluation)

[Evaluation of Exposure Latitude]

In the above-described production of the colored pixel, the exposure amount was changed to various exposure amounts of 10 to 500 mJ/cm², and a width of the exposure amount at which the line width of the colored pixel after the post-baking was allowed to be 0.9 µm 10% was determined. A value shown as a percentage (%) obtained by dividing the value by the optimum exposure amount was evaluated as an exposure latitude. A to C are levels which do not cause any problems in practical use.

A: value of the exposure latitude was 15% or more.
B: value of the exposure latitude was 12% or more and less than 15%.
C: value of the exposure latitude was 9% or more and less than 12%.
D: value of the exposure latitude was less than 9%.

[Evaluation of Developer Resistance]

In the above-described production of the colored pixel, 20 cross sections of the colored pixel produced by exposing at an exposure amount such that the line width of the colored pixel after the post-baking was 0.9 µm were observed, and developer resistance was evaluated by counting the number of colored pixels having a hole of 0.001 µm or more. A or B is a level which does not cause any problems in practical use.

A: number of colored pixels with a hole having a diameter of 0.001 µm or more was 0.

B: number of colored pixels with a hole having a diameter of 0.001 µm or more was 1 to 3.

C: number of colored pixels with a hole having a diameter of 0.001 µm or more was 3 or more.

TABLE 8

| Example | Exposure latitude | Developer resistance |
| --- | --- | --- |
| Example 1 | A | A |
| Example 2 | A | A |
| Example 3 | A | A |
| Example 4 | A | A |
| Example 5 | A | B |
| Example 6 | A | A |
| Example 7 | A | B |
| Example 8 | A | A |
| Example 9 | A | A |
| Example 10 | A | B |
| Example 11 | A | A |
| Example 12 | A | A |
| Example 13 | A | A |
| Example 14 | A | A |
| Example 15 | A | A |
| Example 16 | A | A |
| Example 17 | A | A |
| Example 18 | A | A |
| Example 19 | B | B |
| Example 20 | B | B |
| Example 21 | A | A |
| Example 22 | A | A |
| Example 23 | A | A |
| Example 24 | A | A |
| Example 25 | A | A |
| Example 26 | A | A |
| Example 27 | A | A |
| Example 28 | A | A |
| Example 29 | A | A |
| Example 30 | A | A |
| Example 31 | A | A |
| Example 32 | A | A |
| Example 33 | A | B |
| Example 34 | A | B |
| Example 35 | A | A |
| Example 36 | A | B |
| Example 37 | A | B |
| Example 38 | A | B |
| Example 39 | A | B |
| Example 40 | A | A |

TABLE 9

| Example | Exposure latitude | Developer resistance |
| --- | --- | --- |
| Example 41 | A | A |
| Example 42 | A | A |
| Example 43 | A | A |
| Example 44 | A | A |
| Example 45 | A | A |
| Example 46 | A | B |
| Example 47 | A | B |
| Example 48 | A | B |
| Example 49 | A | B |
| Example 50 | A | A |
| Example 51 | A | A |
| Example 52 | A | A |
| Example 53 | A | B |
| Example 54 | A | A |
| Example 55 | A | A |
| Example 56 | A | A |

TABLE 9-continued

| Example | Exposure latitude | Developer resistance |
| --- | --- | --- |
| Example 57 | B | B |
| Example 58 | A | A |
| Example 59 | A | A |
| Example 60 | A | A |
| Example 61 | A | A |
| Example 62 | C | B |
| Example 63 | B | B |
| Example 64 | A | A |
| Example 65 | B | B |
| Example 66 | C | B |
| Example 67 | A | A |
| Example 68 | A | A |
| Example 69 | C | B |
| Example 70 | C | B |
| Example 71 | C | B |
| Example 72 | C | B |
| Example 73 | A | A |
| Comparative Example 1 | D | C |
| Comparative Example 2 | D | C |

As shown in the above table, all of Examples were excellent in developer resistance.

The coloring compositions of Examples 13, 22, and 29 were spin-coated on a glass substrate and pre-baked at 90° C. for 120 seconds to obtain a coating film having a film thickness of 2.0 µm. Next, light irradiation was performed with an exposure amount of 500 mJ/cm² (i-rays conversion) from a high-pressure mercury lamp, and the coating film was further baked in an oven at 120° for 60 minutes to produce a cured film. In a case where the obtained cured film was rubbed back and forth 10 times with #0000 steel wool and a load of 500 g, and visually observed, no scratches were found and scratch resistance was excellent.

With regard to the coloring composition of Example 73, in a case where, using a mask having 0.8 µm square Island pattern, a colored pixel having a finer line width was formed and evaluated the exposure latitude and the developer resistance, it was found that both were A, showing good results.

Example 101

A coloring composition of Example 101 was produced in the same manner as in Example 1, except that, in the coloring composition of Example 1, the photopolymerization initiator I-1 was changed to a thermal polymerization initiator (tert-butylperoxybenzoate).

<Evaluation of Developer Resistance>

The coloring composition of Example 101 was applied onto a glass wafer using a spin coater so that a coating film having a film thickness of 0.6 µm was formed, and then the coating film was dried for 180 seconds using a hot plate at 100° C. and heat-treated (post-baked) at 200° C. for 300 seconds to form a colored layer. A film thickness of the colored layer was 0.6 µm. Next, the colored layer was coated with a positive type photoresist (FHi622BC, manufactured by FUJIFILM Electronic Materials Co., Ltd.), and pre-baked to form a photoresist layer having a film thickness of 0.8 µm. Next, using an i-ray stepper (manufactured by Canon Inc.), the photoresist layer was exposed in a patterned manner with an exposure amount of 350 mJ/cm² and heat-treated for 1 minute at a temperature at which the temperature of the photoresist layer or the ambient temperature was 90° C. Thereafter, after developing for 1 minute with a developer (FHD-5, manufactured by FUJIFILM Electronic Materials Co., Ltd.), the photoresist layer was further post-baked at 110° C. for 1 minute to form a resist pattern. This resist pattern is a pattern in which square resist films formed with a side of 0.9 μm are arranged in a pane in consideration of an etching conversion difference (reduction of a pattern width due to etching). Next, dry etching of the colored layer was performed using the resist pattern as an etching mask according to the following procedure.

Using a dry etching device (manufactured by Hitachi High-Tech Corporation, U-621), a first-stage etching treatment was performed for 80 seconds under the conditions of RF power: 800 W, antenna bias: 400 W, wafer bias: 200 W, chamber internal pressure: 4.0 Pa, substrate temperature: 50° C., and mixed gas type and flow rate: $CF_4$: 80 mL/min., $O_2$: 40 mL/min., and Ar: 800 mL/min.

Next, using the same etching chamber, a second-stage etching treatment and an over-etching treatment were performed for 20 seconds with an over-etching rate of 20% in the etching total under the conditions of RF power: 600 W, antenna bias: 100 W, wafer bias: 250 W, chamber internal pressure: 2.0 Pa, substrate temperature: 50° C., and mixed gas type and flow rate: $N_2$: 500 mL/min., $O_2$: 50 mL/min., and Ar: 500 mL/min. ($N_2/O_2/Ar=10/1/10$).

After performing dry etching under the above-described conditions, a stripping treatment was performed for 120 seconds using a photoresist stripper (MS230C, manufactured by Fujifilm Electronic Materials Co., Ltd.) to remove the resist pattern, and the colored layer was further washed with pure water and spin-dried. Thereafter, a dehydration baking treatment was performed at 100° C. for 2 minutes. As described above, a colored pattern in which square colored pixels formed with a side of 0.9 μm (colored pixels having a line width of 0.9 μm) were arranged in a pane was obtained.

The silicon wafer on which the colored pattern was formed was placed on a horizontal rotary table of a spin-shower developing machine (DW-30 Type, manufactured by Chemitronics Co., Ltd.), and subjected to a puddle development at 23° C. for 60 seconds using a developer (CD-2000, manufactured by Fujifilm Electronic Materials Co., Ltd.) to be developed. Thereafter, the silicon wafer substrate was fixed on the horizontal rotary table by a vacuum chuck method, a rinse treatment was performed by supplying pure water from an ejection nozzle from above a rotation center in shower-like while rotating the silicon wafer substrate at a rotation speed of 50 rpm by a rotation device, and then the silicon wafer substrate was spray-dried.

In a case where developer resistance of the colored pattern after the spray drying was evaluated by the same procedure as described above, the evaluation result in a case of using the coloring composition of Example 101 was "A", which was good.

Example 1001

A silicon wafer was coated with a green coloring composition by a spin coating method so that a thickness of a film after film formation was 1.0 μm. Next, the silicon wafer was heated using a hot plate at 100° C. for 2 minutes. Next, using an i-ray stepper exposure device FPA-3000 i5+ (manufactured by Canon Inc.), exposure was performed with light having an exposure amount of 1000 mJ/cm² through a mask having a dot pattern of 2 μm square. Next, puddle development was performed at 23° C. for 60 seconds using a 0.3% by mass of tetramethylammonium hydroxide (TMAH) aqueous solution. Next, the coating film was rinsed by spin showering and was cleaned with pure water. Next, the green coloring composition was patterned by heating at 200° C. for 5 minutes using a hot plate to form a green pixel. In the same process, a red coloring composition and a blue coloring composition were patterned to sequentially form a red pixel and a blue pixel, thereby forming a color filter having the green pixel, red pixel, and blue pixel. In this color filter, the green pixel was formed in a Bayer pattern, and the red pixel and blue pixel were formed in an island pattern in an adjacent region thereof. The obtained color filter was incorporated into a solid-state imaging element according to a known method. The solid-state imaging element had a suitable image recognition ability. As the green coloring composition, the coloring composition of Example 50 was used. As the red coloring composition, the coloring composition of Example 53 was used. As the blue coloring composition, a coloring composition produced by the following method was used.

(Method for Producing Blue Coloring Composition)

The following components were mixed and stirred, and the obtained mixture was filtered through a nylon filter (manufactured by Nihon Pall Corporation) having a pore size of 0.45 μm to prepare the blue coloring composition.

Blue pigment dispersion liquid: 44.9 parts by mass

Resin 101: 2.1 parts by mass

Polymerizable compound 101: 1.5 parts by mass

Polymerizable compound 102: 0.7 parts by mass

Photopolymerization initiator 101: 0.8 parts by mass

Surfactant 101: 4.2 parts by mass

PGMEA: 45.8 parts by mass

Raw materials used to prepare the blue coloring composition are as follows.

Blue Pigment Dispersion Liquid

A mixed solution consisting of 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), and 82.4 parts by mass of PGMEA was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm² at a flow rate of 500 g/min. This dispersion treatment was repeated 10 times, thereby obtaining the blue pigment dispersion liquid.

Polymerizable compound 101: KAYARAD DPHA (manufactured by Nippon Kayaku Co., Ltd.)

Polymerizable compound 102: compound having the following structure

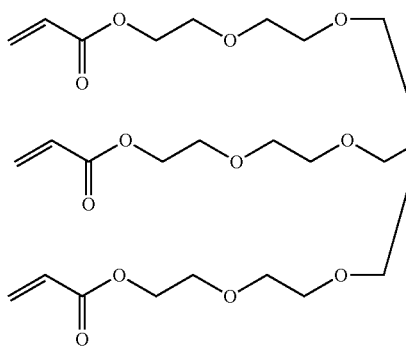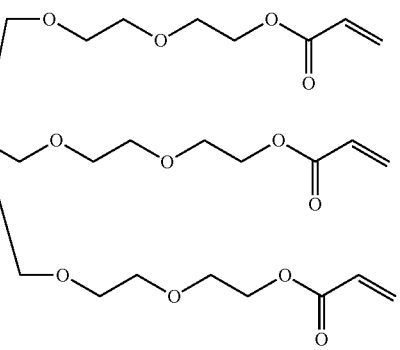

Resin 101: resin having the following structure (Mw=11000; the numerical value described together with the main chain indicates a molar ratio)

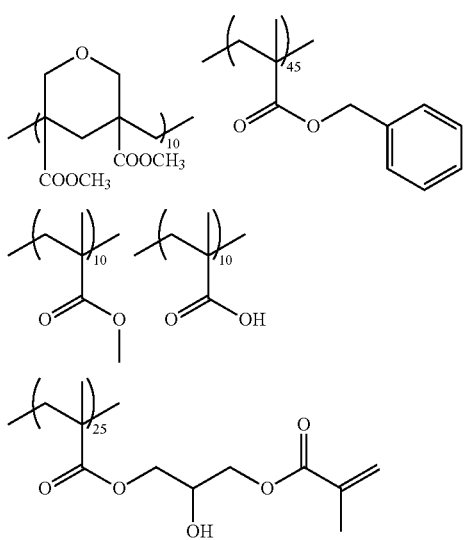

Photopolymerization initiator 101: Irgacure OXE01 (manufactured by BASF SE)

Surfactant 101: 1% by mass PGMEA solution of a compound having the following structure (Mw=14000; the numerical value "%" representing the proportion of the repeating unit is mol %)

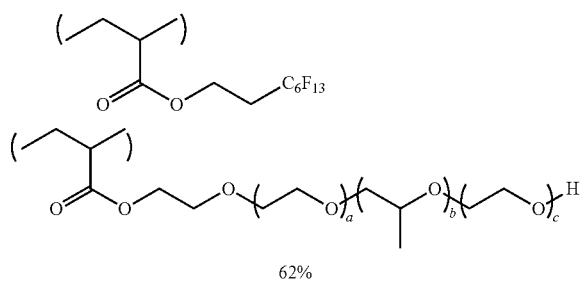

-continued

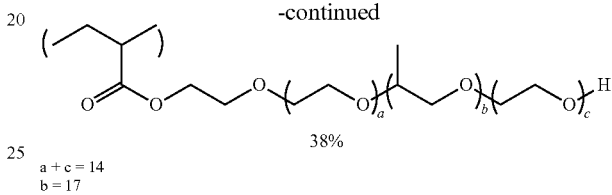

$a + c = 14$
$b = 17$

Example 1002

A silicon wafer was coated with a cyan coloring composition by a spin coating method so that a thickness of a film after film formation was 1.0 Next, the silicon wafer was heated using a hot plate at 100° C. for 2 minutes. Next, using an i-ray stepper exposure device FPA-3000 i5+ (manufactured by Canon Inc.), exposure was performed with light having an exposure amount of 1000 mJ/cm² through a mask having a dot pattern of 2 μm square. Next, puddle development was performed at 23° C. for 60 seconds using a 0.3% by mass of tetramethylammonium hydroxide (TMAH) aqueous solution. Next, the coating film was rinsed by spin showering and was cleaned with pure water. Next, the cyan coloring composition was patterned by heating at 200° C. for 5 minutes using a hot plate to form a cyan pixel. In the same process, a yellow coloring composition and a magenta coloring composition were patterned to sequentially form a yellow pixel and a magenta pixel, thereby forming a color filter having the cyan pixel, yellow pixel, and magenta pixel. In this color filter, the cyan pixel was formed in a Bayer pattern, and the yellow pixel and magenta pixel were formed in an island pattern in an adjacent region thereof. The obtained color filter was incorporated into a solid-state imaging element according to a known method. The solid-state imaging element had a suitable image recognition ability. As the yellow coloring composition, the coloring composition of Example 1 was used, as the cyan coloring composition, the coloring composition of Example 40 was used, and as the magenta coloring composition, the coloring composition of Example 49 was used.

What is claimed is:

1. A coloring composition comprising:
   at least one compound S selected from a compound S-1 represented by Formula (1) or a compound S-2 in which the compound S-1 is coordinated to a metal atom;
   a pigment;

a resin P; and a solvent, wherein the resin P includes at least one selected from the group consisting of a graft resin P-1 which has a graft chain including at least one structure selected from a polyester structure, a polyether structure, or a poly(meth) acrylic structure, a block copolymer P-2 including at least one structure selected from a polyester structure, a polyether structure, or a poly(meth) acrylic structure, and a resin P-3 in which at least one terminal of a polymer chain including at least one structure selected from a polyester structure, a polyether structure, or a poly(meth) acrylic structure is capped with an acid group,

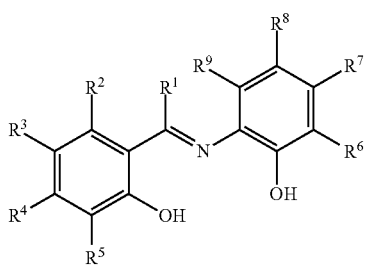
(1)

in Formula (1), $R^1$ represents a hydrogen atom, an alkyl group, or an aryl group, $R^2$ to $R^9$ each independently represent a hydrogen atom or a substituent, and two adjacent groups among $R^2$ to $R^9$ may be bonded to each other to form a ring, in which any one of $R^2$ to $R^9$ includes a group represented by Formula (R-1),

(R-1)

in Formula (R-1), $W^1$ represents a single bond or an (n+1)-valent linking group, $X^1$ represents an acid group or a basic group, and n represents an integer of 1 to 5, in which in a case where $W^1$ is a single bond, n is 1, wherein the acid group represented by $X^1$ of Formula (R-1) is a phosphoric acid group, a group represented by —$SO_2NHSO_2Rf^1$, or a salt of these groups, in which Rf represents a group including a fluorine atom.

2. The coloring composition according to claim 1, wherein the basic group represented by $X^1$ of Formula (R-1) is an amino group or a salt of an ammonium group.

3. The coloring composition according to claim 1, wherein, in Formula (R-1), $X^1$ represents a basic group, and $W^1$ represents an (n+1)-valent linking group.

4. The coloring composition according to claim 1, wherein, in Formula (R-1), $W^1$ represents a single bond, $X^1$ represents an acid group, and n represents 1.

5. The coloring composition according to claim 1, wherein $R^3$, $R^7$, or $R^8$ of Formula (1) includes the group represented by Formula (R-1).

6. The coloring composition according to claim 1, wherein the compound S-2 is a compound represented by Formula (Ia),

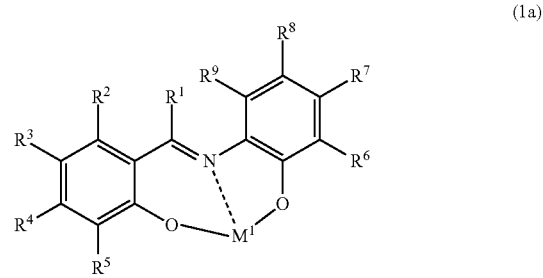
(1a)

in Formula (1a), $R^1$ represents a hydrogen atom, an alkyl group, or an aryl group, $R^2$ to $R^9$ each independently represent a hydrogen atom or a substituent, two adjacent groups among $R^2$ to $R^9$ may be bonded to each other to form a ring, and $M^1$ represents a metal atom which may be coordinated with a ligand, in which any one of $R^2$ to $R^9$ includes the group represented by Formula (R-1).

7. The coloring composition according to claim 6, wherein $M^1$ in Formula (1a) is a copper atom which may be coordinated with a ligand or a zinc atom which may be coordinated with a ligand.

8. The coloring composition according to claim 1, wherein the pigment includes at least one selected from a yellow pigment, a green pigment, or a red pigment.

9. The coloring composition according to claim 1, wherein the pigment includes a pigment having a metal atom.

10. The coloring composition according to claim 9, wherein the pigment having a metal atom includes an azomethine metal complex.

11. The coloring composition according to claim 10, wherein the azomethine metal complex includes at least one selected from an azomethine copper complex or an azomethine zinc complex.

12. The coloring composition according to claim 1, wherein the coloring composition includes the compound S in an amount of 1 to 30 parts by mass with respect to 100 parts by mass of the pigment.

13. The coloring composition according to claim 1, further comprising:

a polymerizable compound; and a photopolymerization initiator.

14. The coloring composition according to claim 1, wherein the coloring composition is used for a color filter or an infrared transmitting filter.

15. The coloring composition according to claim 1, wherein the coloring composition is used for a solid-state imaging element.

16. A film obtained from the coloring composition according to claim 1.

17. An optical filter comprising:

the film according to claim 16.

18. A solid-state imaging element comprising:

the film according to claim 16.

19. An image display device comprising:

the film according to claim 16.

20. A compound represented by Formula (1-1), Formula (1a-1), Formula (11-1), or Formula (11a-1),

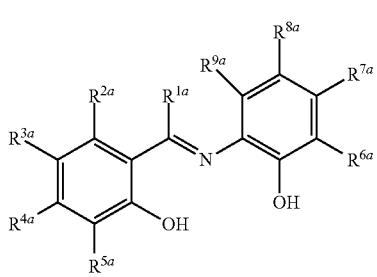
(1-1)

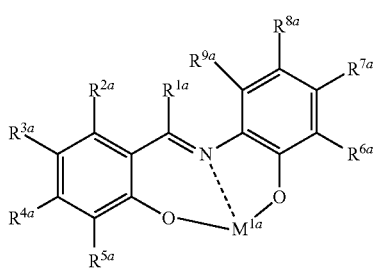
(1a-1)

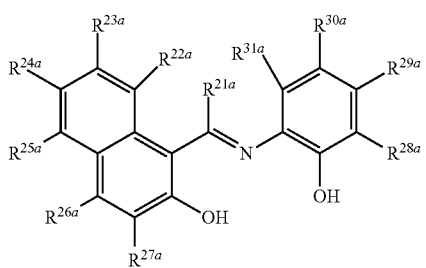
(11-1)

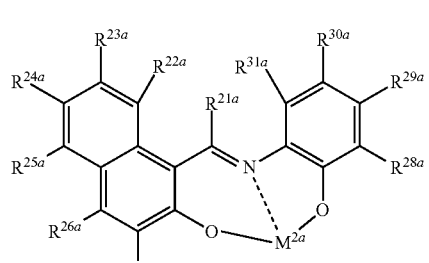
(11a-1)

in Formula (1-1) and Formula (1a-1), $R^{1a}$ represents a hydrogen atom, an alkyl group, or an aryl group, $R^{2a}$ to $R^{9a}$ each independently represent a hydrogen atom, a salt of a carboxy group, a salt of a sulfo group, a salt of a phosphoric acid group, a group represented by —SO$_2$NHSO$_2$Rf$^1$, a salt of a group represented by —SO$_2$NHSO$_2$Rf$^1$, a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group, Rf$^1$ represents a group including a fluorine atom, and M$^{1a}$ represents a metal atom which may be coordinated with a ligand, in which any one of $R^{2a}$ to $R^{9a}$ is a group represented by —SO$_2$NHSO$_2$Rf$^1$, or a salt of a group represented by —SO$_2$NHSO$_2$Rf$^1$, in Formula (11-1) and Formula (11a-1), $R^{21a}$ represents a hydrogen atom, an alkyl group, or an aryl group, $R^{22a}$ to $R^{31a}$ each independently represent a hydrogen atom, a salt of a carboxy group, a salt of a sulfo group, a salt of a phosphoric acid group, a group represented by —SO$_2$NHSO$_2$Rf$^1$, a salt of a group represented by —SO$_2$NHSO$_2$Rf$^1$, a halogen atom, an alkyl group, an alkenyl group, an alkynyl group, an aryl group, a heteroaryl group, a cyano group, a hydroxy group, a nitro group, an alkoxy group, an aryloxy group, a silyloxy group, a heterocyclic oxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heteroarylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heteroarylazo group, an imide group, or a silyl group, Rf$^1$ represents a group including a fluorine atom, and M$^{2a}$ represents a metal atom which may be coordinated with a ligand, in which any one of $R^{22a}$ to $R^{31a}$ is a group represented by —SO$_2$NHSO$_2$Rf$^1$, or a salt of a group represented by —SO$_2$NHSO$_2$Rf$^1$.

21. The coloring composition according to claim 1, wherein:

in Formula (1), $R^1$ represents a hydrogen atom, and in Formula (R-1), $W^1$ represents an (n+1)-valent linking group, and $X^1$ represents a basic group selected from the group consisting of an amino group and a salt of an ammonium group.

* * * * *